US012813115B2

(12) United States Patent
Wang

(10) Patent No.: US 12,813,115 B2
(45) Date of Patent: Nov. 24, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventor: Zhu Wang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 672 days.

(21) Appl. No.: 18/034,371

(22) PCT Filed: Jun. 30, 2022

(86) PCT No.: PCT/CN2022/102638

§ 371 (c)(1),
(2) Date: Apr. 27, 2023

(87) PCT Pub. No.: WO2024/000346

PCT Pub. Date: Jan. 4, 2024

(65) Prior Publication Data

US 2024/0324373 A1 Sep. 26, 2024

(51) Int. Cl.
*H10K 59/131* (2023.01)
*H10K 59/121* (2023.01)

(52) U.S. Cl.
CPC ..... *H10K 59/1315* (2023.02); *H10K 59/1213* (2023.02); *H10K 59/1216* (2023.02)

(58) Field of Classification Search
CPC ........... H10K 59/131; H10K 59/00–95; H10K 59/1315; H10K 59/1213; H10K 59/1216; G09G 3/3233
See application file for complete search history.

(56) References Cited

U.S. PATENT DOCUMENTS

| | | | | |
|---|---|---|---|---|
| 2018/0039146 | A1* | 2/2018 | Tanaka | G02F 1/136286 |
| 2019/0278145 | A1 | 9/2019 | Tanaka et al. | |
| 2021/0118976 | A1* | 4/2021 | Zhao | H10K 59/131 |
| 2021/0257435 | A1 | 8/2021 | Kim et al. | |

(Continued)

FOREIGN PATENT DOCUMENTS

| | | |
|---|---|---|
| CN | 107195663 A | 9/2017 |
| CN | 109791745 A | 5/2019 |

(Continued)

*Primary Examiner* — Steven B Gauthier
*Assistant Examiner* — Rhys Poniente Sheker

(57) ABSTRACT

A display substrate includes a drive structure layer disposed on a base substrate. The drive structure layer includes multiple circuit units, multiple data signal lines, multiple first connection lines and multiple second connection lines. On a plane perpendicular to the display substrate, the drive structure layer includes multiple conductive layers sequentially disposed on a base substrate. A data signal line, a first connection line and a second connection line are provided in different conductive layers. The second connection line extending in a second direction is connected to the first connection line extending in a first direction, and the first connection line extending in a first direction is connected to the data signal line extending in a second direction.

17 Claims, 43 Drawing Sheets

(56) References Cited

U.S. PATENT DOCUMENTS

| | | | | |
|---|---|---|---|---|
| 2021/0273035 | A1* | 9/2021 | Cho | H10K 59/1315 |
| 2023/0422564 | A1* | 12/2023 | Bang | H10K 59/131 |

FOREIGN PATENT DOCUMENTS

| | | | | | |
|---|---|---|---|---|---|
| CN | 112201680 | A | | 1/2021 | |
| CN | 113345931 | A | | 9/2021 | |
| CN | 113964142 | A | | 1/2022 | |
| CN | 114497151 | A | * | 5/2022 | H10K 59/131 |
| CN | 115004376 | A | | 9/2022 | |
| CN | 115398641 | A | | 11/2022 | |

* cited by examiner

DISPLAY SUBSTRATE AND DISPLAY APPARATUS

CROSS-REFERENCE TO RELATED APPLICATION

This application is a national stage application of PCT Application No. PCT/CN2022/102638, which is filed on Jun. 30, 2022, and entitled "Display Substrate and Display Apparatus", the content of which should be regarded as being incorporated herein by reference.

TECHNICAL FIELD

The present disclosure relates to, but is not limited to, the field of display technology, and more particularly, to a display substrate and a display apparatus.

BACKGROUND

An Organic Light Emitting Diode (OLED for short) and a Quantum-dot Light Emitting Diode (QLED for short) are active light emitting display apparatuses and have advantages such as self-luminescence, wide viewing angle, high contrast ratio, low power consumption, very high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, including a display region, the display region includes a drive structure layer disposed on a base substrate, the drive structure layer at least includes multiple circuit units forming multiple unit rows and multiple unit columns, multiple data signal lines, multiple first connection lines and multiple second connection lines, the circuit unit includes a pixel drive circuit, the data signal line is configured to supply a data signal to the pixel drive circuit; on a plane perpendicular to the display substrate, the drive structure layer includes multiple conductive layers arranged sequentially on the base substrate, the data signal line, the first connection line and the second connection line are disposed in different conductive layers, the second connection line extending in a second direction is connected to the first connection line extending in a first direction, the first connection line extending in a first direction is connected to the data signal line extending in a second direction, wherein the first direction and the second direction intersect.

In an exemplary embodiment, the multiple conductive layers include a first source-drain metal layer, a second source-drain metal layer and a third source-drain metal layer arranged sequentially along a direction away from the base substrate, the first source-drain metal layer at least includes the first connection line, the second source-drain metal layer at least includes the data signal line, and the third source-drain metal layer at least includes the second connection line.

In an exemplary embodiment, the pixel drive circuit at least includes a data write transistor, and the first source-drain metal layer further includes a first electrode of the data write transistor; in at least one circuit unit, the first connection line is connected to a first electrode of the data write transistor, and the data signal line is connected to the first electrode of the data write transistor through a via hole.

In an exemplary embodiment, in at least one circuit unit, the first source-drain metal layer further includes a data connection block, a first terminal of the data connection block is connected to the first connection line, and a second terminal of the data connection block is connected to a first electrode of the data write transistor.

In an exemplary embodiment, in at least one circuit unit, the second source-drain metal layer further includes an interlayer dummy connection block, which is connected to the first connection line through a via hole, and the third source-drain metal layer further includes a dummy electrode, which is connected to the interlayer dummy connection block through a via hole.

In an exemplary embodiment, the second source-drain metal layer further includes an interlayer data connection block connected to the first connection line through a via hole, and the second connection line is connected to the interlayer data connection block through a via hole.

In an exemplary embodiment, in at least one circuit unit, the third source-drain metal layer further includes a data connection electrode connected to the second connection line, and the data connection electrode is connected to the interlayer data connection block through a via hole.

In an exemplary embodiment, at least one unit row is provided with two first connection lines sequentially arranged along the first direction, a first break is provided between the two first connection lines, and multiple first breaks of the multiple unit rows are located in the same circuit column.

In an exemplary embodiment, the display region further includes multiple first power supply wirings extending along the first direction and multiple second power supply wirings extending along the second direction, the first power supply wirings and the second power supply wirings are disposed in different conductive layers, and the first power supply wirings are connected to the second power supply wirings.

In an exemplary embodiment, the multiple conductive layers include a first source-drain metal layer, a second source-drain metal layer and a third source-drain metal layer arranged sequentially along a direction away from a base substrate, the first source-drain metal layer at least includes the first power supply wirings, and the third source-drain metal layer at least includes the second power supply wirings.

In an exemplary embodiment, in at least one circuit unit, the second source-drain metal layer further includes an interlayer electrode connection block connected to the first power supply wiring through a via hole, and the second power supply wiring is connected to the interlayer electrode connection block through a via hole.

In an exemplary embodiment, in at least one circuit unit, the third source-drain metal layer further includes a power supply connection electrode connected to the second power supply wiring, and the power supply connection electrode is connected to the interlayer electrode connection block through a via hole.

In an exemplary embodiment, the second power supply wiring and the second connection line are arranged in the same layer, at least one unit column is provided with a second connection line and a second power supply wiring sequentially arranged along the second direction, a second break is arranged between the second connection line and the second power supply wiring, and multiple second breaks of multiple unit columns are located in the same circuit row.

In an exemplary embodiment, the display substrate further includes a bonding region located on the second direction side of the display region and a bezel region located on the other side of the display region, the bonding region is provided with a bonding power supply lead, the bezel region is provided with a bezel power supply lead, the bonding power supply lead and the bezel power supply lead are configured to continuously supply low voltage signals, and the first power supply wiring and the second power supply wiring are connected to the bonding power supply lead and the bezel power supply lead, respectively.

In an exemplary embodiment, the pixel drive circuit at least includes a storage capacitor and multiple transistors, the multiple conductive layers include a semiconductor layer, a first gate metal layer, a second gate metal layer, a first source-drain metal layer, a second source-drain metal layer, and a third source-drain metal layer arranged sequentially in a direction away from a base substrate, the semiconductor layer at least includes active layers of multiple transistors, the first gate metal layer at least includes gate electrodes of multiple transistors and a first electrode plate of the storage capacitor, the second gate metal layer at least includes a second electrode plate of the storage capacitor, the first source-drain metal layer at least includes the first connection line, the second source-drain metal layer at least includes the data signal line, and the third source-drain metal layer at least includes the second connection line.

In an exemplary embodiment, the first source-drain metal layer further includes a first power supply wiring extending along the first direction, and the third source-drain metal layer further includes a second power supply wiring extending along the second direction, and the first power supply wiring is connected to the second power supply wiring.

In another aspect, the present disclosure further provides a display apparatus, which includes the display substrate and a drive chip fixedly disposed on the display substrate, and the second connection line is electrically connected to the drive chip.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

DETAILED DESCRIPTION

Figure 1:
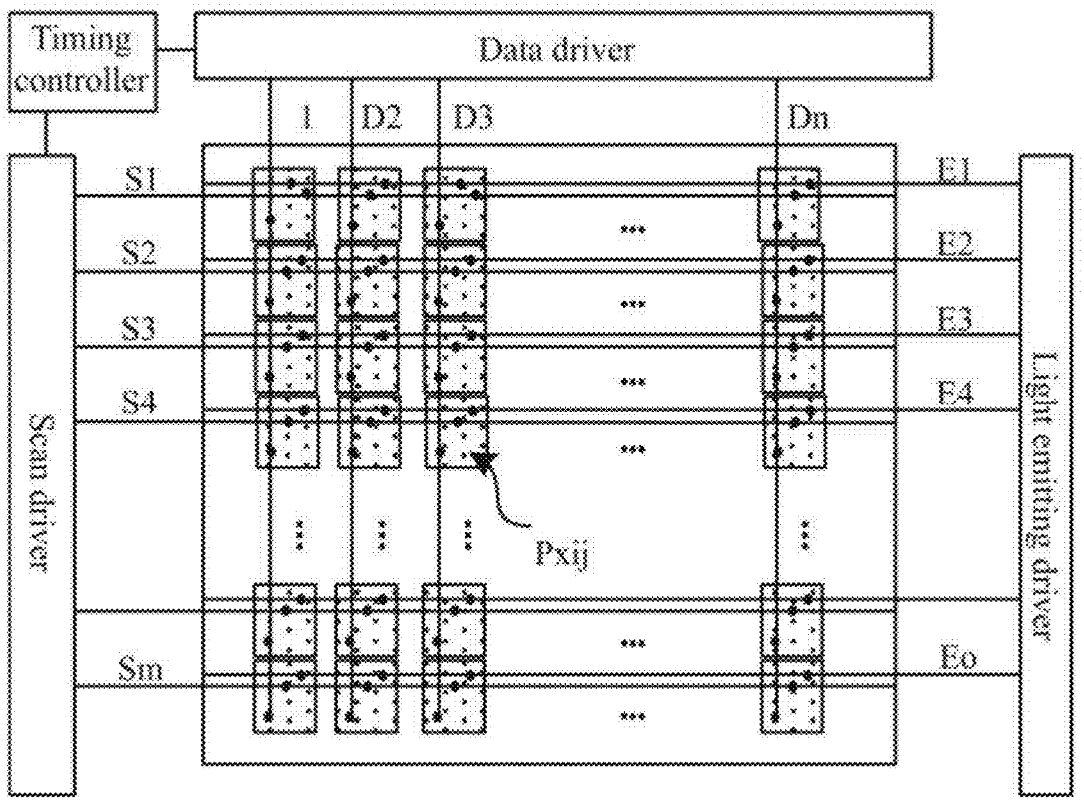
FIG. 1 is a schematic diagram of a structure of a display apparatus.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each thin film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but further include switch elements such as transistors, resistors, inductors, capacitors, other elements with various functions, etc.

In the specification, "parallel" refers to a state in which an angle formed by two straight lines is above −10° and below 10°, and thus further includes a state in which the angle is above −5° and below 5°. In addition, "perpendicular" refers to a state in which an angle formed by two straight lines is above 80° and below 100°, and thus further includes a state in which the angle is above 85° and below 95°.

In the specification, a "thin film" and a "layer" are interchangeable. For example, a "conductive layer" may be replaced with a "conductive thin film" sometimes. Similarly, an "insulating thin film" may be replaced with an "insulating layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to multiple data signal lines (D1 to Dn) respectively, the scan driver is connected to multiple scan signal lines (S1 to Sm) respectively, and the light emitting driver is connected to multiple light emitting signal lines (E1 to Eo) respectively. The pixel array may include multiple sub-pixels Pxij, i and j may be natural numbers. At least one sub-pixel Pxij may include a circuit unit and a light-emitting device connected to the circuit unit. The circuit unit may at least include a pixel drive circuit respectively connected to a scan signal line, a light emitting signal line and a data signal line. In an exemplary implementation, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate data voltages to be provided to data signal lines D1, D2, D3, . . . , and Dn using the gray scale value and the control signal received from the timing controller. For example, the data driver may sample the gray tone value by using the clock signal and apply a data voltage corresponding to the gray tone value to the data signal lines D1 to Dn by taking a pixel row as a unit, wherein n may be a natural number. The scan driver may generate scan signals to be provided to scan signal lines S1, S2, S3, . . . , and Sm by receiving a clock signal, a scanning start signal, and the like from the timing controller. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The light emitting driver may generate transmission signals to be provided to light emitting line emitting lines E1, E2, E3, . . . , and Eo by receiving the clock signal, the transmission stop signal, and the like from the timing controller. For example, the light emitting driver may provide a transmit signal with an off-level pulse to the light emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

Figure 2:
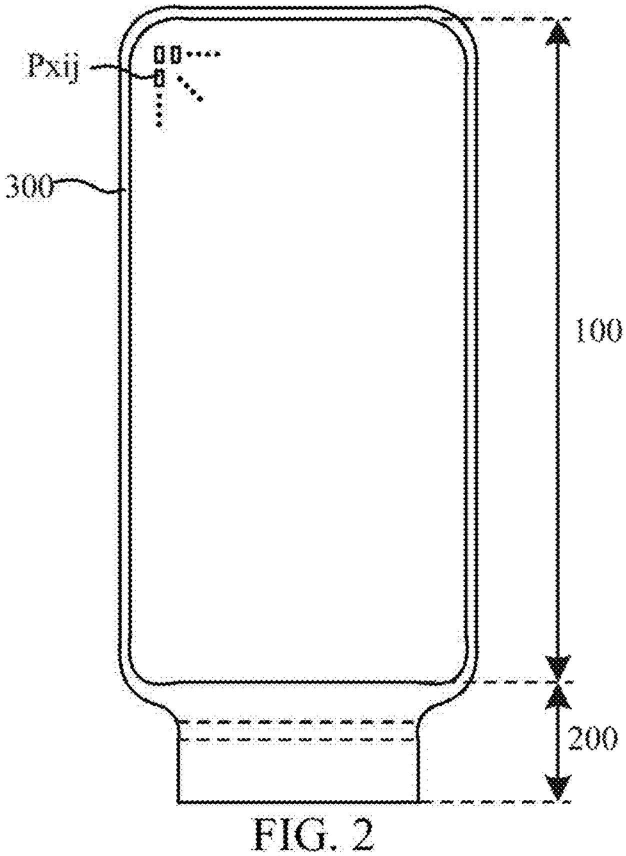
FIG. 2 is a schematic diagram of a structure of a display substrate.

FIG. 2 is a schematic diagram of a structure of a display substrate. As shown in FIG. 2, the display substrate may include a display region 100, a bonding region 200 at a side of the display region 100, and a bezel region 300 at other sides of the display region 100. In an exemplary embodiment, the display region 100 may be a planar region including multiple sub-pixels Pxij that form a pixel array, the multiple sub-pixels Pxij are configured to display a dynamic picture or a static image, and the display region 100 may be referred to as an active region (AA). In an exemplary implementation, the display substrate may be a flexible base substrate, and accordingly the display substrate may be deformed, for example, may be crimped, bent, folded, or curled.

In an exemplary embodiment, the bonding region 200 may include a fanout region connected to the display region 100, a bend region, a drive chip region, and a bonding pin region arranged sequentially in a direction away from the display region. The fanout region at least includes a data fanout line, multiple which are configured to connect data signal lines of the display region in a fanout manner. The bend region is connected to the fanout region and may include a composite insulating layer provided with a groove, and is configured to bend the bonding region to the back of the display region. The drive chip region may include an Integrated Circuit (IC for short) and is configured to be connected to the multiple data fanout lines. The bonding pin region may include Bonding Pads, which is configured to be bonded to an external Flexible Printed Circuit (FPC for short).

In an exemplary implementation, the bezel region 300 may include a circuit zone, a power supply line region, and a crack dam region and a cutting region which are sequentially disposed along the direction away from the display region 100. The circuit region is connected to the display region 100 and may at least include a gate drive circuit which is connected with a first scan line, a second scan line and a light emitting control line of a pixel drive circuit in the display region 100. The power supply line region is connected to the circuit region and may at least include a bezel power supply lead that extends along a direction parallel to the edge of the display region and is connected with a cathode in the display region 100. The crack dam region is connected to the power supply line region and may at least include multiple cracks disposed on the composite insulating layer. The cutting region is connected to the crack dam region and may at least include a cutting groove disposed on the composite insulating layer, and the cutting groove is used for cutting respectively along the cutting groove by a cutting device after all thin film layers of the display substrate are prepared.

In an exemplary embodiment, the fanout region in the bonding region 200 and the power supply line region in the bezel region 300 may be provided with a first isolation dam and a second isolation dam, the first isolation dam and the second isolation dam may extend in a direction parallel to the edge of the display region 100, thus forming an annular structure surrounding the display region 100, wherein the edge of the display region is an edge at a side of the display region, the bonding region or the bezel region.

Figure 3:
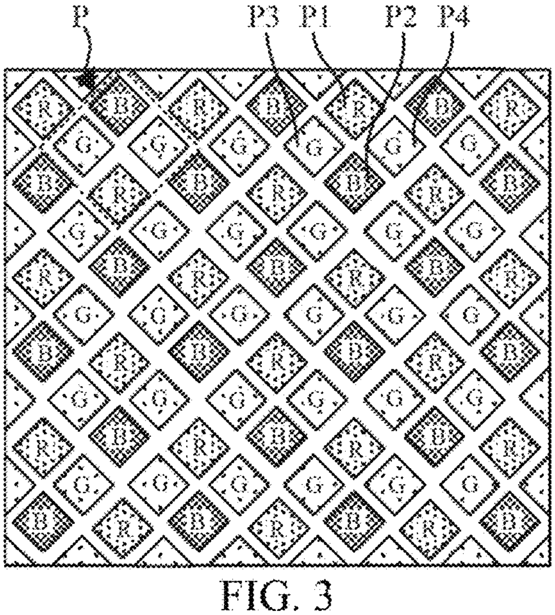
FIG. 3 is a schematic diagram of a planar structure of a display region in a display substrate.

FIG. 3 is a schematic diagram of a planar structure of a display region in a display substrate. As shown in FIG. 3, the display substrate may include multiple pixel units P arranged in a matrix. At least one pixel unit P may include a first sub-pixel P1 emitting light of a first color, a second sub-pixel P2 emitting light of a second color, and a third sub-pixel P3 and a fourth sub-pixel P4 emitting light of a third color. Each sub-pixel may include a light emitting device, and the light emitting device is connected to the pixel drive circuit of the corresponding circuit unit. The pixel drive circuit is respectively connected with a scan signal line, a data signal line and a light emitting signal line, the pixel drive circuit is configured to, under the control of the scan signal line and the light emitting signal line, receive a data voltage transmitted by the data signal line and output a corresponding current to the light emitting device, and the light emitting device is configured to emit light with a corresponding brightness in response to the current output by the pixel drive circuit of the sub-pixel where the light emitting device is located.

In an exemplary implementation, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation, the shape of the sub-pixel may be rectangle, diamond, pentagonal, hexagonal. The four sub-pixels may be arranged in a manner of diamond to form an RGBG pixel arrangement. In other exemplary embodiments, the four sub-pixels may be arranged side by side horizontally, side by side vertically, or in a square-shaped manner, which is not limited in the present disclosure.

In an exemplary implementation, the pixel unit may include three sub-pixels, the three sub-pixels may be arranged in manner of horizontal juxtaposition, vertical juxtaposition or triangle, which is not limited in the present disclosure.

Figure 4:
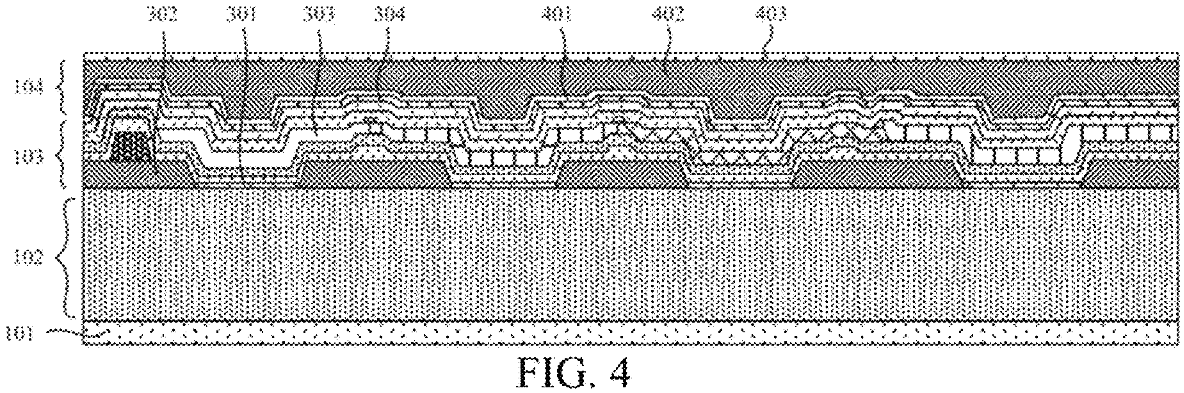
FIG. 4 is a schematic diagram of a sectional structure of a display region in a display substrate.

FIG. 4 is a schematic diagram of a sectional structure of a display region in a display substrate, illustrating a structure of four sub-pixels in the display region. As shown in FIG. 4, in a plane perpendicular to the display substrate, the display substrate may include a drive structure layer 102 disposed on a base substrate 101, a light emitting structure layer 103 disposed at a side of the drive structure layer 102 away from the base substrate 101, and an encapsulation structure layer 104 disposed at a side of the light emitting structure layer 103 away from the base substrate 101. In some possible implementations, the display substrate may include other thin film layers, such as a touch structure layer, which is not limited here in the present disclosure.

In an exemplary implementation, the base substrate 101 may be a flexible base substrate, or a rigid base substrate. The drive structure layer 102 may include multiple circuit units, and the circuit units may include pixel drive circuits composed of multiple transistors and storage capacitors. The light emitting structure layer 1032 may include multiple sub-pixels, and the sub-pixel may at least include an anode 301, a pixel define layer 302, an organic light emitting layer 303 and a cathode 304. The anode 301 is connected to the pixel drive circuit, the organic light emitting layer 303 is connected to the anode 301, the cathode 304 is connected to the organic light emitting layer 303, the organic light emitting layer 303 emits light of a corresponding color under driving of the anode 301 and the cathode 304. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, forming an inorganic material/organic material/inorganic material stack structure, thus ensuring that external water vapor cannot enter the light emitting structure layer 103.

In an exemplary implementation, the organic light emitting layer may include a light emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary implementation, one or more layers of hole injection layers, hole transport layers, electron block layers, hole block layers, electron transport layers, and electron injection layers of all sub-pixels may be a common layer communicated together. Emitting layers of adjacent sub-pixels may be overlapped slightly, or may be mutually isolated.

Figure 5:
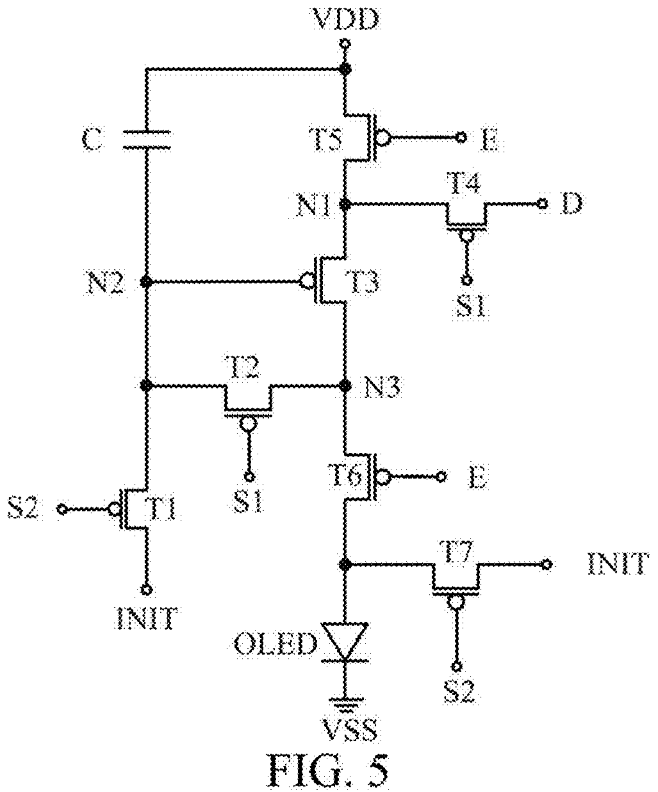
FIG. 5 is a schematic diagram of an equivalent circuit of a pixel drive circuit.

FIG. 5 is a schematic diagram of an equivalent circuit of a pixel drive circuit. In an exemplary implementation, the pixel drive circuit may have a structure of 3T1C, 4T1C, 5T1C, 5T2C, 6T1C, 7T1C or 8T1C. As shown in FIG. 5, the pixel drive circuit may include seven transistors (a first transistor T1 to a seventh transistor T7), one storage capacitor C. The pixel drive circuit is connected to seven signal lines (a data signal line D, a first scan signal line S1, a second scan signal line S2, a light emitting signal line E, an initial signal line INIT, a first power supply line VDD, and a second power supply line VSS) respectively.

In an exemplary implementation, the pixel drive circuit may include a first node N1, a second node N2, and a third node N3. Herein, the first node N1 is respectively connected to a first electrode of the third transistor T3, a second electrode of the fourth transistor T4, and a second electrode of the fifth transistor T5, the second node N2 is respectively connected to a second electrode of the first transistor, a first electrode of the second transistor T2, a control electrode of the third transistor T3, and a second terminal of the storage capacitor C, and the third node N3 is respectively connected to a second electrode of the second transistor T2, a second electrode of the third transistor T3, and a first electrode of the sixth transistor T6.

In an exemplary embodiment, a first terminal of the storage capacitor C is connected to the first power supply line VDD, and the second terminal of the storage capacitor C is connected to the second node N2, i.e., the second terminal of the storage capacitor C is connected to the control electrode of the third transistor T3.

A control electrode of the first transistor T1 is connected to the second scan signal line S2, a first electrode of the first transistor T1 is connected to an initial signal line INIT, and a second electrode of the first transistor is connected to the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected to the first scan signal line S1, a first electrode of the second transistor T2 is connected to the second node N2, and a second electrode of the second transistor T2 is connected to the third node N3. When a scan signal with an on-level is applied to the first scan signal line S1, the second transistor T2 enables the control electrode of the third transistor T3 to be connected to a second electrode of the third transistor T3.

A control electrode of the third transistor T3 is connected to the second node N2, i.e., the control electrode of the third transistor T3 is connected to the second terminal of the storage capacitor C, a first electrode of the third transistor T3 is connected to the first node N1, and a second electrode of the third transistor T3 is connected to the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected to the first scan signal line S1, a first electrode of the fourth transistor T4 is connected to the data signal line D, and a second electrode of the fourth transistor T4 is connected to the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected to the light emitting signal line E, a first electrode of the fifth transistor T5 is connected to the first power supply line VDD, and a second electrode of the fifth transistor T5 is connected to the first node N1. A control electrode of the sixth transistor T6 is connected to the light emitting signal line E, a first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected to the second scan signal line S2, a first electrode of the seventh transistor T7 is connected to the initial signal line INIT, and a second electrode of the seventh transistor T7 is connected to the first electrode of the light emitting device. When a scan signal with an on-level is applied to the second scan signal line S2, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation, the light emitting device may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary embodiment, a second electrode of the light emitting device is connected to the second power supply line VSS, a signal of the second power supply line VSS is a low voltage signal, and a signal of the first power supply line VDD is a high-level signal continuously provided.

In an exemplary implementation, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary implementation, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a LTPS+Oxide (LTPO for short) display substrate, so that advantages of the low temperature poly-silicon thin film transistor and the oxide thin film transistor may be utilized, low-frequency drive may be achieved, power consumption may be reduced, and display quality may be improved.

In an exemplary implementation, taking a first transistor T1 to a seventh transistor T7 as P-type transistors as an example, the working process of a pixel drive circuit may include:

In a first stage A1, referred to as a reset stage, a signal of the second scan signal line S2 is a low voltage signal, and signals of the first scan signal line S1 and the light emitting signal line E are high-level signals. The signal of the second scan signal line S2 is a low voltage signal, the first transistor T1 and the seventh transistor T7 are turned on, the initial voltage of the initial signal line INIT is supplied to the second node N2 through the first transistor T1, the storage capacitor C is initialized, the original data voltage in the storage capacitor is cleared, the initial voltage of the initial signal line INIT is supplied to the first electrode of the OLED through the seventh transistor T7, the first electrode of the OLED is initialized (reset), the pre-stored voltage inside the OLED is cleared, and the initialization is completed to ensure that the OLED does not emit light. The signals of the first scan signal line S1 and the light emitting signal line E are high-level signals, so that the second transistor T2, the fourth transistor T4, the fifth transistor T5, the sixth transistor T6, and the seventh transistor T7 are turned off.

In a second stage A2, referred to as a data write stage or a threshold compensation stage, the signal of the first scan signal line S1 is a low voltage signal, signals of the second scan signal line S2 and the light emitting signal line E are high-level signals, and the data signal line D outputs a data voltage. In this stage, a second terminal of the storage capacitor C is at a low voltage, so the third transistor T3 is turned on. The signal of the first scan signal line S1 is a low voltage signal, so that the second transistor T2 and the fourth transistor T4 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The signal of the light emitting signal line E is a high-level signal, so that the fifth transistor T5 and the sixth transistor T6 are turned off.

In a third stage A3, referred to as a light emitting stage, the signal of the light emitting signal line E is a low voltage signal, and the signals of the first scan signal line S1 and the second scan signal line S2 are high-level signals. The signal of the light emitting signal line E is a low voltage signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. Since the voltage of the second node N2 is Vd−|Vth|, the drive current of the third transistor T3 is as follows:

$$I = K*(Vgs - Vth)^2 = K*[(Vdd - Vd + |Vth|) - V\,th]^2 = K*[Vdd - Vd]^2.$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have higher requirements for the display effect of display products. Super-narrow bezels have become a new trend in the development of display products. Therefore, bezel narrowing or even a bezel-less design has received more attention in the design of OLED display products. In a display substrate, the bonding region usually includes a fanout region, a bend region, a drive chip region, and a bonding pin region arranged sequentially along a direction away from the display region. Since a width of the bonding region is smaller than a width of the display region, the signal lines of the drive chip and the bonding pad in the bonding region need to be fanned out through the Fanout region to be lead into the wider display region, the greater the width difference between the display region and the bonding region, the more oblique fanout lines in the fa region, the longer the distance between the drive chip region and the display region, so the fa region occupies a large space, which makes it difficult to narrow the lower bezel, and the lower bezel is always maintained at about 2.0 mm. In another display substrate, the bezel region is usually provided with a bezel power supply lead, which is configured to continuously provide and transmit low-voltage power signals. In order to reduce the voltage drop of the low-voltage power signals, the width of the bezel power supply lead is larger, resulting in a larger width of the left and right bezels of the display apparatus.

Figure 6:
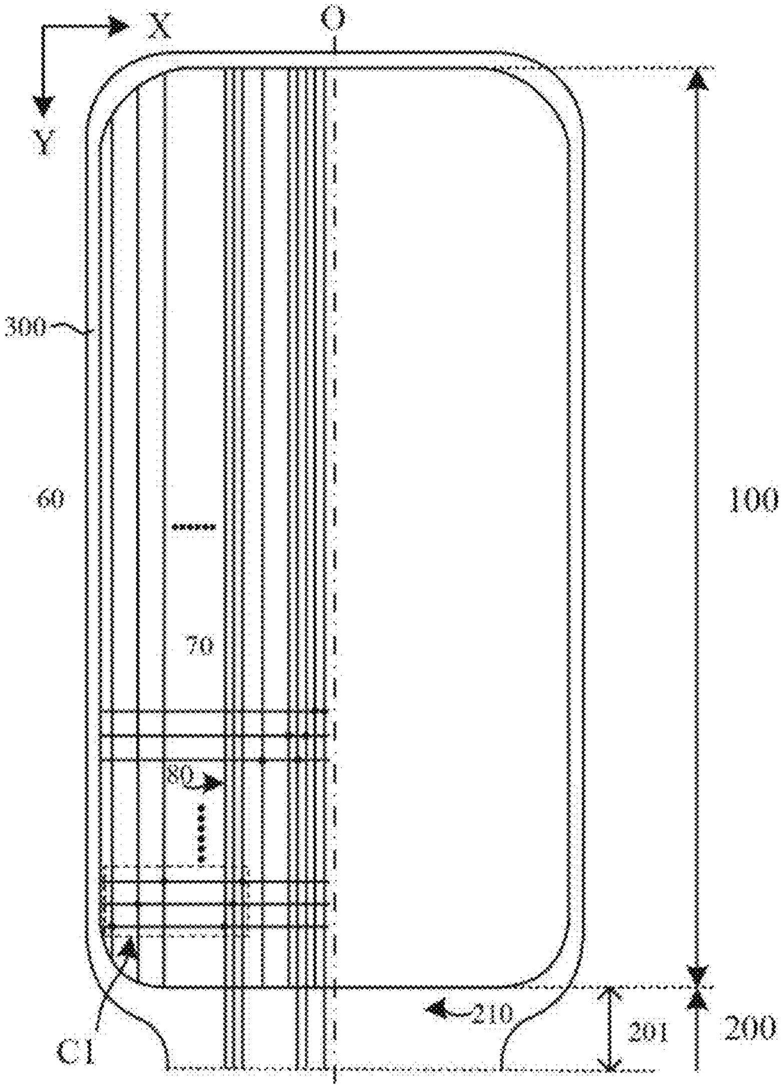
FIG. 6 is a schematic diagram of a planar structure of a display substrate according to an exemplary embodiment of the present disclosure.

FIG. 6 is a schematic diagram of a planar structure of a display substrate according to an exemplary embodiment of the present disclosure. In a plane perpendicular to the display substrate, the display panel may include a drive structure layer arranged on the base substrate, a light emitting structure layer arranged on one side of the drive structure layer away from the base substrate, and an encapsulation structure layer arranged on one side of the light emitting structure layer away from the base substrate. As shown in FIG. 6, on a plane parallel to the display substrate, the display substrate may at least include a display region 100, a bonding region 200 on a side of the display region 100 in the second direction Y, and a bezel region 300 on other sides of the display region 100. In an exemplary embodiment, a drive structure layer of a display region 100 may include multiple circuit units forming multiple unit rows and multiple unit columns, and at least one circuit unit may include a pixel drive circuit configured to output a corresponding current to a connected light emitting device. The light emitting structure layer of the display region 100 may include multiple sub-pixels forming a pixel array, at least one sub-pixel may include a light emitting device connected to a pixel drive circuit of a corresponding circuit unit, and the light emitting device is configured to emit light of a corresponding brightness in response to a current output by the connected pixel drive circuit.

In an exemplary embodiment, the circuit unit in the present disclosure refers to a region divided according to a pixel drive circuit, and the sub-pixel in the present disclosure refers to a region divided according to a light emitting device. In an exemplary embodiment, the positions and shapes of orthographic projections of the sub-pixels on the base substrate may correspond to the positions and shapes of the orthographic projections of the circuit units on the base substrate, or the positions and shapes of the orthographic projections of the sub-pixels on the base substrate may not correspond to the positions and shapes of the orthographic projections of the circuit units on the base substrate.

In an exemplary embodiment, multiple circuit units sequentially arranged along a first direction X may be referred to as a unit row, and multiple circuit units sequentially arranged along a second direction Y may be referred to as a unit column. The plurality of unit rows and the multiple unit columns form an array of circuit units arranged in an array, the first direction X intersects the second direction Y.

In an exemplary embodiment, the drive structure layer of the display region 100 may further include multiple data signal lines 60, multiple first connection lines 70, and multiple second connection lines 80. The data signal lines 60 are respectively connected to multiple pixel drive circuits in one unit column and are configured to supply data signals to the connected pixel drive circuits. A plurality of first connection lines 70 are correspondingly connected to multiple data signal lines 60, and multiple second connection lines 80 are correspondingly connected to multiple first connection lines 70. The first connection lines 70 and the second connection lines 80 form data connection lines configured to connect the data signal lines 60 to the lead out lines 210 in the bonding region 200.

In an exemplary implementation, the bonding region 200 may include a lead region 201, a bend region, a drive chip region, and a bonding pin region which are sequentially disposed along a direction away from the display region, and the lead region 201 is connected to the display region 100, the bend region is connected with the lead region 201. A plurality of lead out lines 210 may be provided in the lead region 201. The plurality of lead out lines 210 may extend in a direction away from the display region. The first terminals of the multiple lead out lines 210 are connected to the multiple second connection lines 80 in the display region 100. After the second terminals of the multiple lead out lines 210 extend in the second direction Y and cross the bend region, they are connected to the drive chip in the drive chip region so that the drive chip is connected to the data signal line 60 through the lead out lines 210, the second connection line 80 and the first connection line 70, and the data signal supplied by the drive chip is applied to the data signal line 60. Since the first connection line 70 and the second connection line 80 are arranged in the display region, the length of the lead region in the second direction Y may be effectively reduced, the width of the lower bezel may be greatly reduced, the screen proportion may be increased, and the overall screen display may be achieved.

In an exemplary embodiment, the shape of the first connection line 70 may be a line shape extending along the first direction X, the shape of the second connection line 80 may be a line shape extending along the second direction Y, and the shape of the data signal line 60 may be a line shape extending along the second direction Y.

In an exemplary embodiment, the first connection line 70 may be arranged perpendicular to the data signal line 60, and the second connection line 80 may be arranged parallel to the data signal line 60.

In the present disclosure, "A extends in a B direction" means that A may include a main portion, which is a line, a line segment or a strip-shaped body, and a secondary portion connected to the main portion, the main portion extends in the B direction, and a length of the main portion extending in the B direction is greater than a length of the secondary portion extending in another direction. In the following description, "A extends in a B direction" means "the main body portion of A extends in a B direction". In an exemplary implementation, the second direction Y may be a direction pointing to the bonding region from the display region, and the opposite direction of the second direction Y may be a direction pointing to the display region from the bonding region.

In an exemplary embodiment, the display region 100 may have a center line O, and multiple data signal lines 60, multiple first connection lines 70, multiple second connection lines 80 and multiple lead out lines 210 in the lead region 201 in the display region 100 may be symmetrically disposed with respect to the center line O, which may be a straight line that bisects multiple unit columns of the display region 100 and extends along a second direction Y.

In an exemplary embodiment, multiple second connection lines 80 may be provided in a central region of the first direction X of the display region 100, that is, the multiple second connection lines 80 may be located in a region of the display region 100 adjacent to the center line O. Alternatively, multiple second connection lines 80 may be provided in a central region of the left and right regions, respectively. For the left region to the left of the center line O, half the number of second connection lines 80 may be provided in the central region of the left region, and for the right region to the right of the center line O, half the number of second connection lines 80 may be provided in the central region of the right region, which is not limited herein.

In an exemplary embodiment, two second connection lines 80 may be provided between two adjacent data signal lines 60 in the first direction X, that is, two second connection lines 80 may be provided in one unit column. Thus, for a display substrate having N unit columns, the multiple second connection lines 80 only need to occupy N/2 unit columns, so that data signals may be accessed.

In some possible exemplary embodiments, one, three, or more second connection lines 80 may be provided between two adjacent data signal lines 60 in the first direction X, and the present disclosure is not limited herein.

In an exemplary embodiment, the drive structure layer may include multiple conductive layers, and the data signal line 60, the first connection line 70, and the second connection line 80 may be disposed in different conductive layers, the first connection line 70 may be connected to the data signal line 60 through the first connection hole, and the second connection line 80 may be connected to the first connection line 70 through the second connection hole.

In an exemplary embodiment, the lead out line 210 and the second connection line 80 may be connected directly or may be connected through a via hole, and the present disclosure is not limited herein.

Figure 7:
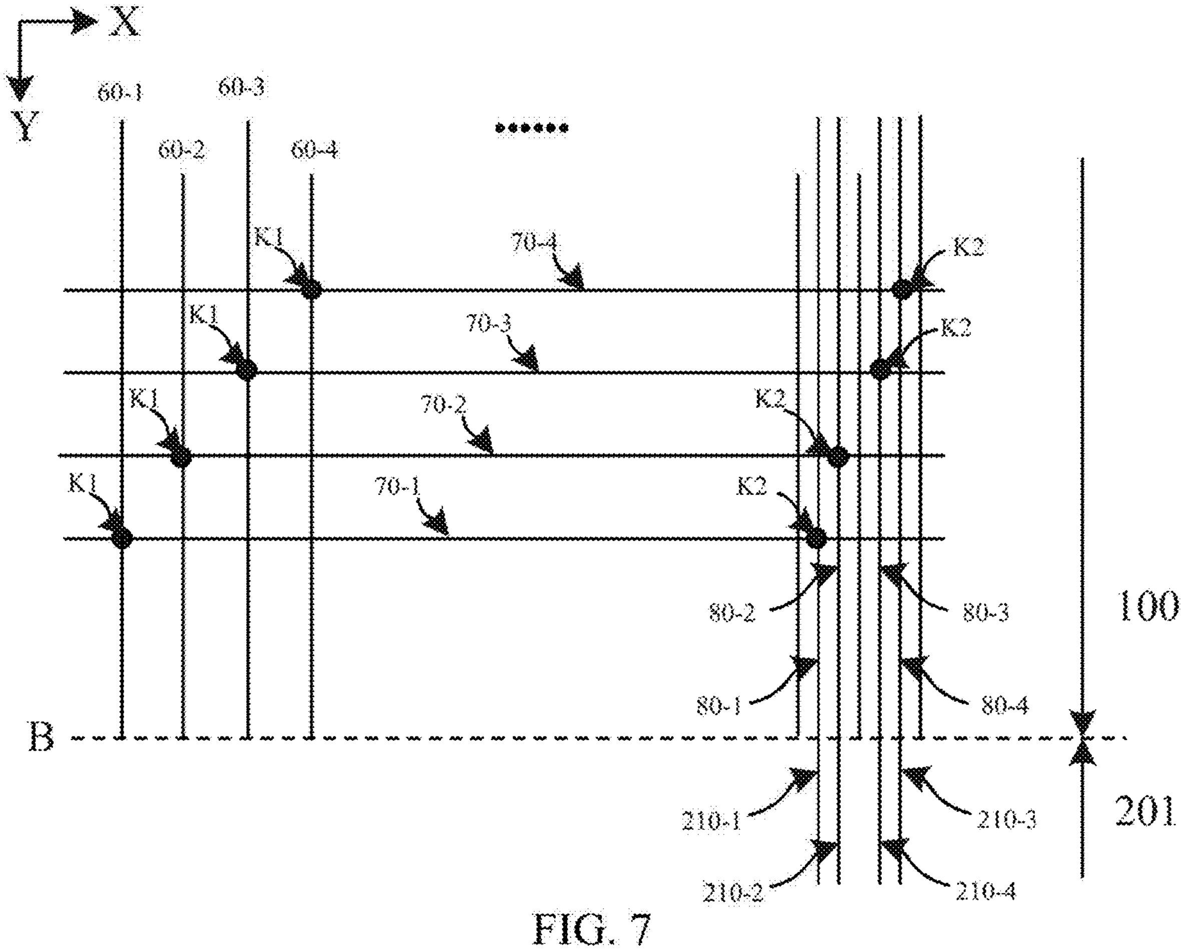
FIG. 7 is a schematic diagram of an arrangement of a data connection line according to an exemplary embodiment of the present disclosure.

FIG. 7 is a schematic diagram of an arrangement of a data connection line according to an exemplary embodiment of the present disclosure, and is an enlarged view of the C1 region in FIG. 6. As shown in FIG. 7, in an exemplary embodiment, multiple data signal lines may include data signal lines 60-1 to 60-4, multiple first connection lines may include first connection lines 70-1 to 70-4, multiple second connection lines may include second connection lines 80-1 to 80-4, and multiple lead out lines of the lead region 201 may include lead out lines 210-1 to 210-4.

In an exemplary embodiment, the data signal lines 60-1 to 60-4 are in line shapes extending along a second direction Y, and may be arranged in order of numbers from small to large along a first direction X. The shapes of the first connection lines 70-1 to 70-4 are line shapes extending along the first direction X, and may be arranged in order of numbers from large to small along the second direction Y. The shape of the second connection lines 80-1 to 80-4 are line shapes extending along the second direction Y, and may be arranged in order of number from small to large along the first direction X. The shapes of the lead out lines 210-1 to 210-4 are line shapes extending along the second direction Y, and may be arranged in order of numbers from small to large along the first direction X, so that the data output pins of the drive chip may be designed in positive sequence, and the data signal output without sudden change of load is achieved, and the display quality is improved.

In an exemplary embodiment, the first connection line 70-1 is connected to the data signal line 60-1 through the first connection hole K1, the second connection line 80-1 is connected to the first connection line 70-1 through the second connection hole K2, and the second connection line 80-1 is connected to the lead out line 210-1 of the bonding region, thereby achieving the connection of the lead out line 210-1 to the data signal line 60-1 through the second connection line 80-1 and the first connection line 70-1. The first connection line 70-2 is connected to the data signal line 60-2 through the first connection hole K1, the second connection line 80-2 is connected to the first connection line 70-2 through the second connection hole K2, and the second connection line 80-2 is connected to the lead out line 210-2 of the bonding region, thereby achieving the connection of the lead out line 210-2 to the data signal line 60-2 through the second connection line 80-2 and the first connection line 70-2. The first connection line 70-3 is connected to the third data signal line 60-3 through the first connection hole K1, the second connection line 80-3 is connected to the first connection line 70-3 through the second connection hole K2, and the second connection line 80-3 is connected to the lead out line 210-3 of the bonding region, thereby achieving the connection of the lead out line 210-3 to the third data signal line 60-3 through the second connection line 80-3 and the first connection line 70-3. The first connection line 70-4 is connected to the data signal line 60-4 through the first connection hole K1, the second connection line 80-4 is connected to the first connection line 70-4 through the second connection hole K2, and the second connection line 80-4 is connected to the lead out line 210-4 of the bonding region, thereby achieving that the lead out line 210-4 is connected to the data signal line 60-4 through the second connection line 80-4 and the first connection line 70-4.

In an exemplary embodiment, the distances between the multiple first connection holes K1 where the first connection line and the data signal line are connected correspondingly and the edge B of the display region may be different. For example, the distance between the first connection hole K1 where the first connection line 70-2 is connected to the data signal line 60-2 and the edge B of the display region B may be greater than the distance between the first connection hole K1 where the first connection line 70-1 is connected to the data signal line 60-1 and the edge B of the display region. In an exemplary implementation, the edge B of the display region may be an edge on a side, close to the bonding region, of the display region.

In an exemplary embodiment, the distances between the multiple second connection holes K2 in which the second connection line and the first connection line are connected correspondingly and the edge B of the display region may be different. For example, the distance between the second connection hole K2 connected by the second connection line 80-2 and the first connection line 70-2 and the edge B of the display region may be greater than the distance between the second connection hole K2 connected by the second connection line 80-1 and the first connection line 70-1 and the edge B of the display region.

In an exemplary embodiment, the spacing between adjacent first connection lines 70 in the second direction Y may be the same or different, and the spacing between adjacent second connection lines 80 in the first direction X may be the same or different, and the present disclosure is not limited herein.

By arranging the data connection line in the display region, the lead out line of the bonding region is connected to the data signal line through the data connection line, so that the fan-shaped oblique line does not need to be arranged in the lead region, the length of the lead region is effectively reduced, the width of the lower bezel is greatly reduced, the screen proportion is increased, and the overall screen display is facilitated.

Figure 8:
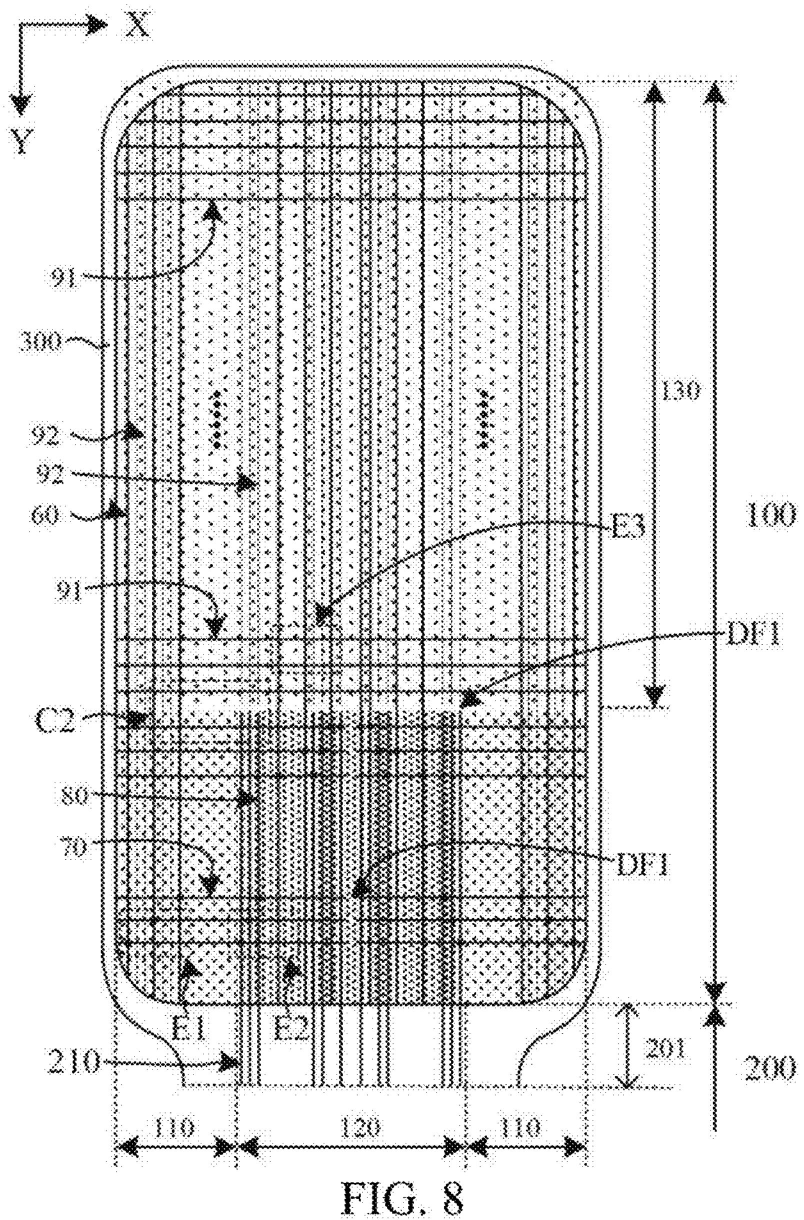
FIG. 8 is a schematic diagram of another planar structure of a display substrate according to an exemplary embodiment of the present disclosure.

FIG. 8 is a schematic diagram of another planar structure of a display substrate according to an exemplary embodiment of the present disclosure. As shown in FIG. 8, the drive structure layer of the display region 100 may include multiple circuit units forming an array of circuit units, multiple data signal lines 60, multiple first connection lines 70, multiple second connection lines 80, and power supply wirings of a mesh-connected structure. The layouts and structures of the multiple circuit units, the multiple data signal lines 60, the multiple first connection lines 70, and the multiple second connection lines 80 are substantially the same as those shown in FIG. 6.

In an exemplary embodiment, the power supply wirings may include multiple first power supply wirings 91 extending along a first direction X and multiple second power supply wirings 92 extending along a second direction Y. The plurality of first power supply wirings 91 may be sequentially disposed along the second direction Y, and the multiple second power supply wirings 92 may be sequentially disposed along the first direction X.

In an exemplary embodiment, at least one second power supply wiring 92 may be connected to at least one first power supply wiring 91, such that multiple first power supply wiring 91 and multiple second power supply wiring 92 form a power supply wiring of a mesh-connected structure.

In an exemplary embodiment, two second power supply wirings 92 may be provided between two adjacent data signal lines 60 in the first direction X.

In an exemplary embodiment, the first power supply wirings 91 and the first connection lines 70 may be arranged in the same layer and formed synchronously by the same patterning process, and the second power supply wirings 92 and the second connection lines 80 may be arranged in the same layer and formed synchronously by the same patterning process.

In an exemplary embodiment, multiple first connection lines 70 may be disposed in a region close to one side of the bonding region in the second direction Y of the display region 100, and multiple first power supply wirings 91 may be disposed in a region away from one side of the bonding region in the second direction Y of the display region 100.

In an exemplary embodiment, multiple second connection lines 80 may be provided in a central region close to one side of the bonding region in the second direction Y of the display region 100, and multiple second power supply wirings 92 may be provided in both side regions in the first direction X of the display region 100, and in a region away from one side of the bonding region in the second direction Y of the display region 100.

In an exemplary embodiment, the power supply wirings of the mesh-connected structure may be wirings that continuously provide a low voltage signal. For example, the power supply wiring may be a second power supply line VSS.

In an exemplary embodiment, the bonding region 200 may be provided with a bonding power supply lead and the bezel region 300 may be provided with a bezel power supply lead, wherein the power supply wirings are connected to the bonding power supply lead and the bezel power supply lead respectively.

In an exemplary embodiment, one terminal or both terminals of multiple first power supply wirings 91 extending along a first direction X may be connected to a bezel power supply lead of a bezel region 300, and one terminal of multiple second power supply wirings 92 extending along a second direction Y may be connected to a bonding power supply lead, and the other terminal may be connected to a bezel power supply lead.

In an exemplary embodiment, the bonding power supply lead of the bonding region 200 and the bezel power supply lead of the bezel region 300 may be an integrated structure connected to each other.

In an exemplary embodiment, in at least one unit row, two first connection lines arranged sequentially along the first direction X are provided, and a first break DF1 may be provided between the first connection lines 70 on both sides of the center line O, and the first break DF1 is configured to achieve insulation between the first connection lines 70 on both sides of the center line O. A plurality of first connection lines 70 located on the left side of the center line O are configured to correspondingly connect to multiple second connection lines 80 located on the left side of the center line O, and a first connection line 70 located on the right side of the center line O is configured to correspondingly connect to multiple second connection lines 80 located on the right side of the center line O.

In an exemplary embodiment, multiple first breaks DF1 in the display region may be located on a straight line extending along the second direction Y, i.e. multiple first breaks DF1 of multiple unit rows may be located in the same circuit column.

In an exemplary embodiment, because the data connection line is provided in a part of the display region, and the data connection line includes a first connection line extending along a first direction X and a second connection line extending along a second direction Y, therefore, according to whether there is a data connection line, the display region is divided into a wiring region and a normal region. According to the extension direction of the data connection line, the wiring region is divided into a first region 110 and a second region 120. The wiring region may be a region where a first connection line 70 and/or a second connection line 80 are provided. The first region 110 may be a region where only the first connection line 70 is provided, the second region 120 may be a region where both the first connection line 70 and the second connection line 80 are provided, and the normal region may be a region where neither the first connection line 70 nor the second connection line 80 is provided. In the present disclosure, the normal region may be referred to as the third region 130, that is, the third region 130 is a region where the first connection line 70 and the second connection line 80 are not provided.

In an exemplary embodiment, the first region 110 may include multiple circuit units, and an orthographic projection of the first connection line 70 on the plane of the display substrate at least partially overlaps an orthographic projection of the pixel drive circuit in at least one circuit unit in the first region 110 on the plane of the display substrate.

In an exemplary embodiment, the second region 120 may include multiple circuit units. An orthographic projection of the first connection line 70 on the display substrate plane at least partially overlaps an orthographic projection of the pixel drive circuit in at least one circuit unit of the second region 120 on the display substrate plane. An orthographic projection of the second connection line 80 on the display substrate plane at least partially overlaps with an orthographic projection of the pixel drive circuit in at least one circuit unit of the second region 120 on the display substrate plane.

In an exemplary embodiment, the third region 130 may include multiple circuit units. The orthographic projections of the first connection line 70 and the second connection line 80 on the display substrate plane does not overlap with the orthographic projection of the pixel drive circuit in at least one circuit unit in the third region 130 on the display substrate plane.

In an exemplary embodiment, the first region 110 may be provided with multiple second power supply wirings 92, but the first power supply wirings 91 are not provided, and the second region 120 is provided with neither the first power supply wirings 91 nor the second power supply wirings 92.

In an exemplary implementation, the division of the respective regions shown in FIG. 8 is only an exemplary illustration. Since the first region 110, the second region 120 and the third region 130 are divided according to the presence or absence of data connection lines and the direction of extension of the data connection lines, the shape of the three regions can be a regular polygon or an irregular polygon. The display region can be divided into one or more first regions 110, one or more second regions 120 and one or more third regions 130, which are not limited in this disclosure.

Figure 9:
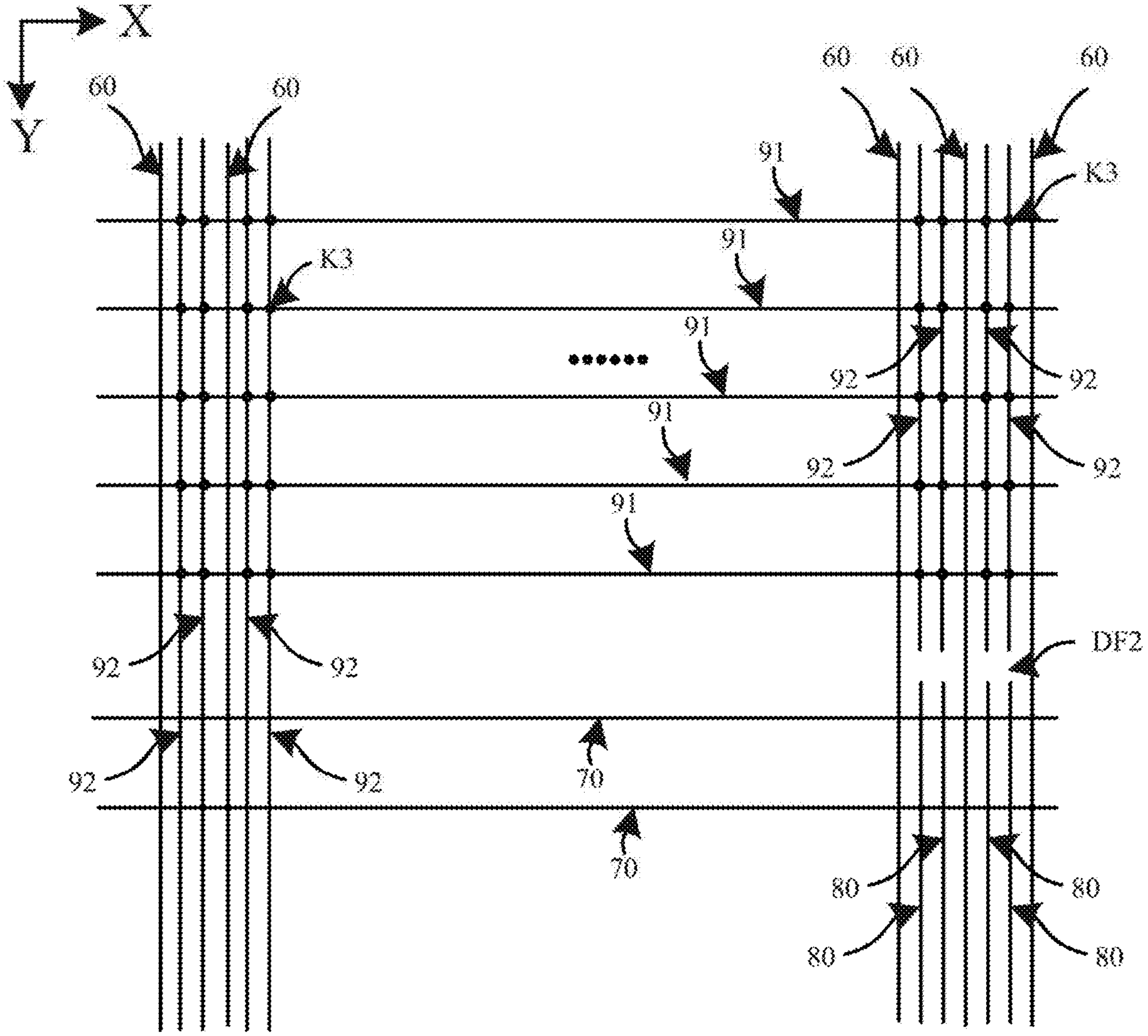
FIG. 9 is a schematic diagram of an arrangement of power supply wiring according to an exemplary embodiment of the present disclosure.

FIG. 9 is a schematic diagram of an arrangement of power supply wiring according to an exemplary embodiment of the present disclosure, and is an enlarged view of the C2 region in FIG. 8. As shown in FIGS. 8 and 9, in an exemplary embodiment, the first power supply wirings 91 and the second power supply wirings 92 may be disposed in different conductive layers. At least one second power supply wiring 92 may be connected to at least one first power supply wiring 91 through a third connection hole K3 so that the multiple first power supply wirings 91 and the multiple second power supply wirings 92 have the same potential, and the multiple first power supply wirings 91 and the multiple second power supply wirings 92 form a power supply wiring of a mesh-connected structure.

In an exemplary embodiment, only the first connection line 70 may be provided in one circuit row in which the first power supply wiring 91 is not provided, or only the first power supply wiring 91 may be provided in one circuit row in which the first connection line 70 is not provided.

In an exemplary embodiment, only the second power supply wirings 92 may be provided in a circuit column in which the second connection lines 80 are not provided, and the second power supply wirings 92 extend from the side of the display region close to the bonding region to the side of the display region away from the bonding region, such as the second power supply wirings 92 on the left side in FIG. 9.

In an exemplary embodiment, in at least one circuit column, a second connection line 80 and a second power supply wiring 92 may be provided respectively, the second connection line 80 and the second power supply wiring 92 may be arranged sequentially along the second direction Y. The second connection line 80 may be disposed in a region close to the bonding region of the display region, and the second power supply wiring 92 may be disposed in a region away from the bonding region of the display region. A second break DF2 is provided between the second connection line 80 and the second power supply wiring 92, and the second break DF2 is configured to achieve insulation between the second connection line 80 and the second power supply wiring 92.

In an exemplary embodiment, multiple second breaks DF2 may be located on a straight line extending along the first direction X, i.e. multiple second breaks DF2 of multiple unit columns may be disposed in the same circuit row.

The present disclosure achieves a structure in which a low voltage signal line is arranged in a VSS in pixel by arranging a power supply line in a display region, which can greatly reduce the width of the bezel power supply lead and is beneficial to the realization of a narrow bezel. By arranging the power supply wirings into a mesh connection structure, the present disclosure can not only effectively reduce the resistance of the power supply wirings, effectively reduce the voltage drop of the low-voltage power supply signals and achieve low power consumption, but also effectively improve the uniformity of the power supply signals in the display substrate, effectively improve the display uniformity, and improve the display quality.

Exemplary embodiments of the present disclosure provide a display substrate, including a display region, the display region includes a drive structure layer disposed on a base substrate, the drive structure layer includes multiple circuit units forming multiple unit rows and multiple unit columns, multiple data signal lines, multiple first connection lines and multiple second connection lines, the circuit unit includes a pixel drive circuit, the data signal line is configured to supply a data signal to the pixel drive circuit; on a plane perpendicular to the display substrate, the drive structure layer includes multiple conductive layers arranged sequentially on the base substrate, the data signal line, the first connection line and the second connection line are disposed in different conductive layers, the second connection line extending in a second direction is connected to the first connection line extending in a first direction, the first connection line extending in a first direction is connected to the data signal line extending in a second direction, wherein the first direction and the second direction intersect.

In an exemplary embodiment, the multiple conductive layers include a first source-drain metal layer, a second source-drain metal layer and a third source-drain metal layer arranged sequentially along a direction away from the base substrate, the first source-drain metal layer at least includes the first connection line, the second source-drain metal layer at least includes the data signal line, and the third source-drain metal layer at least includes the second connection line.

In an exemplary embodiment, the display region further includes multiple first power supply wirings extending along the first direction and multiple second power supply wirings extending along the second direction, the first power supply wirings and the second power supply wirings are disposed in different conductive layers, and the first power supply wirings are connected to the second power supply wirings.

In an exemplary embodiment, the multiple conductive layers include a first source-drain metal layer, a second source-drain metal layer and a third source-drain metal layer arranged sequentially along a direction away from a base substrate, the first source-drain metal layer at least includes the first power supply wirings, and the third source-drain metal layer at least includes the second power supply wirings.

In an exemplary embodiment, the pixel drive circuit at least includes a storage capacitor and multiple transistors, the multiple conductive layers include a semiconductor layer, a first gate metal layer, a second gate metal layer, a first source-drain metal layer, a second source-drain metal layer, and a third source-drain metal layer arranged sequentially in a direction away from a base substrate, the semiconductor layer at least includes active layers of multiple transistors, the first gate metal layer at least includes gate electrodes of multiple transistors and a first electrode plate of the storage capacitor, the second gate metal layer at least includes a second electrode plate of the storage capacitor, the first source-drain metal layer at least includes the first connection line, the second source-drain metal layer at least includes the data signal line, and the third source-drain metal layer at least includes the second connection line.

In an exemplary embodiment, the first source-drain metal layer further includes a first power supply wiring extending along the first direction, and the third source-drain metal layer further includes a second power supply wiring extending along the second direction, and the first power supply wiring is connected to the second power supply wiring.

In an exemplary embodiment, the drive structure layer may also at least include a first insulating layer, a second insulating layer, a third insulating layer, a fourth insulating layer, a first planarization layer and a second planarization layer, the first insulating layer is disposed between the base substrate and the semiconductor layer, the second insulating layer is disposed between the semiconductor layer and the first gate metal layer, the third insulating layer is disposed between the first gate metal layer and the second gate metal layer, the fourth insulating layer is disposed between the second gate metal layer and the first source-drain metal layer, the first planarization layer is disposed between the first source-drain metal layer and the second source-drain metal layer, and the second planarization layer is disposed between the second source-drain metal layer and the third source-drain metal layer.

Figure 10A:
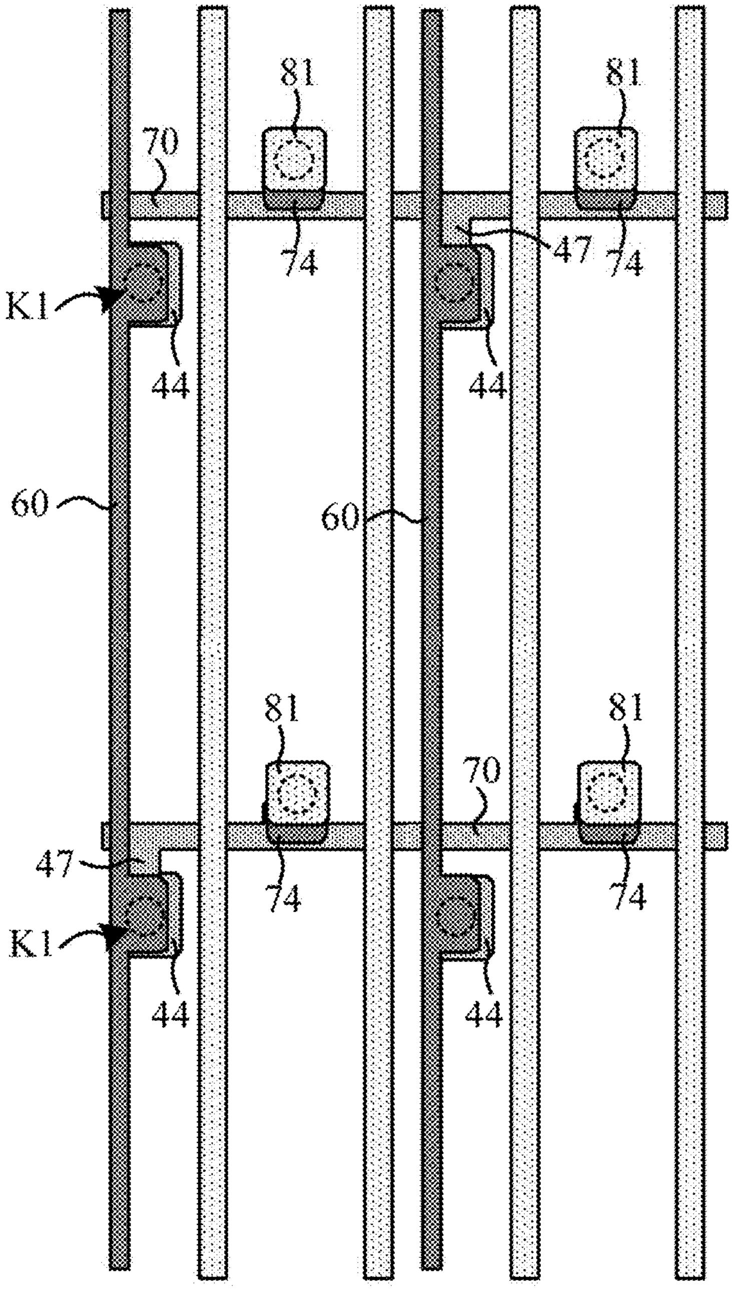
FIGS. 10A to 10C are schematic diagrams of a structure of a circuit unit according to an exemplary embodiment of the present disclosure.
Figure 10B:
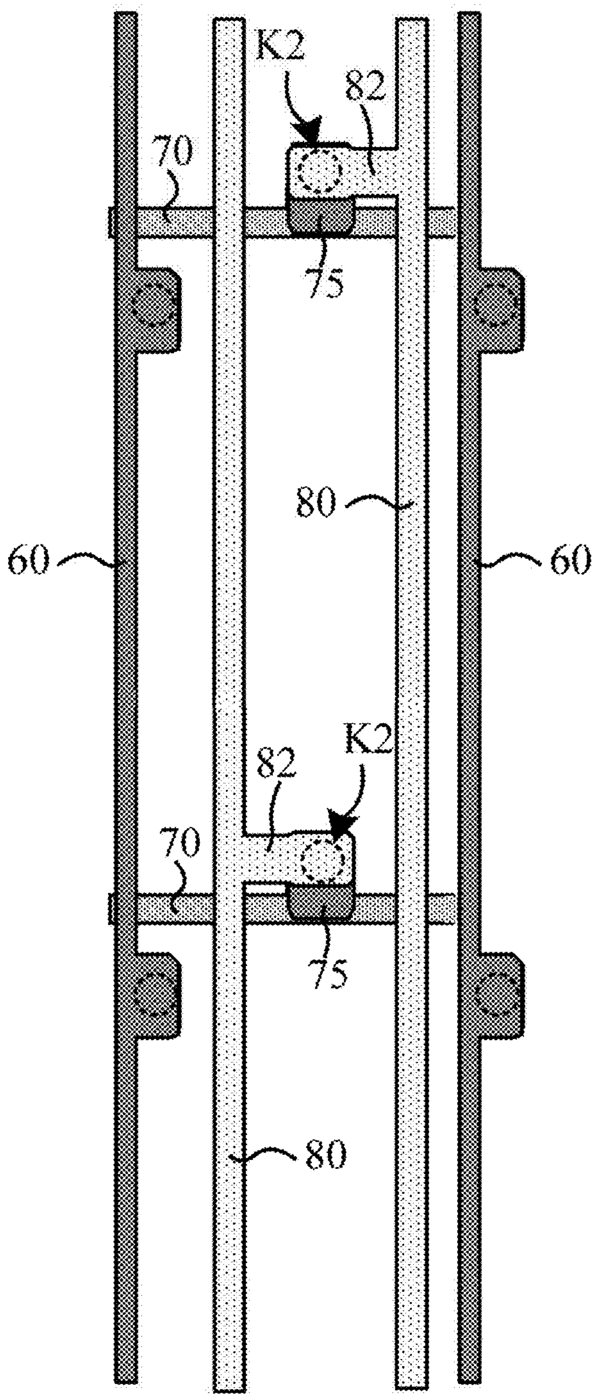
Figure 10C:
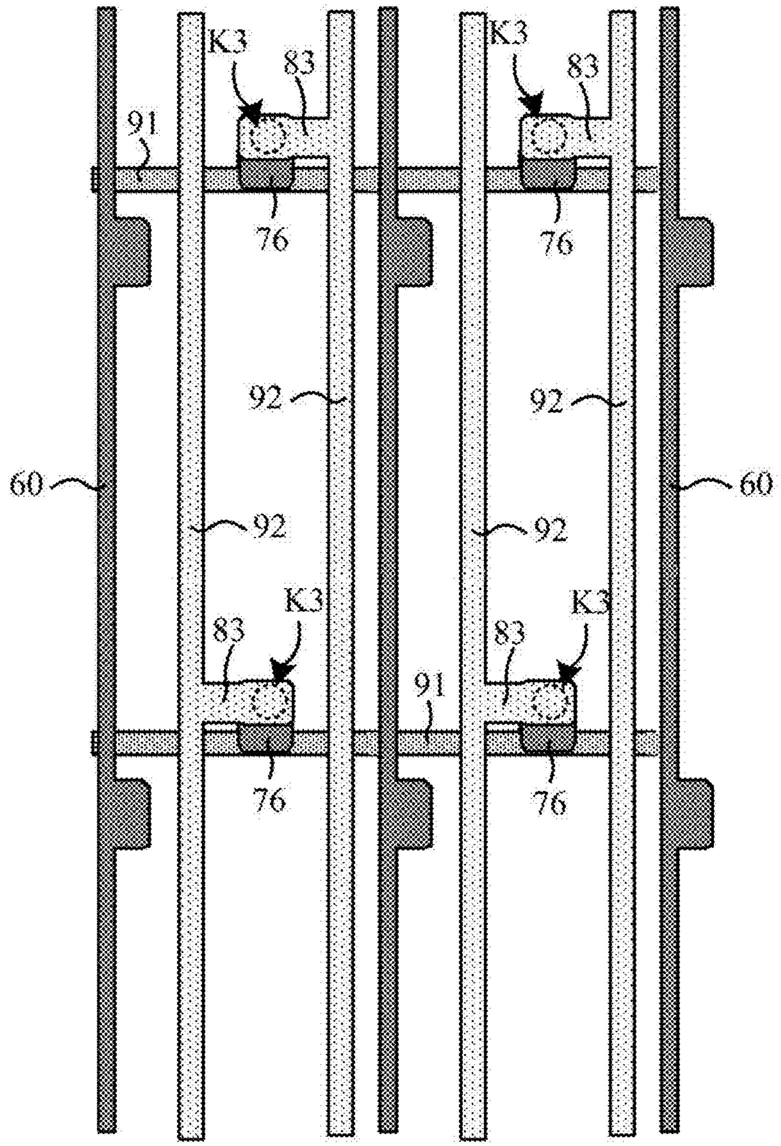

FIGS. 10A to 10C are schematic diagrams of a structure of a circuit unit according to an exemplary embodiment of the present disclosure. FIG. 10A is an enlarged view of an E1 region in FIG. 8, FIG. 10B is an enlarged view of an E2 region in FIG. 8, and FIG. 10C is an enlarged view of an E3 region in FIG. 8. As shown in FIGS. 10A, 10B, and 10C, the display substrate may include a display region that may include a drive structure layer disposed on the base substrate and a light emitting structure layer disposed on a side of the drive structure layer away from the base substrate. On a plane parallel to the display substrate, the drive structure layer may at least include: multiple circuit units forming multiple unit rows and multiple unit columns, multiple data signal lines 60, multiple first connection lines 70, multiple second connection lines 80, multiple first power supply wirings 91, and multiple second power supply wirings 92, the circuit units may include pixel drive circuits, the data signal lines 60 are configured to supply data signals to the pixel drive circuits. On a plane perpendicular to the display substrate, the drive structure layer may include a first source-drain metal layer, a second source-drain metal layer, and a third source-drain metal layer arranged sequentially on the base substrate. The first source-drain metal layer may at least include a first connection line 70 and a first power supply wiring 91, the second source-drain metal layer may at least include a data signal line 60, and the third source-drain metal layer may at least include a second connection line 80 and a second power supply wiring 92, i.e. the data signal line 60, the first connection line 70 and the second connection line 80 are disposed in different conductive layers, and the first power supply wiring 91 and the second power supply wiring 92 are disposed in different conductive layers.

In an exemplary embodiment, the shapes of the first connection line 70 and the first power supply wiring 91 may be line shapes extending along the first direction X, and the shapes of the data signal line 60, the second connection line 80 and the second power supply wiring 92 may be line shapes extending along the second direction Y, where the first direction X and the second direction Y intersect.

In an exemplary embodiment, the second connection line 80 extending along the second direction Y is connected to the first connection line 70 extending along the first direction X, the first connection line 70 extending along the first direction X is connected to the data signal line 60 extending along the second direction Y, and the second power supply wiring 92 extending along the second direction Y is connected to the first power supply wiring 91 extending along the first direction X.

In an exemplary embodiment, a second connection line 80 at the third source-drain metal layer is connected to a first connection line 70 at the first source-drain metal layer. A first connection line 70 at the first source-drain metal layer is connected to a data signal line 60 at the second source-drain metal layer. A second connection line 80 at the third source-drain metal layer is connected to a first power supply wiring 91 at the first source-drain metal layer.

In an exemplary embodiment, the pixel drive circuit may include a storage capacitor and multiple transistors which may at least include a data write transistor, and a first electrode of the data write transistor is connected to the data signal line 60.

As shown in FIG. 10A, in an exemplary embodiment, the first source-drain metal layer may further include a fourth connection electrode 44, which may serve as a first electrode of the data write transistor. In at least one circuit unit of the first region, the first connection line 70 may be connected to the fourth connection electrode 44, and the data signal line 60 may be connected to the fourth connection electrode 44 through the first connection hole K1, thereby achieving the connection between the data signal line 60 and the first connection line 70.

In an exemplary embodiment, the first source-drain metal layer may further include a data connection block 47. In at least one circuit unit of the first region, a first terminal of the data connection block 47 is connected to the first connection line 70, and a second terminal of the data connection block 47 is connected to the fourth connection electrode 44, thereby achieving that the first connection line 70 is connected to the fourth connection electrode 44 through the data connection block 47.

In an exemplary embodiment, the second source-drain metal layer may further include an interlayer dummy connection block 74 and the third source-drain metal layer may further include a dummy electrode 81. In at least one circuit unit of the first region, an orthographic projection of the dummy electrode 81 on the base substrate at least partially overlaps with an orthographic projection of the interlayer dummy connection block 74 on the base substrate, the interlayer dummy connection block 74 is connected to the first connection line 70 through the via hole, and the dummy electrode 81 is connected to the interlayer dummy connection block 74 through the via hole.

As shown in FIG. 10B, in an exemplary embodiment, the second source-drain metal layer may further include an interlayer data connection block 75. In at least one circuit unit in the second region, the interlayer data connection block 75 is connected to the first connection line 70 through a via hole, and the second connection line 80 is connected to the interlayer data connection block 75 through a second connection hole K2, thereby achieving the connection between the second connection line 80 and the first connection line 70.

In an exemplary embodiment, the third source-drain metal layer may further include a data connection electrode 82. In at least one circuit unit of the second region, the data connection electrode 82 is directly connected to the second connection line 80, an orthographic projection of the data connection electrode 82 on the base substrate at least partially overlaps with an orthographic projection of the interlayer data connection block 75 on the base substrate, and the data connection electrode 82 is connected to the interlayer data connection block 75 through the second connection hole K2.

As shown in FIG. 10C, in an exemplary embodiment, the second source-drain metal layer may further include an interlayer electrode connection block 76. In at least one circuit unit in the third region, the interlayer electrode connection block 76 is connected to the first power supply wiring 91 through a via hole, and the second power supply wiring 92 is connected to the interlayer electrode connection block 76 through a third connection hole K3, thereby achieving the connection between the first power supply wiring 91 and the second power supply wiring 92.

In an exemplary embodiment, the third source-drain metal layer may further include a power supply connection electrode 83. In at least one circuit unit in the second region, the power supply connection electrode 83 is directly connected to the second power supply wiring 92. An orthographic projection of the power supply connection electrode 83 on the base substrate at least partially overlaps an orthographic projection of the interlayer electrode connection block 76 on the base substrate, and the power supply connection electrode 83 is connected to the interlayer electrode connection block 76 through the third connection hole K3.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process at least includes one "pattern". "A and B being disposed on a same layer" mentioned in the present disclosure means that A and B are formed simultaneously through a same patterning process, and a "thickness" of a thin film layer is a dimension of the thin film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of an orthographic projection of B falls within a range of a boundary of an orthographic projection of A, or the boundary of an orthographic projection of A is overlapped with the boundary of an orthographic projection of B.

In an exemplary implementation mode, the preparation process of the display substrate may include following operations.

Figure 11:
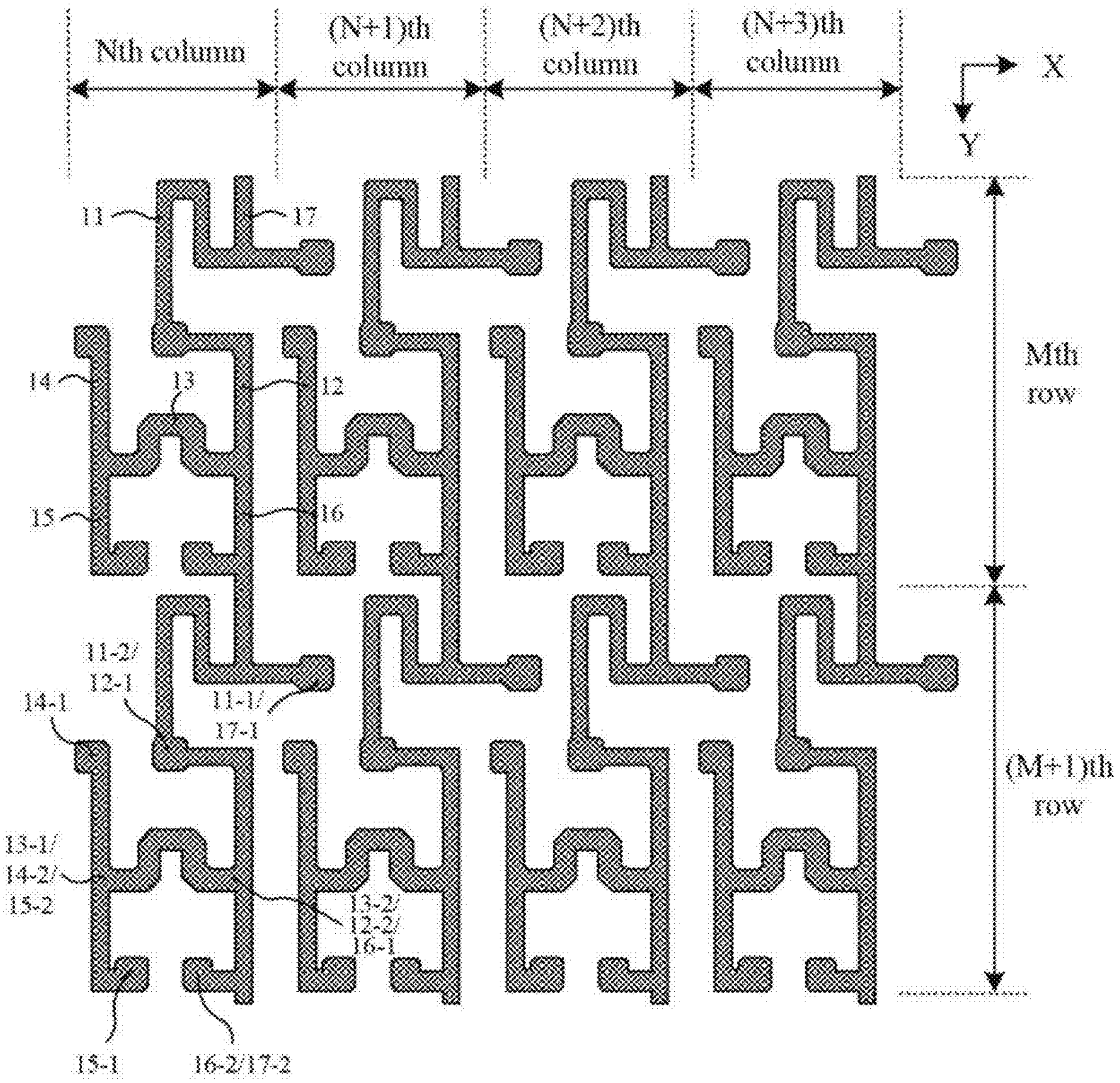
FIG. 11 is a schematic diagram of a display substrate of the present disclosure after a pattern of a semiconductor layer is formed.

(1) A pattern of a semiconductor layer is formed. In an exemplary embodiment, forming a pattern of a semiconductor layer may include: sequentially depositing a first insulating thin film and a semiconductor thin film on a base substrate, and patterning the semiconductor thin film through a patterning process to form a first insulating layer covering the base substrate and a semiconductor layer disposed on the first insulating layer, as shown in FIG. 11, and FIG. 11 is an enlarged view of a region E1 in FIG. 8.

In an exemplary embodiment, the semiconductor layer of the each circuit unit in the display region may at least include a first active layer 11 of the first transistor T1 to a seventh active layer 17 of the seventh transistor T7, and the first active layer 11 to the seventh active layer 17 are of an integral structure connected with one another. In the second direction Y, the sixth active layer 16 of the circuit units in row M and the seventh active layer 17 of the circuit units in row M+1 are connected to each other, i.e. the semiconductor layers of two adjacent circuit units in a unit column are connected to each other in an integrated structure.

In an exemplary embodiment, in the first direction X, the second active layer 12 and the sixth active layer 16 may be located at the same side of the third active layer 13 in the present circuit unit, the fourth active layer 14 and the fifth active layer 15 may be located at the same side of the third active layer 13 in the present circuit unit, and the second active layer 12 and the fourth active layer 14 may be located at different sides of the third active layer 13 of the present circuit unit. In the second direction Y, the first active layer 11, the second active layer 12, the fourth active layer 14, and the seventh active layer 17 in the Mth row of circuit unit may be located on a side of the third active layer 13 in the present circuit unit away from the (M+1)th row circuit cell. The first active layer 11 and the seventh active layer 17 may be located on a side of the second active layer 12 and the fourth active layer 14 in the present circuit unit away from the third active layer 13. The fifth active layer 15 and the sixth active layer 16 in the Mth row of circuit unit may be located on the side of the third active layer 13 in the present circuit unit close to the (M+1)th row of circuit unit.

In an exemplary implementation, the first active layer 11 may be in an "n" shape, the second active layer 12, the fifth active layer 15, and the sixth active layer 16 may be in a "L" shape, the third active layer 13 may be in an "2" shape, the fourth active layer 14 and the seventh active layer 17 may be in an "I" shape.

In an exemplary implementation, an active layer of each transistor may include a first region, a second region, and a channel region located between the first region and the second region. In an exemplary implementation, a first region 11-1 of the first active layer 11 may serve as a first region 17-1 of the seventh active layer 17; a second region 11-2 of the first active layer 11 may serve as a first region 12-1 of the second active layer 12; a first region 13-1 of the third active layer 13 may serve as a second region 14-2 of the fourth active layer 14 and a second region 15-2 of the fifth active layer 15 simultaneously; a second region 13-2 of the third active layer 13 may serve as a second region 12-2 of the second active layer 12 and a first region 16-1 of the sixth active layer 16 simultaneously; a second region 16-2 of the sixth active layer 16 may serve as a second region 17-2 of the seventh active layer 17; a first region 14-1 of the fourth active layer 14 and a first region 15-1 of the fifth active layer 15 may be separately provided.

In an exemplary embodiment, the patterns of the semiconductor of the E2 region and the E3 region in FIG. 8 may be substantially the same as the pattern of the semiconductor of the E1 region.

Figure 12A:
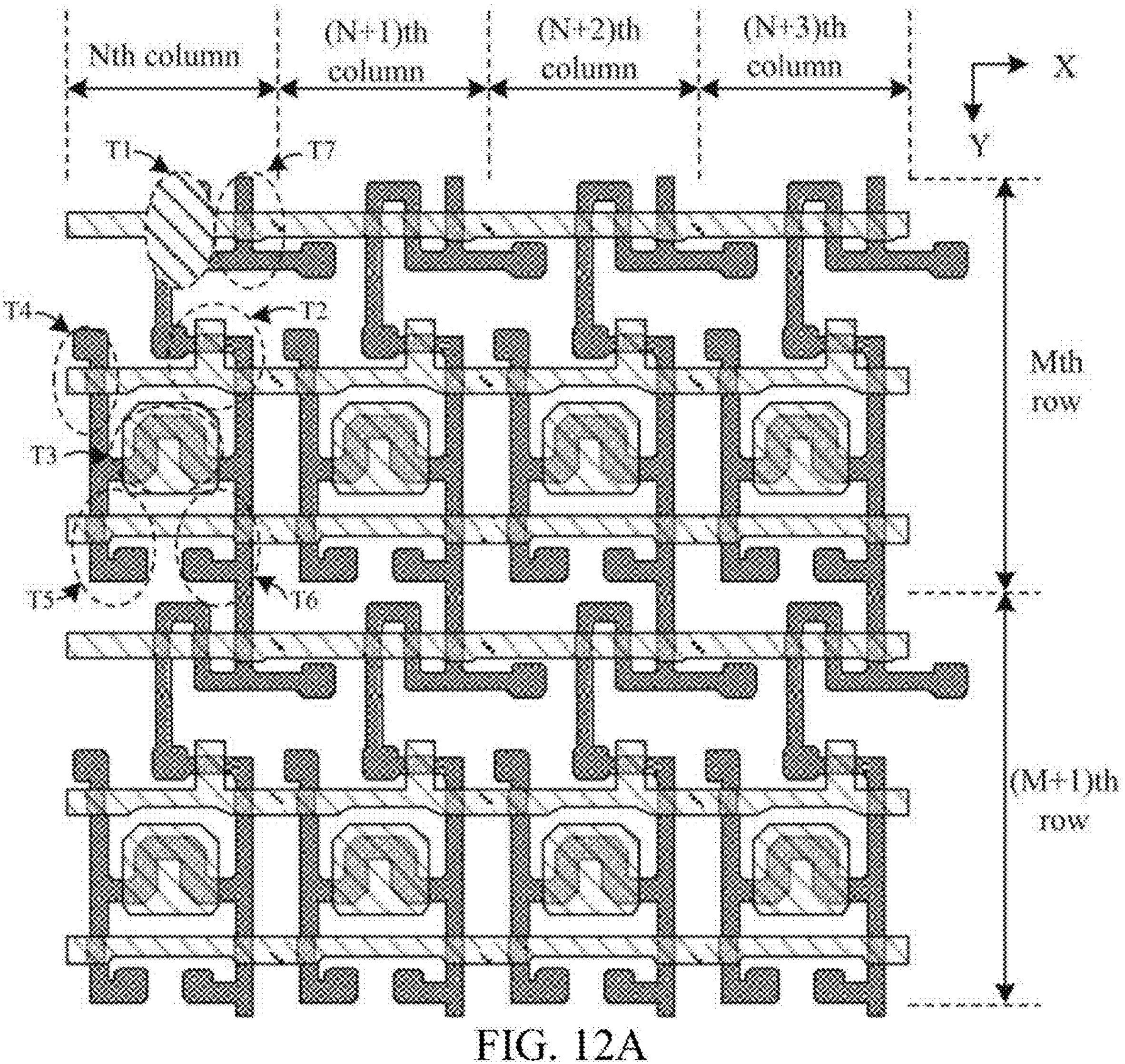
FIGS. 12A and 12B are schematic diagrams of a display substrate after a pattern of a first conductive layer is formed according to the present disclosure.
Figure 12B:
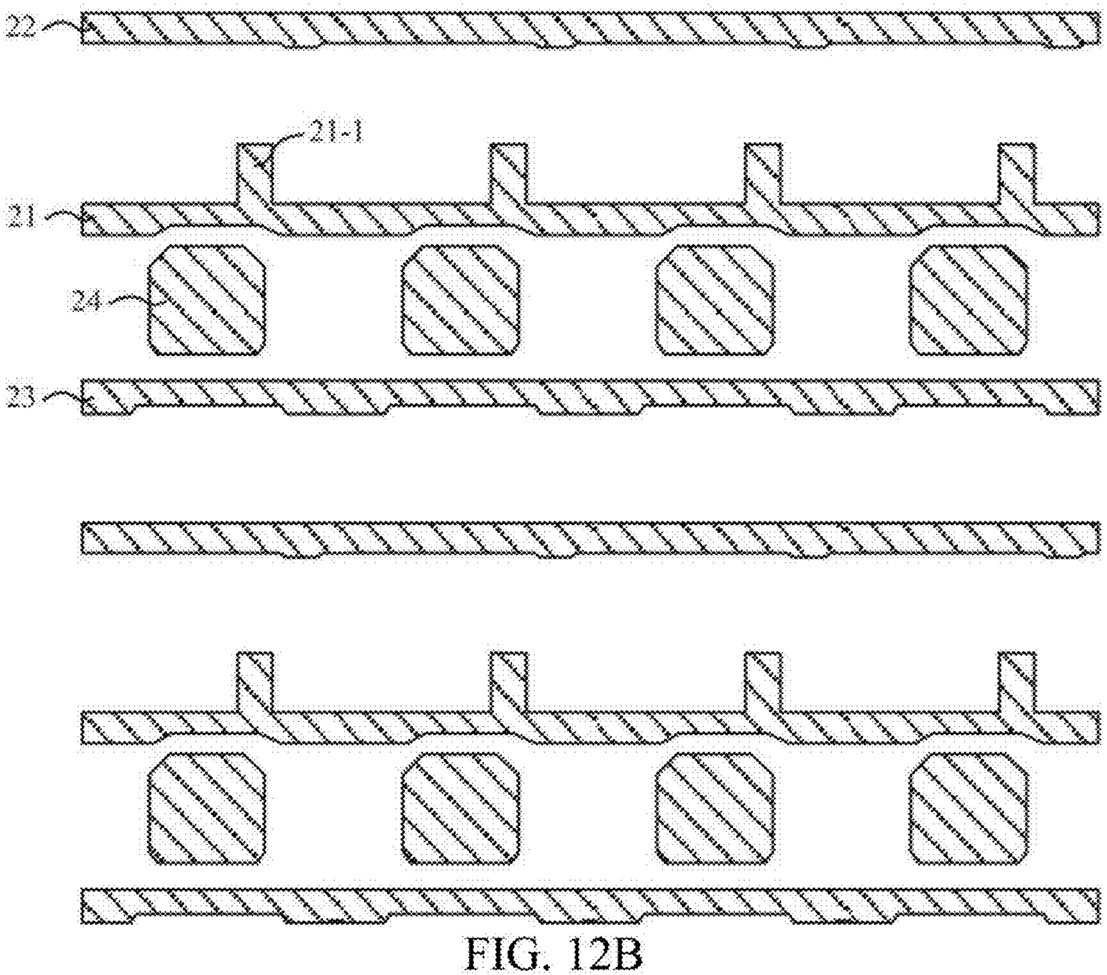

(2) A pattern of a first conductive layer is formed. In an exemplary embodiment, forming a pattern of a first conductive layer may include: sequentially depositing a second insulating thin film and a first conductive thin film on the base substrate on which the above-mentioned pattern is formed, and patterning the first conductive thin film through a patterning process to form a second insulating layer that covers a pattern of the semiconductor layer and form a pattern of the first conductive layer disposed on the second insulating layer, as shown in FIG. 12A and FIG. 12B, wherein FIG. 12A is an enlarged view of a region E1 in FIG. 8, and FIG. 12B is a schematic planar view of the first conductive layer in FIG. 12A. In an exemplary implementation, the first conductive layer may be referred to as a first gate metal (GATE1) layer.

In an exemplary embodiment, the patterns of the first conductive layer of the each circuit unit in the display region may at least include a first scan signal line 21, a second scan signal line 22, a light emitting control line 23, and a first electrode plate 24 of the storage capacitor.

In an exemplary embodiment, the first electrode plate 24 of the storage capacitor may be in a shape of a rectangle, and corners of the rectangle may be provided with chamfers. There is an overlapping region between an orthographic projection of the first electrode plate 24 on the base substrate and an orthographic projection of the third active layer of the third transistor T3 on the base substrate. In an exemplary implementation, the first electrode plate 24 may serve as a plate of the storage capacitor and a gate electrode of the third transistor T3 simultaneously.

In an exemplary embodiment, the shape of the first scan signal line 21 may be a line shape in which the main body part extends along the first direction X, the first scan signal line 21 in the Mth row of sub-pixels may be located on the side of the first electrode plate 24 of the sub-pixel away from the M+1 row of circuit units. The first scan signal line 21 of each circuit unit is provided with a gate block 21-1, a first terminal of the gate block 21-1 is connected with the first scan signal line 21, and a second terminal of the gate block 21-1 extends towards a direction away from the first electrode plate 24. A region where the first scan signal line 21 and the gate block 21-1 are overlapped with the second active layer of the present circuit unit serves as a gate electrode of the second transistor T2 of a double-gate structure, and a region where the first scan signal line 21 is overlapped with the fourth active layer of the present circuit unit serves as a gate electrode of the fourth transistor T4.

In an exemplary embodiment, the second scan signal line 22 may be of a line shape of which the main body part extends along the first direction X, the second scan signal line 22 of the Mth row of circuit unit may be located at a side of the first scan signal line 21 of the present circuit unit away from the first electrode plate 24, a region where the second scan signal line 22 is overlapped with the first active layer of the present circuit unit serves as a gate electrode of the first transistor T1 of a double-gate structure, and a region where the second scan signal line 22 is overlapped with the seventh active layer of the present circuit unit serves as a gate electrode of the seventh transistor T7.

In an exemplary embodiment, the light emitting control line 23 may be of a line shape of which the main body part extends along the first direction X, the light emitting control line 23 may be located at a side of the first electrode plate 24 of the present circuit unit close to the (M+1)th row of circuit unit, a region where the light emitting control line 23 is overlapped with the fifth active layer of the present circuit unit serves as a gate electrode of the fifth transistor T5, and a region where the light emitting control line 23 is overlapped with the sixth active layer of the present circuit unit serves as a gate electrode of the sixth transistor T6.

In an exemplary implementation, the first scan signal line 21, the second scan signal line 22, and the light emitting control line 23 may be in an equal width design, or may be in a non-equal width design, may be straight lines, or may be polygonal lines, which may not only facilitate the layout of the pixel structure, but also reduce the parasitic capacitance between the signal lines, and this is not limited in the present disclosure.

In an exemplary implementation, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first transistor T1 to the seventh active layer are all made to be conductive.

In an exemplary embodiment, the patterns of the first conductive layer of the E2 region and the E3 region in FIG. 8 may be substantially the same as the pattern of the first conductive layer of the E1 region.

In an exemplary embodiment, after the pattern of the first conductive layer is formed, the semiconductor layer may be subjected to a conductive treatment by using the first conductive layer as a shield. The semiconductor layer with a region shielded by the first conductive layer forms channel regions of the first transistor T1 to the seventh transistor T7, and the semiconductor layer with a region not shielded by the first conductive layer is made to be conductive, that is, first regions and second regions of the first active layer to the seventh active layer are made to be conductive.

Figure 13A:
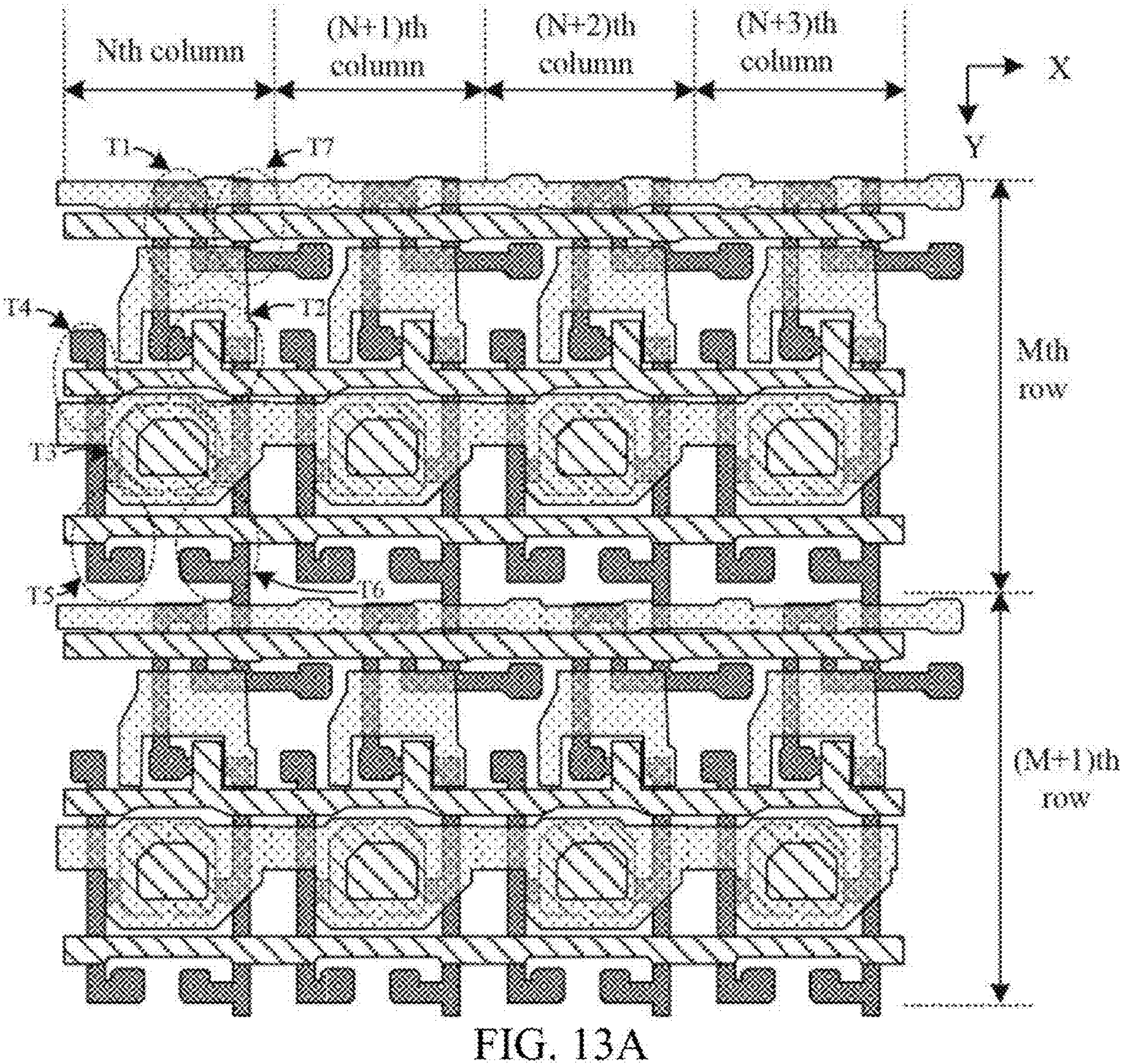
FIGS. 13A and 13B are schematic diagrams of a display substrate after a pattern of a second conductive layer is formed according to the present disclosure.
Figure 13B:
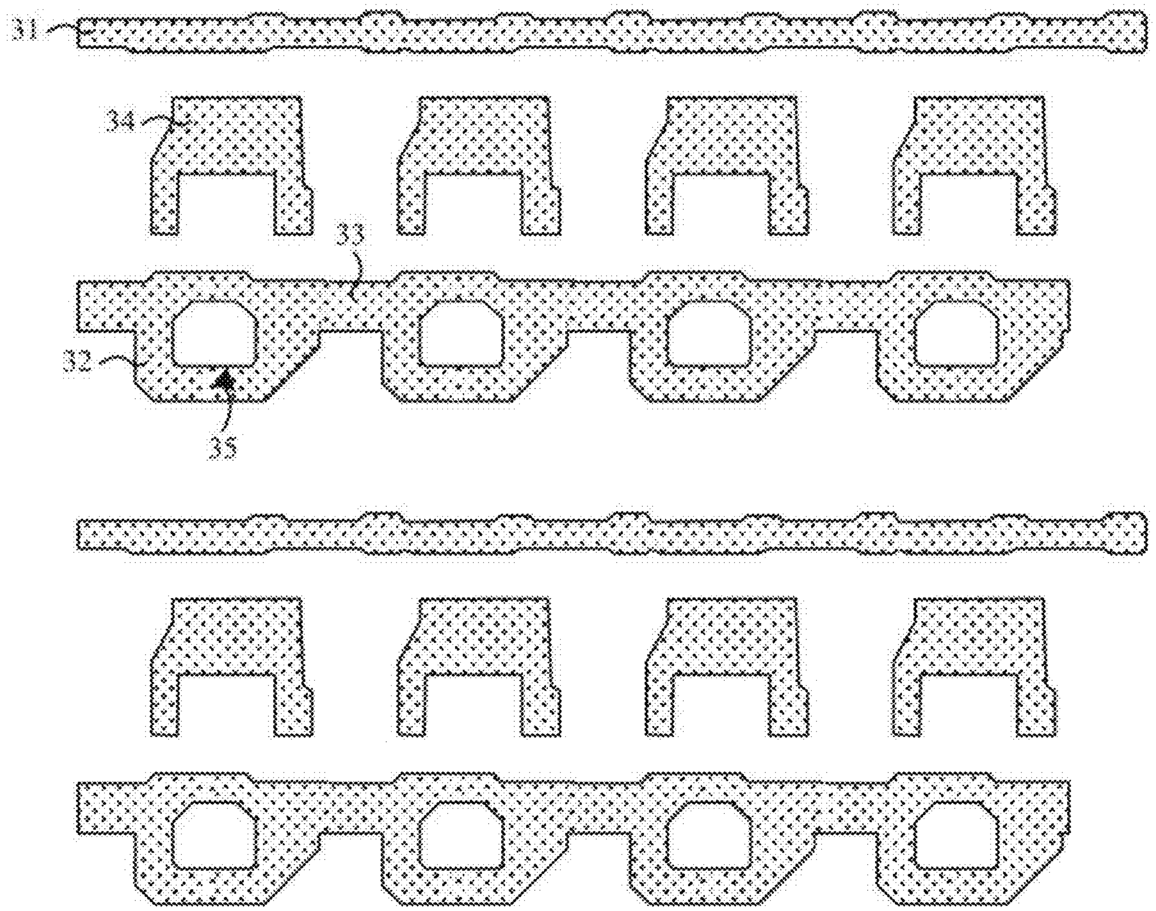

(3) A pattern of a second conductive layer is formed. In an exemplary embodiment, forming the pattern of the second conductive layer may include: On the base substrate on which the aforementioned pattern is formed, sequentially depositing a third insulating thin film and a second conductive thin film, and patterning the second conductive thin film through a patterning process to form a third insulating layer covering the first conductive layer, and a pattern of the second conductive layer disposed on the third insulating layer, as shown in FIG. 13A and FIG. 13B, wherein FIG. 13A is an enlarged view of a region E1 in FIG. 8, and FIG. 13B is a schematic planar view of the second conductive layer in FIG. 13A. In an exemplary implementation, the second conductive layer may be referred to as a second gate metal (GATE2) layer.

In an exemplary embodiment, the pattern of second conductive layer of each circuit unit in the display region at least includes an initial signal line 31, a second electrode plate 32 of a storage capacitor, an electrode connection line 33, and a shield electrode 34.

In an exemplary embodiment, a profile of second electrode plate 32 may be in the shape of a rectangle, corners of which in shape of the rectangle may be provided with a chamfer. There is an overlapped region between an orthographic projection of the second electrode plate 32 on the base substrate and an orthographic projection of the first electrode plate 24 on the base substrate, the second electrode plate 32 can be used as another electrode plate of the storage capacitor, and the first electrode plate 24 and the second electrode plate 32 form the storage capacitor of the pixel drive circuit.

In an exemplary embodiment, the second electrode plates 32 of two adjacent circuit units in one unit row are connected with each other by an electrode plate connection line 33. For example, the second electrode plate 32 of the Nth column and the second electrode plate 32 of the (N+1)th column may be connected to each other by the electrode plate connection line 33. As another example, the second electrode plate 32 of the (N+1)th row and the second electrode plate 32 of the (N+2)th row are connected with each other by the electrode plate connection line 33. In some exemplary embodiments, since the second electrode plate 32 in each circuit unit is connected with a first power supply line formed subsequently, by forming an integral structure connected with each with second electrode plates 32 of adjacent circuit unit, the second electrode plates in the integral structure may be reused as power supply signal lines, it may be ensured that multiple second electrode plates in one unit row have a same potential, which is beneficial to improving uniformity of the panel and avoiding a poor display of the display substrate, thereby ensuring a display effect of the display substrate.

In an exemplary embodiment, the second electrode plate 32 is provided with an opening 35 which may be rectangular and may be located in the middle of the second electrode plate 32, so that the second electrode plate 32 forms an annular structure. The opening 35 exposes the third insulating layer covering the first electrode plate 24, and an orthographic projection of the first electrode plate 24 on the base substrate contains an orthographic projection of the opening 35 on the base substrate. In an exemplary embodiment, the opening 35 is configured to accommodate a first via hole formed subsequently, which is located in the opening 35 and exposes the first electrode plate 24, so that a second electrode of the first transistor T1 formed subsequently is connected with the first electrode plate 24.

In an exemplary embodiment, the shape of the initial signal line 31 may be a line shape in which the main body portion may extend in the first direction X. An initial signal line 31 may be located on a side of the second scan signal line 22 of the circuit unit away from the first scan signal line 21, and the initial signal line 31 is configured to be connected to a first region of the first active layer (also a first region of the seventh active layer) through a first electrode of the first transistor T1 (also a first electrode of the seventh transistor T7) which is subsequently formed.

In an exemplary embodiment, the shield electrode 34 may be located between the first scan signal line 21 and the second scan signal line 22 of the circuit unit. The shape of the shield electrode 34 may be an "n" shape, an orthographic projection of the shield electrode 34 on the base substrate at least partially overlaps with the orthographic projection of the second active layer between the double gates in the second transistor T2 on the base substrate. The shield electrode 34 is configured to effectively shield an influence of a data voltage jump on a key node in the pixel drive circuit, prevent the data voltage jump from affecting a potential of the key node of the pixel drive circuit, and improve the display effect.

In an exemplary embodiment, the patterns of the second conductive layer of the E2 region and the E3 region in FIG. 8 may be substantially the same as the pattern of the second conductive layer of the E1 region.

Figure 14:
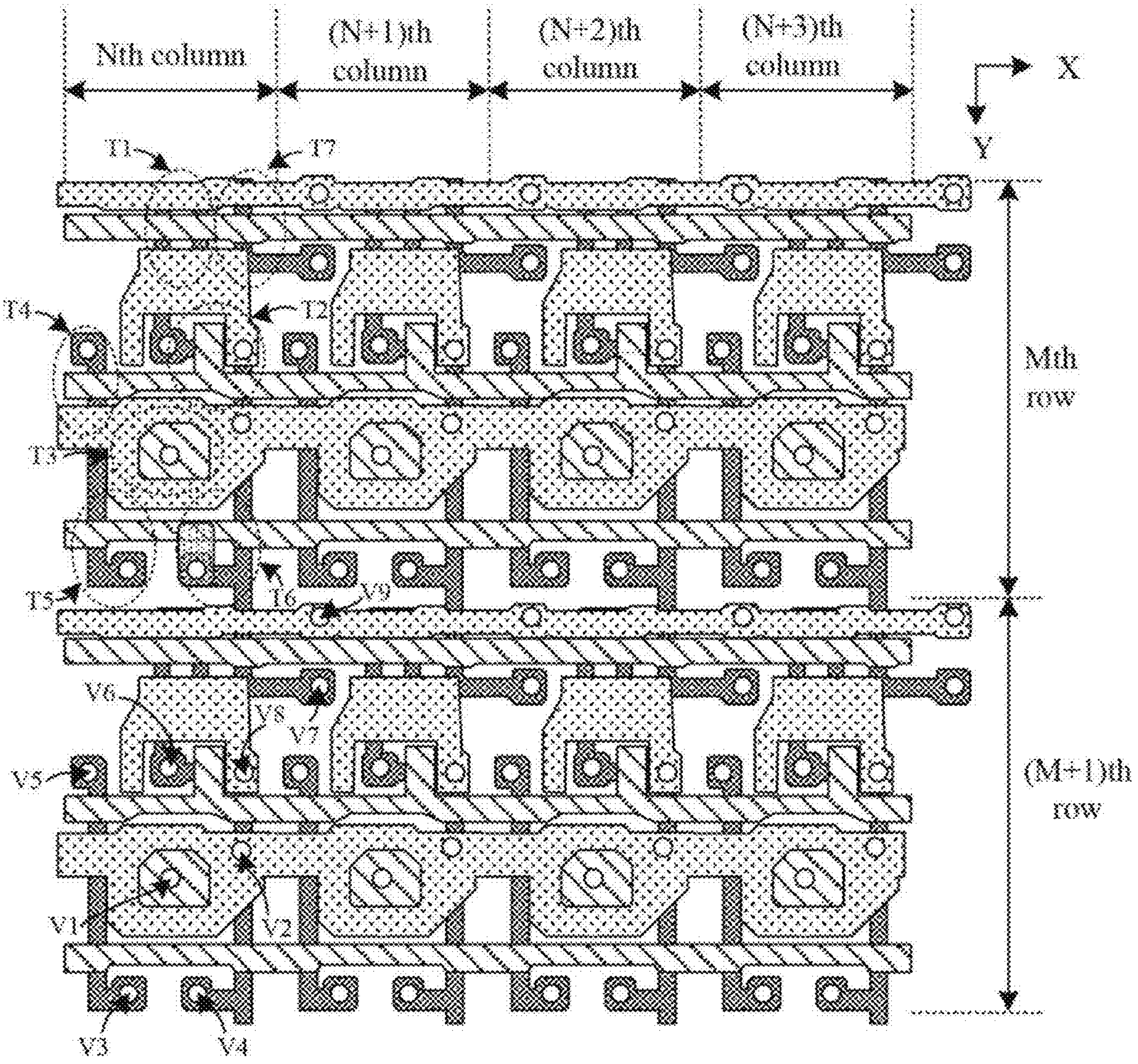
FIG. 14 is a schematic diagram of a display substrate after a pattern of a fourth insulating layer is formed according to the present disclosure.

(4) A pattern of a fourth insulating layer is formed. In an exemplary implementation, forming a pattern of a fourth insulating layer may include: depositing a fourth insulating thin film on the base substrate on which the aforementioned patterns are formed, and patterning the fourth insulating thin film by a patterning process, to form a fourth insulating layer covering the second conductive layer, wherein multiple via holes are provided on each of the circuit unit, as shown in FIG. 14, and FIG. 14 is an enlarged view of a region E1 in FIG. 8.

In an exemplary embodiment mode, the multiple via holes of each circuit unit in the display region at least include a first via hole V1, a second via hole V2, a third via hole V3, a fourth via hole V4, a fifth via hole V5, a sixth via hole V6, a seventh via hole V7, an eighth via hole V8 and a ninth via hole V9.

In an exemplary embodiment, an orthographic projection of the first via hole V1 on the base substrate is within a range of an orthographic projection of the opening 35 of the second electrode plate on the base substrate, the fourth insulating layer and the third insulating layer in the first via hole V1 are etched away to expose a surface of the first electrode plate 24, and the first via hole V1 is configured such that the second electrode of the first transistor T1 formed subsequently (also the first electrode of the second transistor T2) is connected with the first electrode plate 24 through the via hole V1.

In an exemplary embodiment, an orthographic projection of the second via hole V2 on the base substrate is within a range of an orthographic projection of the second electrode plate 32 on the base substrate, the fourth insulating layer in the second via hole V2 is etched away to expose a surface of the second electrode plate 32, and the second via hole V2 is configured such that the second connection electrode formed subsequently is connected with the second electrode plate 32 through the via hole V2. In an exemplary implementation, there may be multiple second via holes V2, and the multiple second via holes V2 may be disposed in sequence along the second direction Y to improve connection reliability.

In an exemplary embodiment, an orthographic projection of the third via hole V3 on the base substrate is within a range of an orthographic projection of the first region of the fifth active layer on the base substrate. The fourth insulating layer, the third insulating layer and the second insulating layer in the third via hole V3 are etched away to expose a surface of the first region of the fifth active layer, and the third via hole V3 is configured such that a first electrode of the fifth transistor T5 formed subsequently is connected with the first region of the fifth active layer through the via hole V3.

In an exemplary embodiment, an orthographic projection of the fourth via hole V4 on the base substrate is within a range of an orthographic projection of the second region of the sixth active layer (also the second region of the seventh active layer) on the base substrate. The fourth insulating layer, the third insulating layer and the second insulating layer in the fourth via hole V4 are etched away to expose a surface of the second region of the sixth active layer, the fourth via hole V4 is configured such that the second electrode of the sixth transistor T6 (also the second electrode of the seventh transistor T7) formed subsequently is connected with the second region of the sixth active layer (also the second region of the seventh active layer) through the via hole V4.

In an exemplary embodiment, an orthographic projection of the fifth via hole V5 on the base substrate is within a range of an orthographic projection of the first region of the fourth active layer on the base substrate. The fourth insulating layer, the third insulating layer and the second insulating layer in the fifth via hole V5 are etched away to expose a surface of the first region of the fourth active layer, and the fifth via hole V5 is configured such that a first electrode of the forth transistor T4 formed subsequently is connected with the first region of the fourth active layer through the via hole V5.

In an exemplary embodiment, an orthographic projection of the sixth via hole V6 on the base substrate is within a range of an orthographic projection of the second region of the first active layer (also the first region of the second active layer) on the base substrate. The fourth insulating layer, the third insulating layer and the second insulating layer in the sixth via hole V6 are etched away to expose a surface of the second region of the first active layer, the sixth via hole V6 is configured such that the second electrode of the first transistor T1 (also the first electrode of the second transistor T2) formed subsequently is connected with the second region of the first active layer (also the first region of the second active layer) through the via hole V6.

In an exemplary embodiment, an orthographic projection of the seventh via hole V7 on the base substrate is within a range of an orthographic projection of the first region of the first active layer (also the first region of the seventh active layer) on the base substrate. The fourth insulating layer, the third insulating layer and the second insulating layer in the seventh via hole V7 are etched away to expose a surface of the first region of the first active layer, the seventh via hole V7 is configured such that the first electrode of the first transistor T1 (also the first electrode of the seventh transistor T7) formed subsequently is connected with the first region of the first active layer (also the first region of the seventh active layer) through the via hole V7.

In an exemplary embodiment, an orthographic projection of the eighth via hole V8 on the base substrate is within the range of an orthographic projection of the shield electrode 34 on the base substrate, the fourth insulating layer in the eighth via hole V8 is etched away, exposing the surface of the shield electrode 34, and the eighth via hole V8 is configured connect the subsequently formed second connection electrode to the shield electrode 34 through the via hole V8.

In an exemplary embodiment, an orthographic projection of the ninth via hole V9 on the base substrate is within a range of an orthographic projection of the opening 31 on the base substrate, the fourth insulating layer and the third insulating layer in the ninth via hole V9 are etched away to expose a surface of the initial signal line 31, and the ninth via hole V9 is configured such that the first electrode of the first transistor T1 formed subsequently (also the first electrode of the second transistor T7) is connected with the initial signal line 31 through the via hole V9.

In an exemplary embodiment, the multiple via hole patterns of the E2 region and the E3 region in FIG. 8 may be substantially the same as the multiple via hole patterns of the E1 region.

Figure 15A:
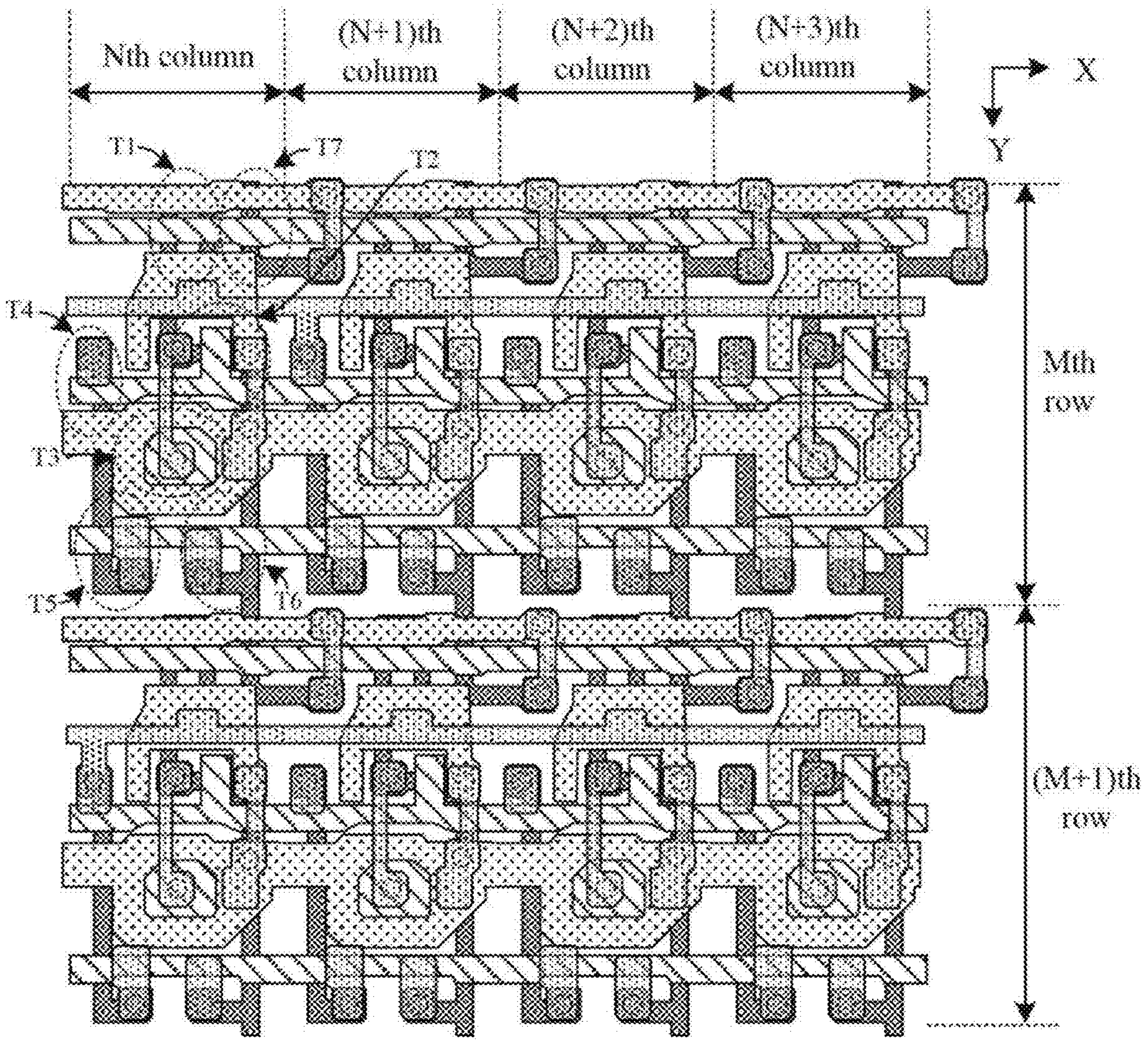
FIGS. 15A to 15F are schematic diagrams of a display substrate after a pattern of a third conductive layer is formed according to the present disclosure.
Figure 15B:
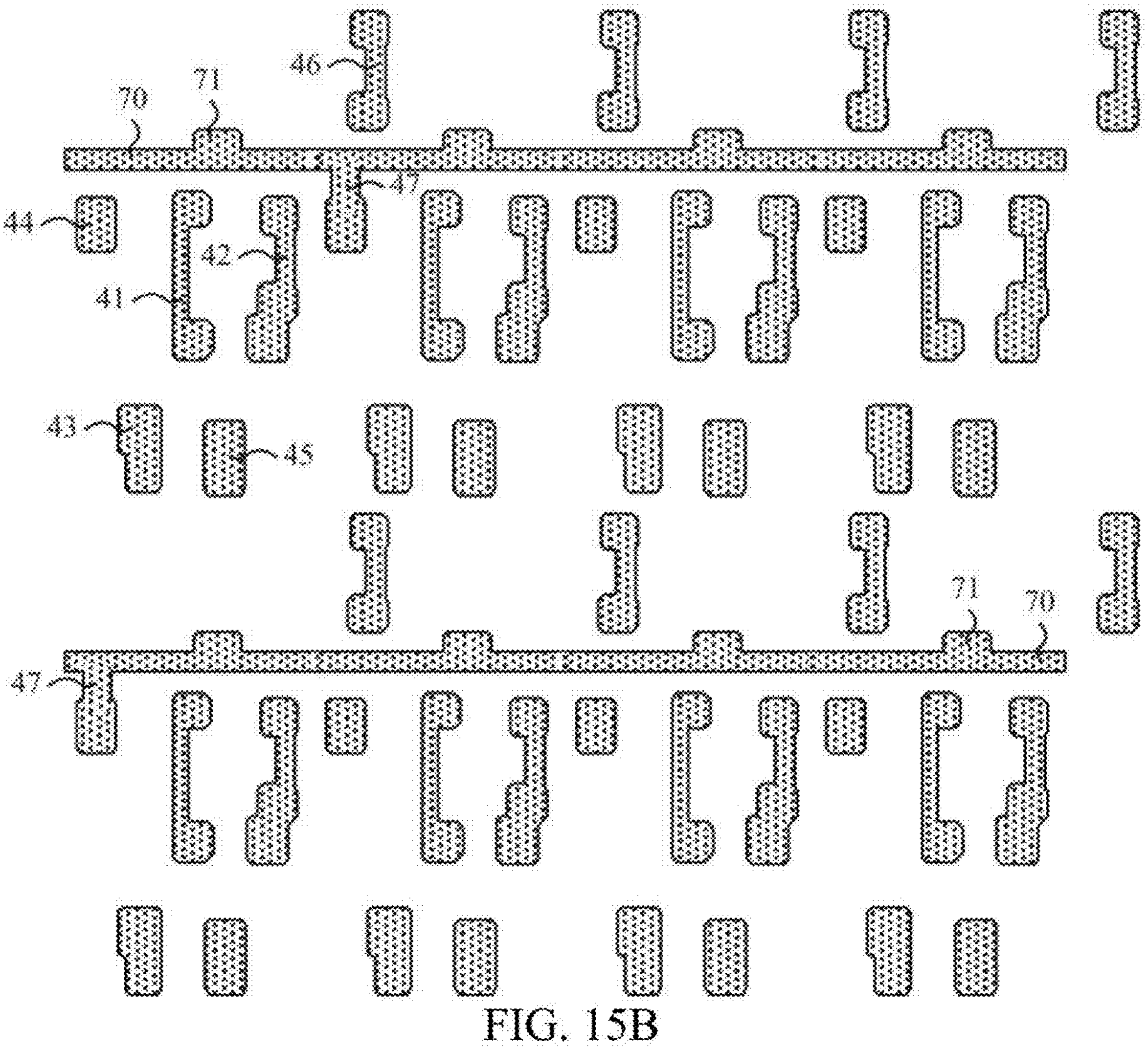
Figure 15C:
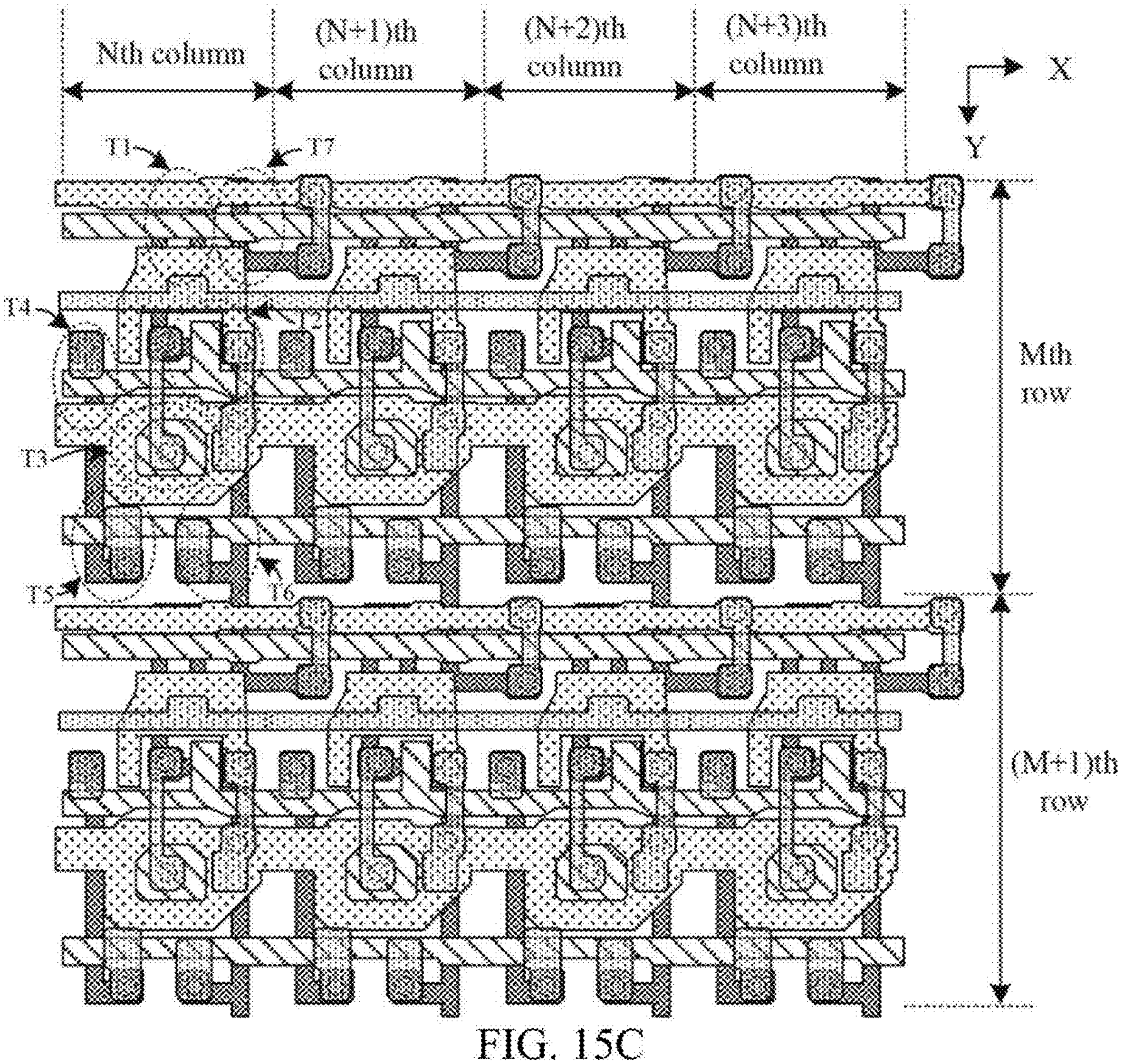
Figure 15D:
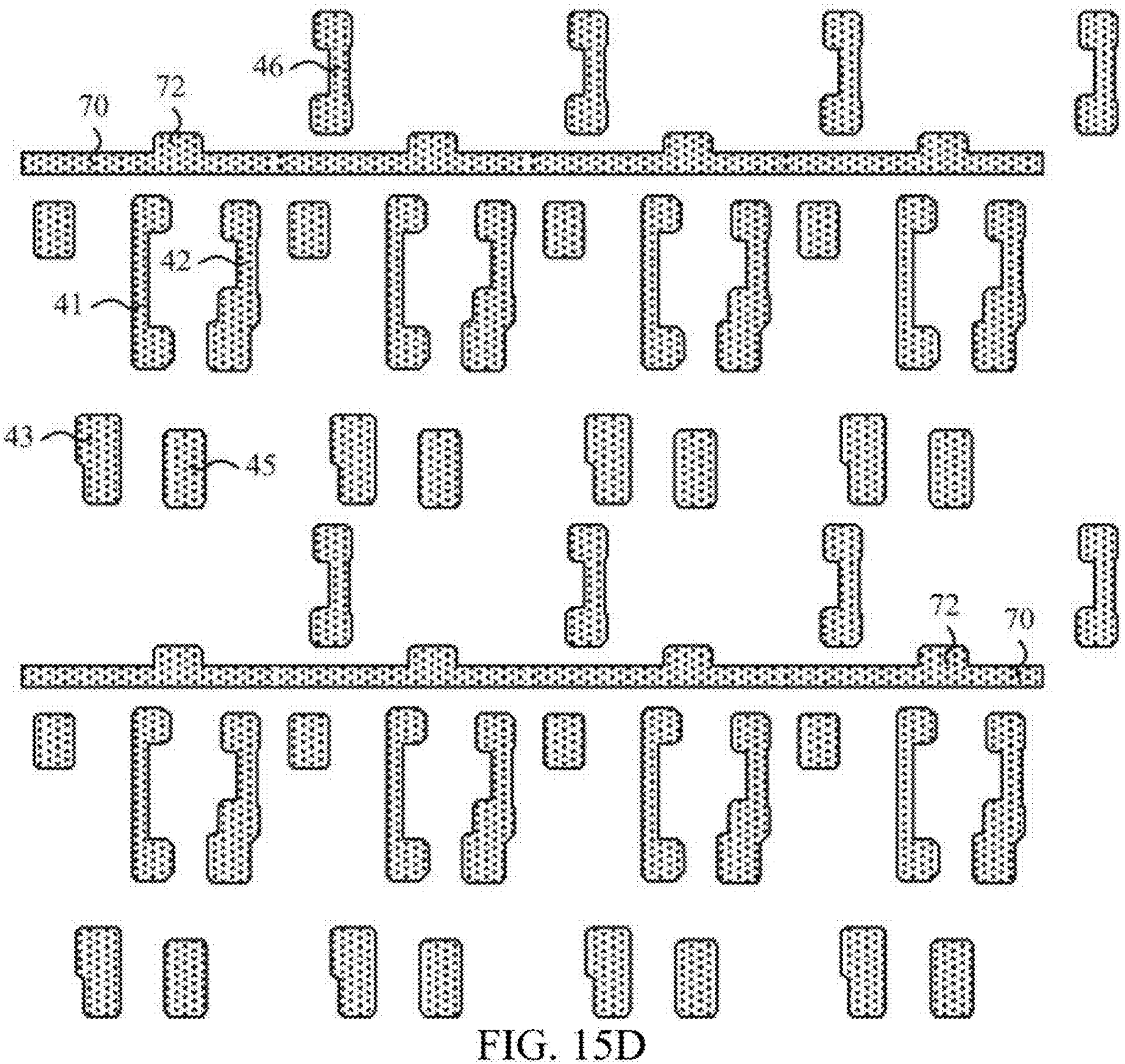
Figure 15E:
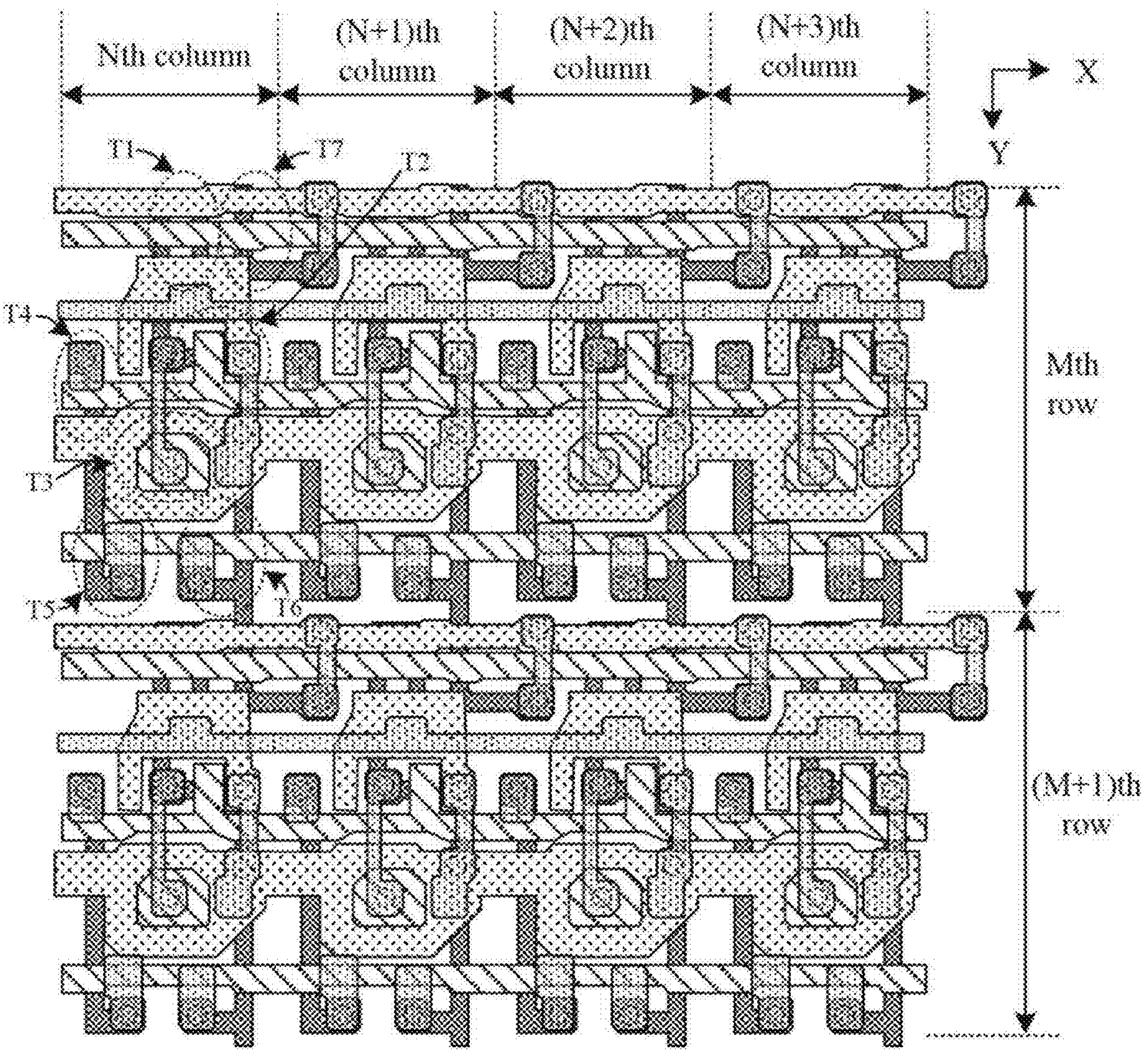
Figure 15F:
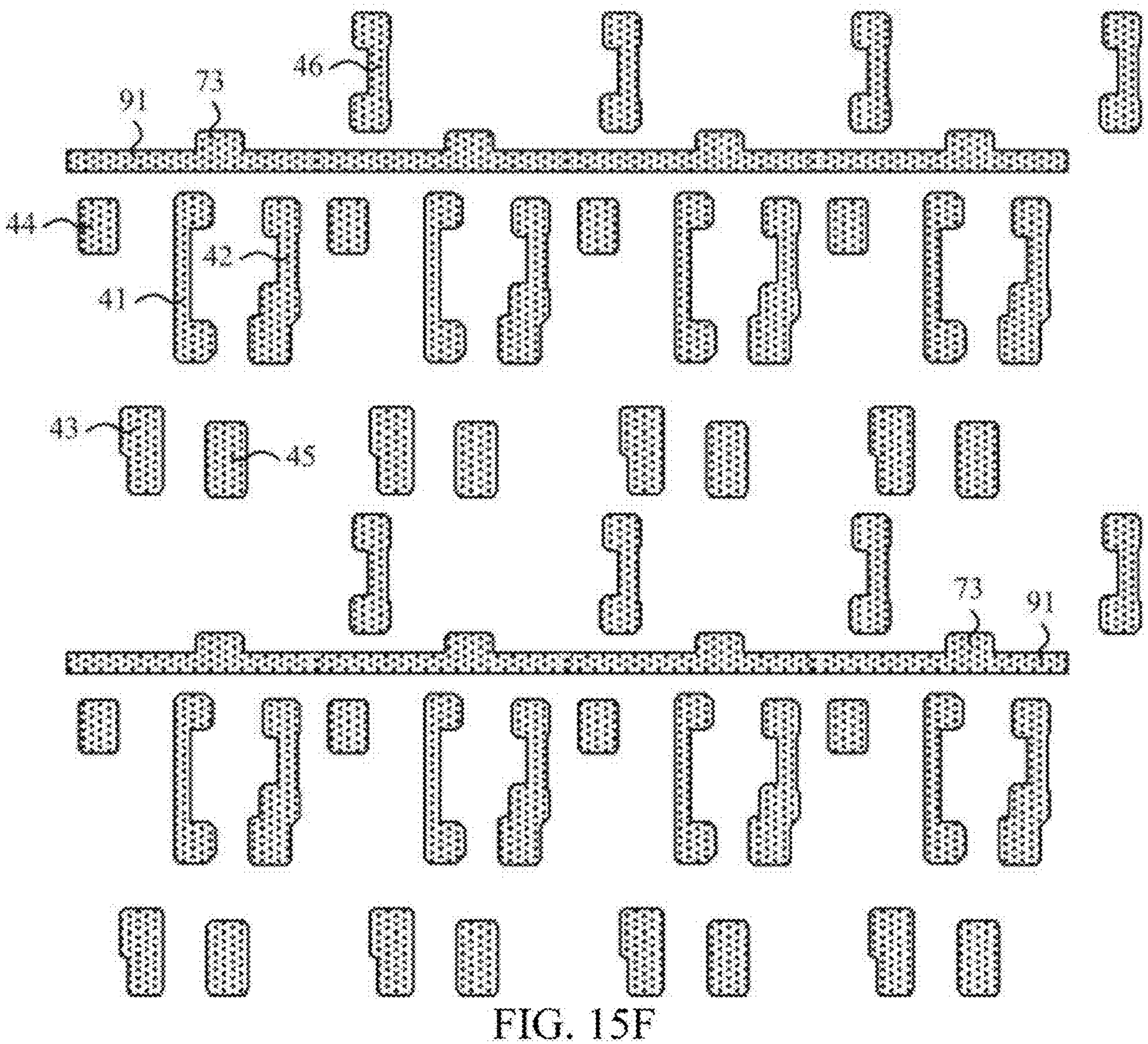

(5) A pattern of a third conductive layer is formed. In an exemplary embodiment, forming the third conductive layer may include: on the base substrate on which the aforementioned patterns are formed, depositing a third conductive thin film, patterning the third conductive thin film through a patterning process to form a third conductive layer disposed on the fourth insulating layer as shown in FIGS. 15A to 15F, wherein FIG. 15A is an enlarged view of the E1 region in FIG. 8, FIG. 15B is a schematic planar view of the third conductive layer in FIG. 15A, FIG. 15C is an enlarged view of the E2 region in FIG. 8, FIG. 15D is a schematic planar view of the third conductive layer in FIG. 15C, FIG. 15E is an enlarged view of the E3 region in FIG. 8, and FIG. 15F is a schematic planar view of the third conductive layer in FIG. 15E. In an exemplary implementation, the third conductive layer may be referred to as a first source drain metal (SD1) layer.

In an exemplary embodiment, the pattern of the third conductive layer of each circuit unit in the display region includes a first connection electrode 41, a second connection electrode 42, a third connection electrode 43, a fourth connection electrode 44, a fifth connection electrode 45, and a sixth connection electrode 46.

In an exemplary embodiment, the first connection electrode 41 may be of a line shape of which the main body part extends along the second direction Y. The first terminal of the first connection electrode 41 is connected with the first electrode plate 24 through the first via hole V1, and the second terminal of the first connection electrode 41 is connected with the second region of the first active layer (also the first region of the second active layer) through the sixth via hole V6. In an exemplary embodiment, the first connection electrode 41 may serve as a second electrode of the first transistor T1 and a first electrode of the second transistor T2, so that the first electrode plate 24, the second electrode of the first transistor T1, and the first electrode of the second transistor T2 have a same potential (a second node N2).

In an exemplary embodiment, the shape of the second connection electrode 42 may be a strip shape with the main body extending along the second direction Y, a first terminal of the second connection electrode 42 is connected to the second electrode plate 32 through the second via hole V2, and a second terminal of the second connection electrode 42 is connected to the shield electrode 34 through the eighth via hole V8. In an exemplary embodiment, the second connection electrode 42 may serve as an inter-electrode connection line such that the second electrode plate 32 and the shield electrode 34 have the same potential, and the second connection electrode 42 is configured to be connected to a first power supply line formed subsequently.

In an exemplary embodiment, the shape of the third connection electrode 43 may be rectangular, and the third connection electrode 43 is connected to the first region of the fifth active layer through the third via hole V3. In an exemplary embodiment, the third connection electrode 43 may be used as the first electrode of the fifth transistor T5, and the third connection electrode 43 is configured to be connected to a first power supply line formed subsequently.

In an exemplary embodiment, the shape of the fourth connection electrode 44 may be rectangular, and the fourth connection electrode 44, and the fourth connection electrode is connected to the first region of the fourth active layer through the fifth via hole V5. In an exemplary embodiment, the fourth connection electrode 44 may serve as the first electrode of the fourth transistor T4 and is configured to be connected to a subsequently formed data signal line.

In an exemplary embodiment, the fifth connection electrode 45 may be of a rectangular shape, and the fifth connection electrode 45 is connected with the second region of the sixth active layer (also the second region of the seventh active layer) through the fourth via hole V4. In an exemplary embodiment, the fifth connection electrode 45 may serve as the second electrode of the sixth transistor T6 and the second electrode of the seventh transistor T7, and the fifth connection electrode 45 is configured to be connected with a connection electrode formed subsequently.

In an exemplary embodiment, the shape of the sixth connection electrode 46 may be a strip shape with the main body extending along the second direction Y. The first terminal of the sixth connection electrode 46 is connected to the first region of the first active layer (also the first region of the seventh active layer) through the seventh via hole V7, and the second terminal of the sixth connection electrode 46 is connected to the initial signal line 31 through the ninth via hole V9. In an exemplary embodiment, the sixth connection electrode 46 may serve as the first electrode of the first transistor T1 and the first electrode of the seventh transistor T7, thereby enabling the initial signal line 31 to write the initial voltage signal to the first electrode of the first transistor T1 and the first electrode of the seventh transistor T7.

As shown in FIGS. 15A and 15B, the patterns of the third conductive layers of the multiple circuit units in the first region (E1 region) may further include a first connection line 70 and a first connection block 71.

In an exemplary embodiment, the shape of the first connection line 70 may be a line shape in which the main body portion extends along the first direction X, which may be provided between the first scan signal line 21 and the second scan signal line 22 of the circuit unit, and the first connection line 70 of the first region is configured to be connected to the data signal line formed subsequently.

In an exemplary embodiment, the shape of the first connection block 71 may be a rectangular shape and may be provided on a side of the first connection line 70 away from the first scan signal line 21. A first terminal of the first connection block 71 is connected to the first connection line 70, and a second terminal of the first connection block 71 extends in a direction away from the first scan signal line 21. In an exemplary embodiment, the first connection block 71 of the first region is configured to be connected to the subsequently formed interlayer dummy connection block so that the third conductive layers of the first region, the second region and the third region exhibit the same or similar appearance.

In an exemplary embodiment, an orthographic projection of the first connection block 71 on the base substrate at least partially overlaps with an orthographic projection of the shield electrode 34 on the base substrate.

In an exemplary embodiment, the first connection line 70 of one circuit row in the first region and the multiple first connection blocks 71 may be an integrated structure connected to each other.

In an exemplary embodiment, the pattern of the third conductive layer of at least one circuit unit in the first region (E1 region) may further include a data connection block 47.

In an exemplary embodiment, the shape of the data connection block 47 may be a strip shape in which the main body portion extends along the second direction Y and may be provided on a side of the first connection line 70 close to the first scan signal line 21. The first terminal of the data connection block 47 is directly connected to the first connection line 70, and the second terminal of the data connection block 47 extends in a direction away from the first connection line 70 and is directly connected to the fourth connection electrode 44, so that the first connection line 70 may be connected to the fourth connection electrode 44 through the data connection block 47. Since the fourth connection electrode 44 is connected to the data signal line formed subsequently, the connection between the first connection line 70 and the data signal line may be achieved.

In an exemplary embodiment, a data connection block 47 may be provided in one circuit row of the first region, and multiple data connection blocks 47 may be respectively provided in different circuit columns such that the first connection lines 70 of the different circuit rows are correspondingly connected to the data signal lines of the different circuit columns.

In an exemplary embodiment, the first connection line 70, the data connection block 47, and the fourth connection electrode 44 of one circuit row may be an integrated structure connected to each other.

As shown in FIGS. 15C and 15D, the patterns of the third conductive layers of the multiple circuit units in the second region (E2 region) may further include a first connection line 70 and a second connection block 72.

In an exemplary embodiment, the structure of the first connection line 70 of the second region is substantially the same as that of the first connection line 70 of the first region. The position and shape of the first connection line 70 in the circuit unit in the second region is substantially the same as the position and shape of the first connection line 70 in the circuit unit in the first region, and the first connection line 70 in the second region is configured to be connected to the second connection line formed subsequently.

In an exemplary embodiment, the structure of the second connection block 72 of the second region is substantially the same as that of the first connection block 71 of the first region. The position and shape of the second connection block 72 in the circuit unit in the second region are substantially the same as the position and shape of the first connection block 71 in the circuit unit in the first region. A part of the second connection block 72 of the second region is configured to be connected to a subsequently formed interlayer data connection block, and another part of the second connection block 72 is configured to be connected to a subsequently formed interlayer dummy connection block.

In an exemplary embodiment, in at least one unit row including the circuit units of the first region and the circuit units of the second region, the first connection line 70 of the first region and the first connection line 70 of the second region may be located on the same straight line extending along the first direction X.

In an exemplary embodiment, in at least one unit row including the circuit units of the first region and the circuit units of the second region, the first connection block 71 of the first region and the second connection block 72 of the second region may be located on the same straight line extending along the first direction X. In an exemplary embodiment, the first connection block 71 of the first region and the second connection block 72 of the second region exhibit the same or similar appearance. It can not only improve the uniformity of the preparation process, but also make different regions achieve basically the same display effect under transmitted light and reflected light, effectively avoid the poor appearance of the display substrate, and improve the display quality.

In an exemplary embodiment, the first connection line 70, the multiple first connection blocks 71, and the multiple second connection blocks 72 of one circuit row in the first region and the second region may be an integrated structure connected to each other.

In an exemplary embodiment, the orthographic projections of the first connection line 70 on the base substrate in the first region and the second region at least partially overlap with an orthographic projection of the shield electrode 34 on the base substrate. Since the shield electrode 34 is connected to the subsequently formed first power supply line, the shield electrode 34 can effectively shield the influence of the data voltage jump on the first connection line 70 from affecting the key node in the pixel drive circuit, thus avoiding the data voltage jump affecting the potential of the key node in the pixel drive circuit, and improving the display effect.

As shown in FIGS. 15E and 15F, the patterns of the third conductive layers of the multiple circuit units in the third region (E3 region) may further include a first power supply wiring 91 and a third connection block 73.

In an exemplary embodiment, the shape of the first power supply wiring 91 may be a line shape in which the main body portion extends along the first direction X, which may be provided between the first scan signal line 21 and the second scan signal line 22 of the circuit unit, and the first power supply wiring 91 of the third region is configured to be connected to the second power supply wiring through an interlayer electrode connection block formed subsequently. In an exemplary embodiment, the first power supply wiring 91 may be connected to a bezel power supply lead of the bezel region configured to continuously provide a low voltage signal (VSS).

In an exemplary embodiment, an orthographic projection of the first power supply wiring 91 on the base substrate in the third region and an orthographic projection of the shield electrode 34 on the base substrate at least partially overlap.

In an exemplary embodiment, the shape of the third connection block 73 may be a rectangular shape and may be provided on a side of the first power supply wiring 91 away from the first scan signal line 21. The first terminal of the third connection block 73 is directly connected to the first power supply wiring 91, and the second terminal of the third connection block 73 extends in a direction away from the first scan signal line 21. In an exemplary embodiment, the third connection block 73 is configured to be connected to the subsequently formed interlayer electrode connection block.

In an exemplary embodiment, an orthographic projection of the third connection block 73 on the base substrate at least partially overlaps with an orthographic projection of the shield electrode 34 on the base substrate.

In an exemplary embodiment, the first power supply wiring 91 of one circuit row in the third region and the multiple third connection blocks 73 may be an integrated structure connected to each other.

In an exemplary embodiment, the position and shape of the first power supply wiring 91 in the circuit unit in the third region are substantially the same as the position and shape of the first connection line 70 in the circuit unit in the first region and the second region.

In an exemplary embodiment, the position and shape of the third connection block 73 in the circuit unit in the third region are substantially the same as the position and shape of the first connection block 71 in the circuit unit in the first region and the position and shape of the second connection block 72 in the circuit unit in the second region. In at least one unit column including the circuit unit of the first region and the circuit unit of the third region, the first connection block 71 of the first region and the third connection block 73 of the third region may be located on the same straight line extending along the second direction Y. In at least one unit column including the circuit units of the second region and the circuit units of the third region, the second connection block 72 of the second region and the third connection block 73 of the third region may be located on the same straight line extending along the second direction Y. In an exemplary embodiment, the first connection block 71, the second connection block 72 and the third connection block 73 exhibit the same or similar appearance. It can not only improve the uniformity of the preparation process, but also make different regions achieve basically the same display effect under transmitted light and reflected light, effectively avoid the poor appearance of the display substrate, and improve the display quality.

Figure 16A:
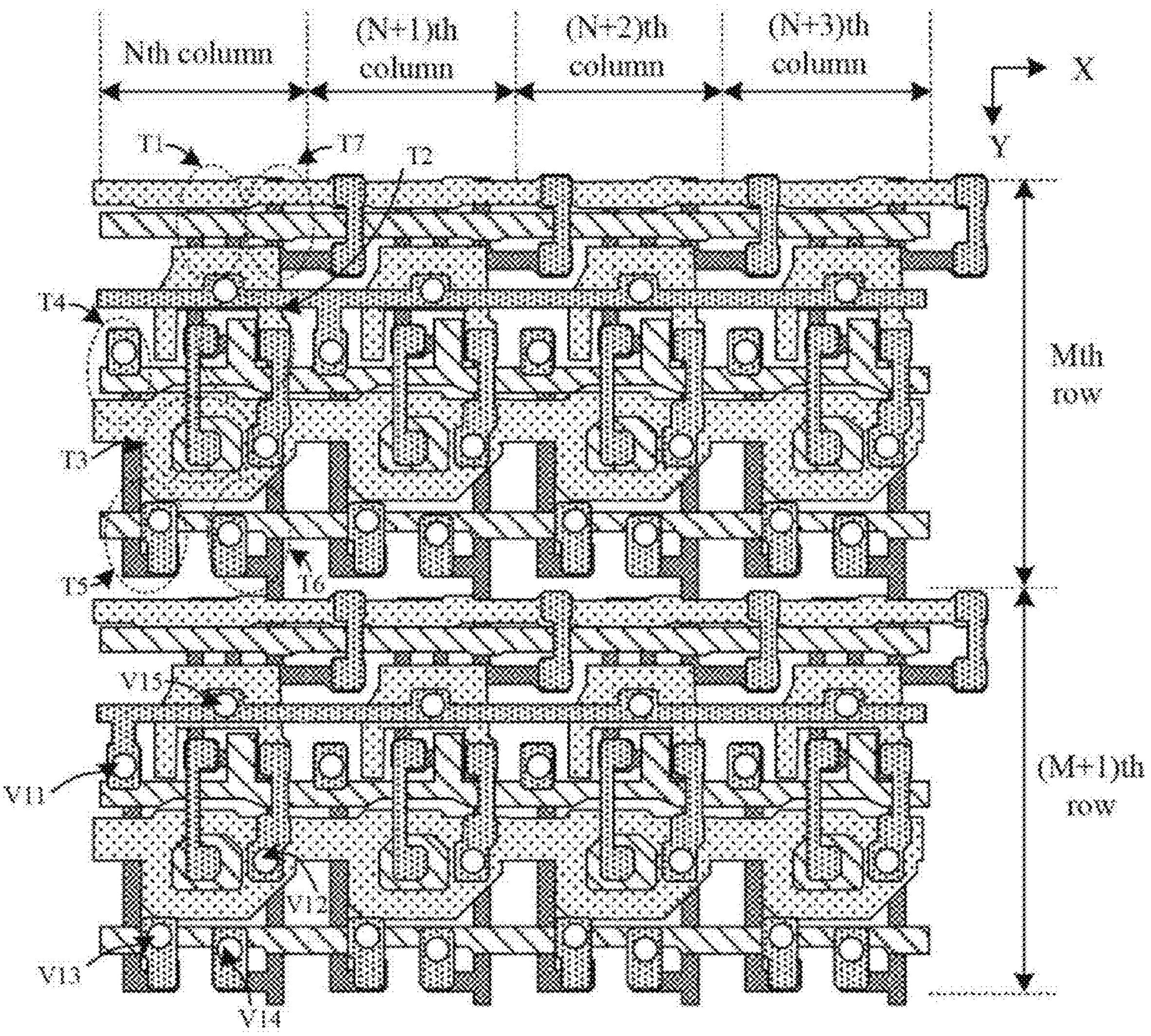
FIGS. 16A to 16C are schematic diagrams of a display substrate after a pattern of a first planarization layer is formed according to the present disclosure.
Figure 16B:
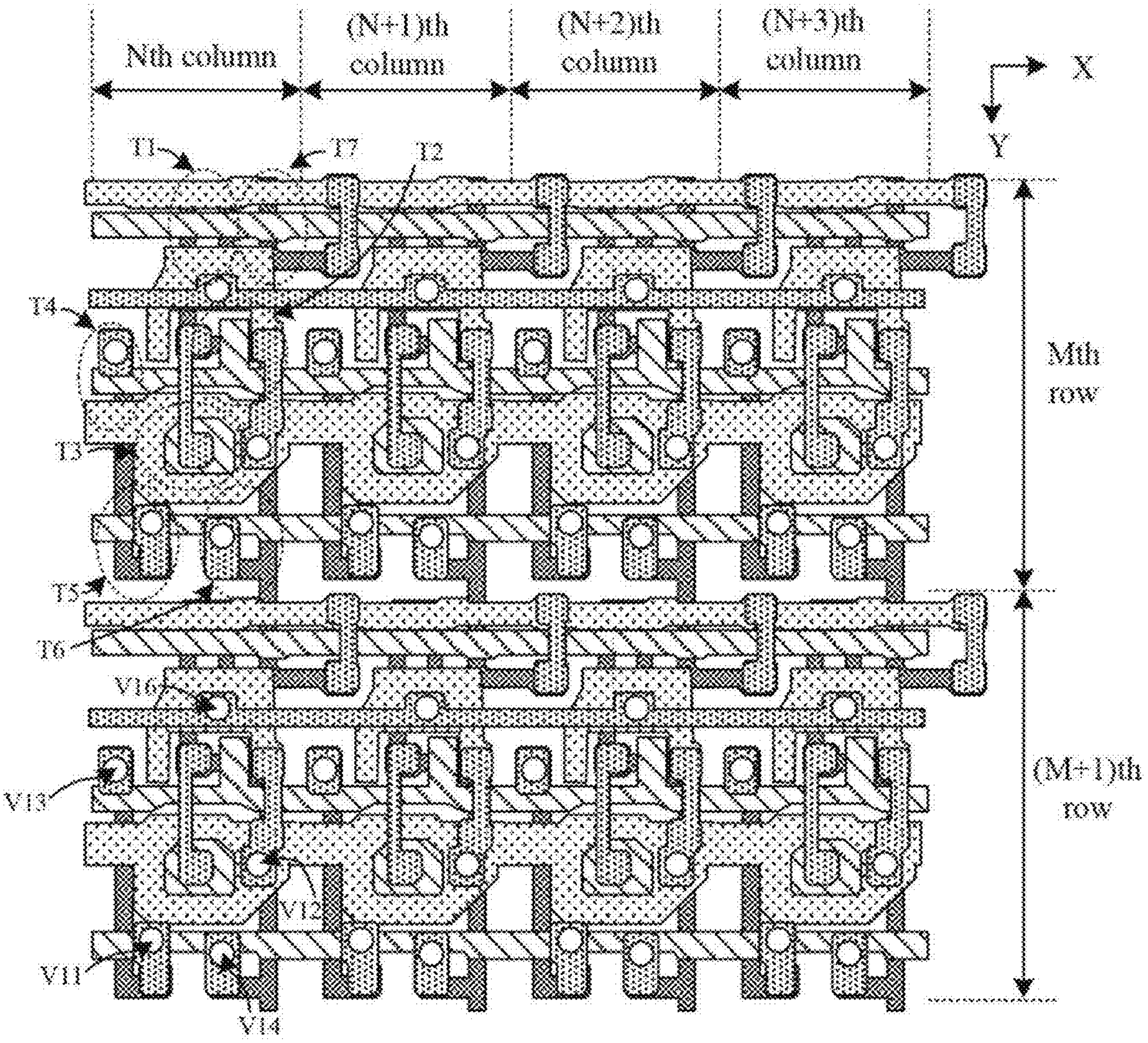
Figure 16C:
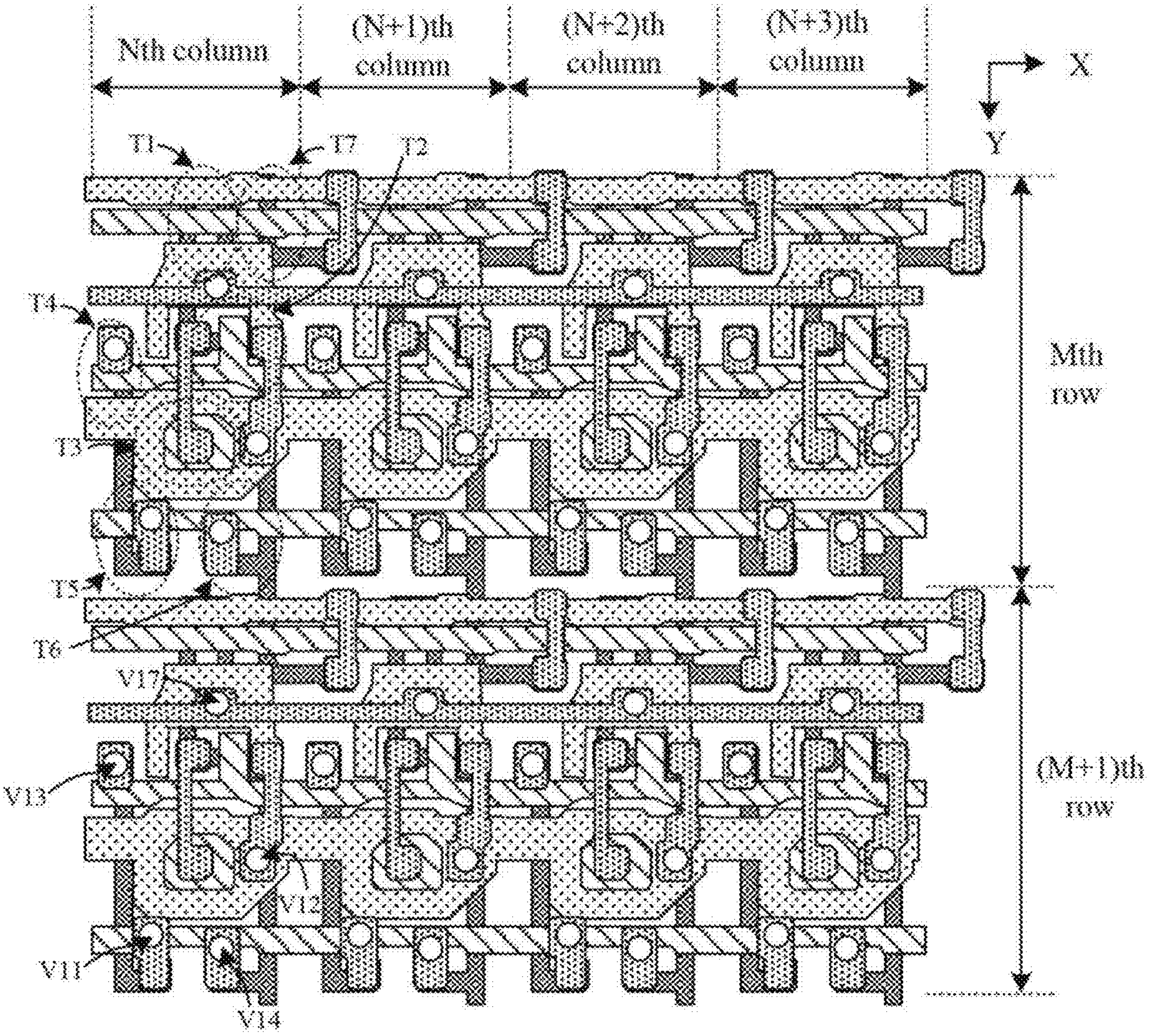

(6) Forming a pattern of a first planarization layer. In an exemplary embodiment, forming a pattern of a first planarization layer may include: on the base substrate on which the aforementioned patterns are formed, coating a first planarization thin film, and patterning the first planarization layer through a patterning process to form a first planarization layer covering the third conductive layer, and the first planarization layer is provided with multiple via holes, as shown in FIGS. 16A to 16C, FIG. 16A is an enlarged view of an E1 region in FIG. 8, FIG. 16B is an enlarged view of an E2 region in FIG. 8, and FIG. 16C is an enlarged view of an E3 region in FIG. 8.

In an exemplary embodiment, multiple via holes of multiple circuit units in the display region each include an eleventh via hole V11, a twelfth via hole V12, a thirteenth via hole V13, and a fourteenth via hole V14.

In an exemplary embodiment, an orthographic projection of the eleventh via hole V11 on the base substrate is located within the range of an orthographic projection of a fourth connection electrode 44 on the base substrate, the first planarization layer in the eleventh via hole V11 is removed to expose a surface of the fourth connection electrode 44, and the eleventh via hole V11 is configured such that a data signal line formed subsequently is connected to the fourth connection electrode 44 through the eleventh via hole V21. In the exemplary embodiment, the fourth connection electrode 44 is connected to the first connection line 70 through the data connection block 47 in part of the circuit units in the first region, and the eleventh via hole V11 of these circuit unit serves as the first connection hole.

In an exemplary embodiment, an orthographic projection of the twelfth via hole V12 on the base substrate is within a range of an orthographic projection of the second connection electrode 42 on the base substrate, the first planarization layer in the twelfth via hole V12 is removed to expose the surface of the second connection electrode 42, and the twelfth via hole V12 is configured such that the first power supply line formed subsequently is connected with the second connection electrode 42 through the twelfth via hole V12.

In an exemplary embodiment, an orthographic projection of the thirteenth via hole V13 on the base substrate is within a range of an orthographic projection of the third connection electrode 43 on the base substrate, the first planarization layer in the thirteenth via hole V13 is removed to expose a surface of the third connection electrode 43, and the thirteenth via hole V11 is configured such that a first power supply line formed subsequently is connected with the third connection electrode 43 through the thirteenth via hole V23.

In an exemplary embodiment, an orthographic projection of the fourteenth via hole V14 on the base substrate is located within the range of an orthographic projection of the fifth connection electrode 45 on the base substrate, the first planarization layer within the fourteenth via hole V14 is removed to expose the surface of the fifth connection electrode 45, and the fourteenth via hole V14 is configured such that the subsequently formed first anode connection electrode is connected to the fifth connection electrode 45 through the fourteenth via hole V14.

As shown in FIG. 16A, in an exemplary embodiment, multiple circuit units in the first region (E1 region) may further include a fifteenth via hole V15.

In an exemplary embodiment, an orthographic projection of the fifteenth via hole V15 on the base substrate is located within the range of an orthographic projection of the first connection block 71 on the base substrate, the first planarization layer within the fifteenth via hole V15 is removed to expose the surface of the first connection block 71, and the fifteenth via hole V15 is configured such that the subsequently formed interlayer dummy connection block is connected to the first connection block 71 through the fifteenth via hole V15.

As shown in FIG. 16B, in an exemplary embodiment, multiple circuit units in the second region (E2 region) may further include a sixteenth via hole V16.

In an exemplary embodiment, an orthographic projection of the sixteenth via hole V16 on the base substrate is located within the range of the orthographic projection of the second connection block 72 on the base substrate, the first planarization layer within the sixteenth via hole V16 is removed to expose the surface of the second connection block 72, a portion of the sixteenth via hole V16 is configured such that a subsequently formed interlayer data connection block is connected to the second connection block 72 through the sixteenth via hole V16, and another portion of the sixteenth via hole V16 is configured such that a subsequently formed interlayer dummy connection block is connected to the second connection block 72 through the sixteenth via hole V16.

As shown in FIG. 16C, in an exemplary embodiment, multiple circuit units in the third region (E3 region) may further include a seventeenth via hole V17.

In an exemplary embodiment, an orthographic projection of the seventeenth via hole V17 on the base substrate is located within the range of an orthographic projection of the third connection block 73 on the base substrate, the first planarization layer within the seventeenth via hole V17 is removed to expose the surface of the third connection block 73, and the seventeenth via hole V17 is configured such that the subsequently formed interlayer electrode connection block is connected to the third connection block 73 through the seventeenth via hole V17.

In an exemplary embodiment, the process may first deposit a fifth insulating thin film and then apply a first planarization thin film to form a fifth insulating layer covering the third conductive layer and a first planarization layer disposed on the fifth insulating layer.

Figure 17A:
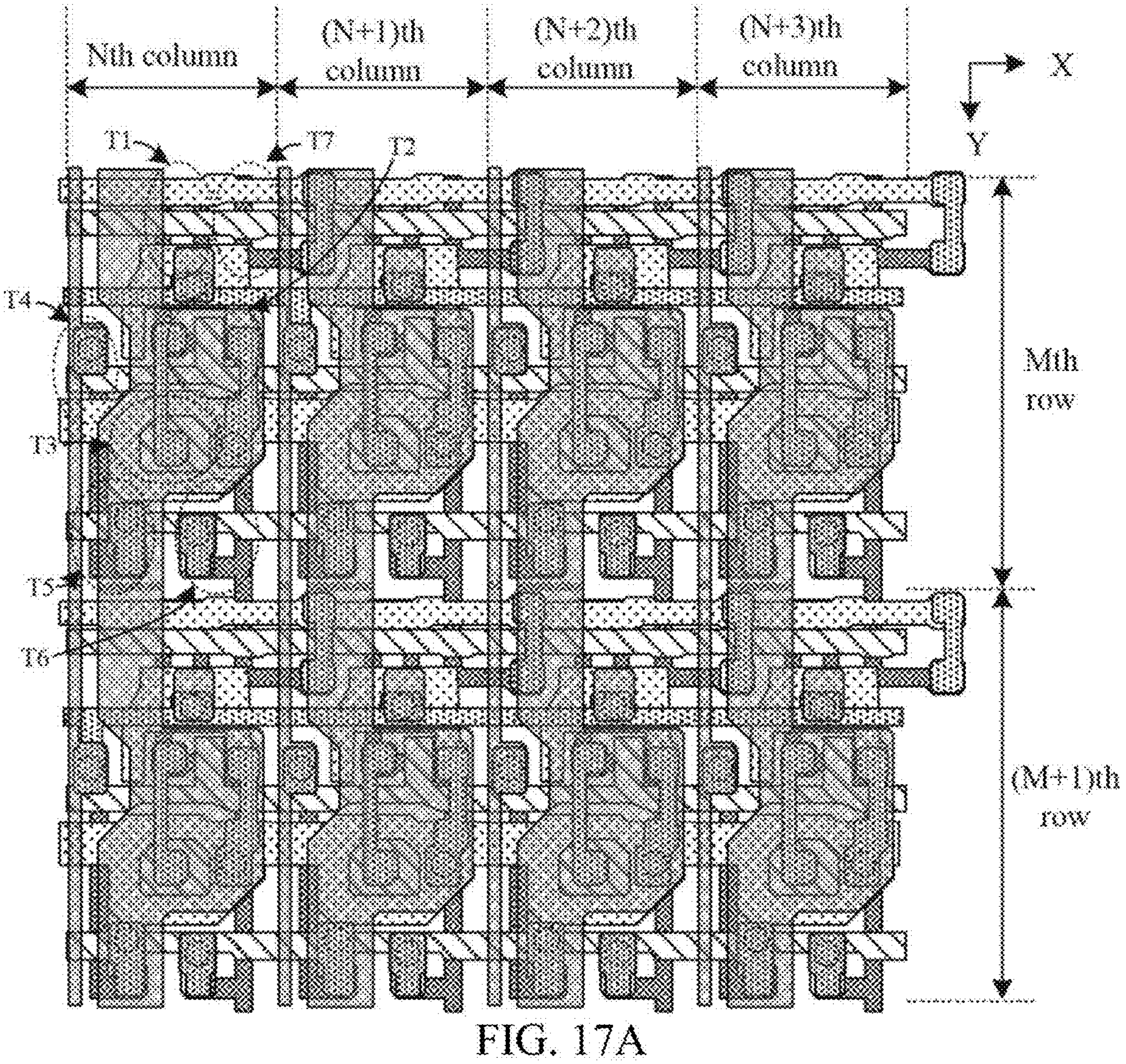
FIGS. 17A to 17F are schematic diagrams of a display substrate after a pattern of a fourth conductive layer is formed according to the present disclosure.
Figure 17B:
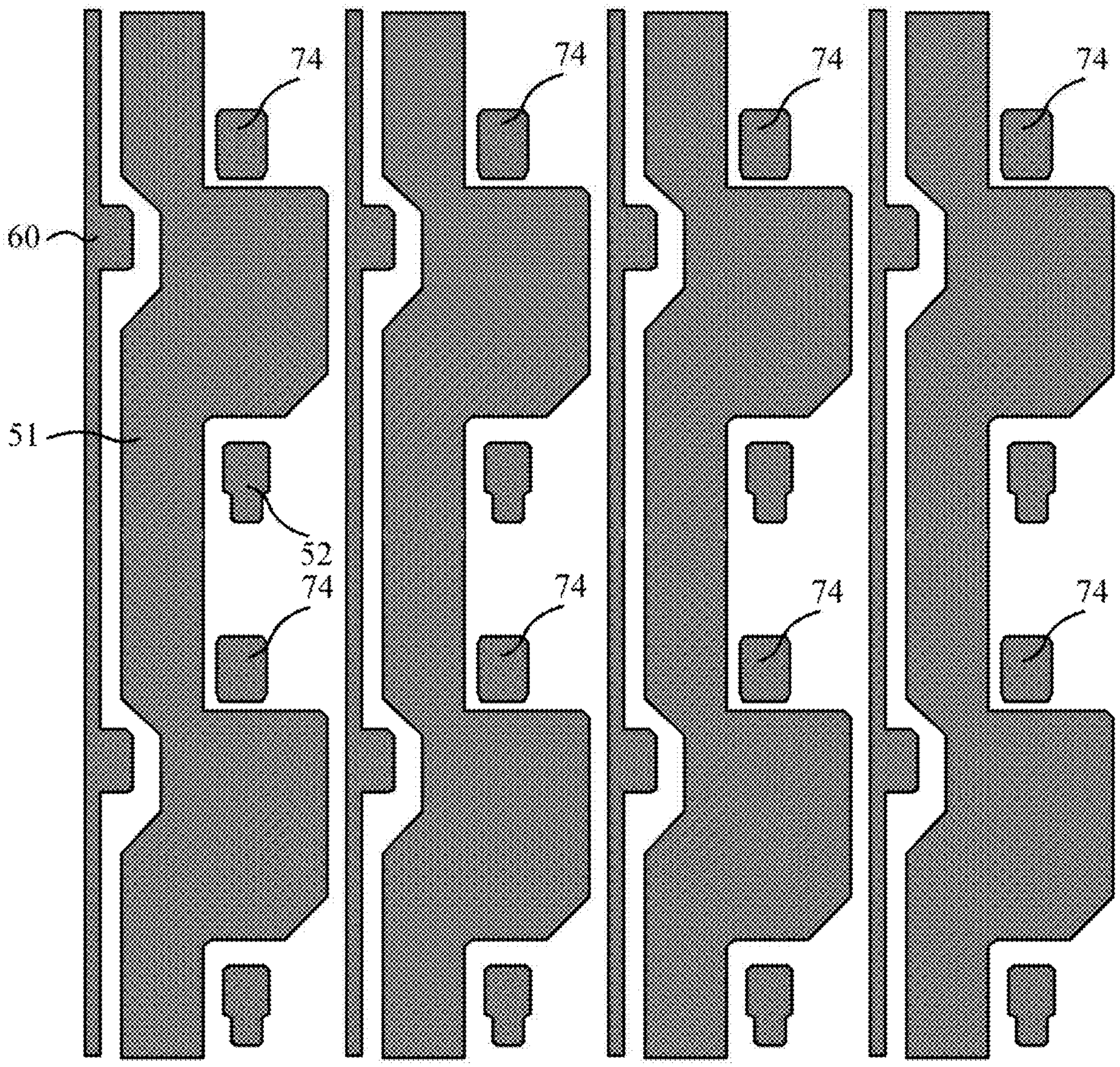
Figure 17C:
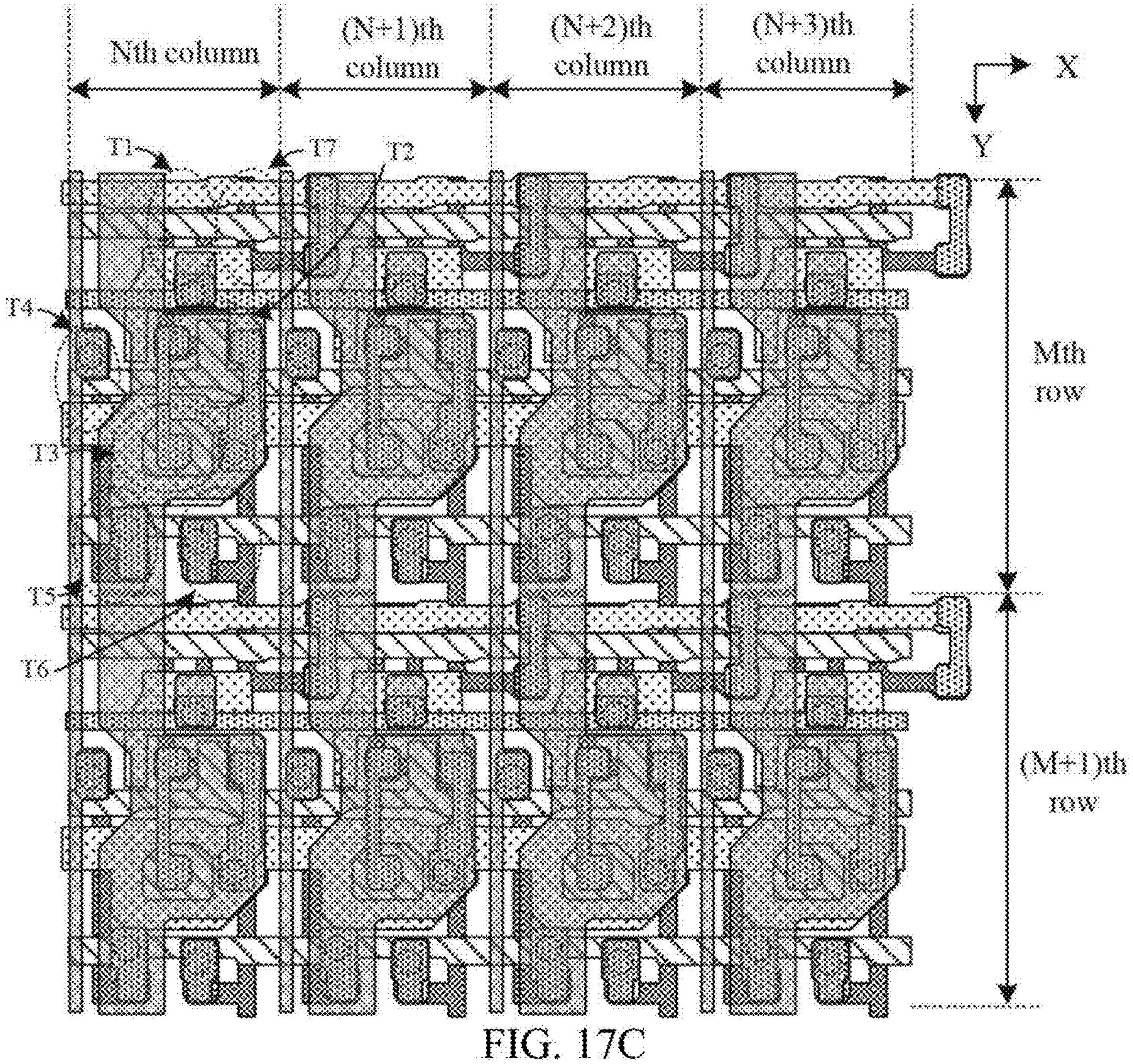
Figure 17D:
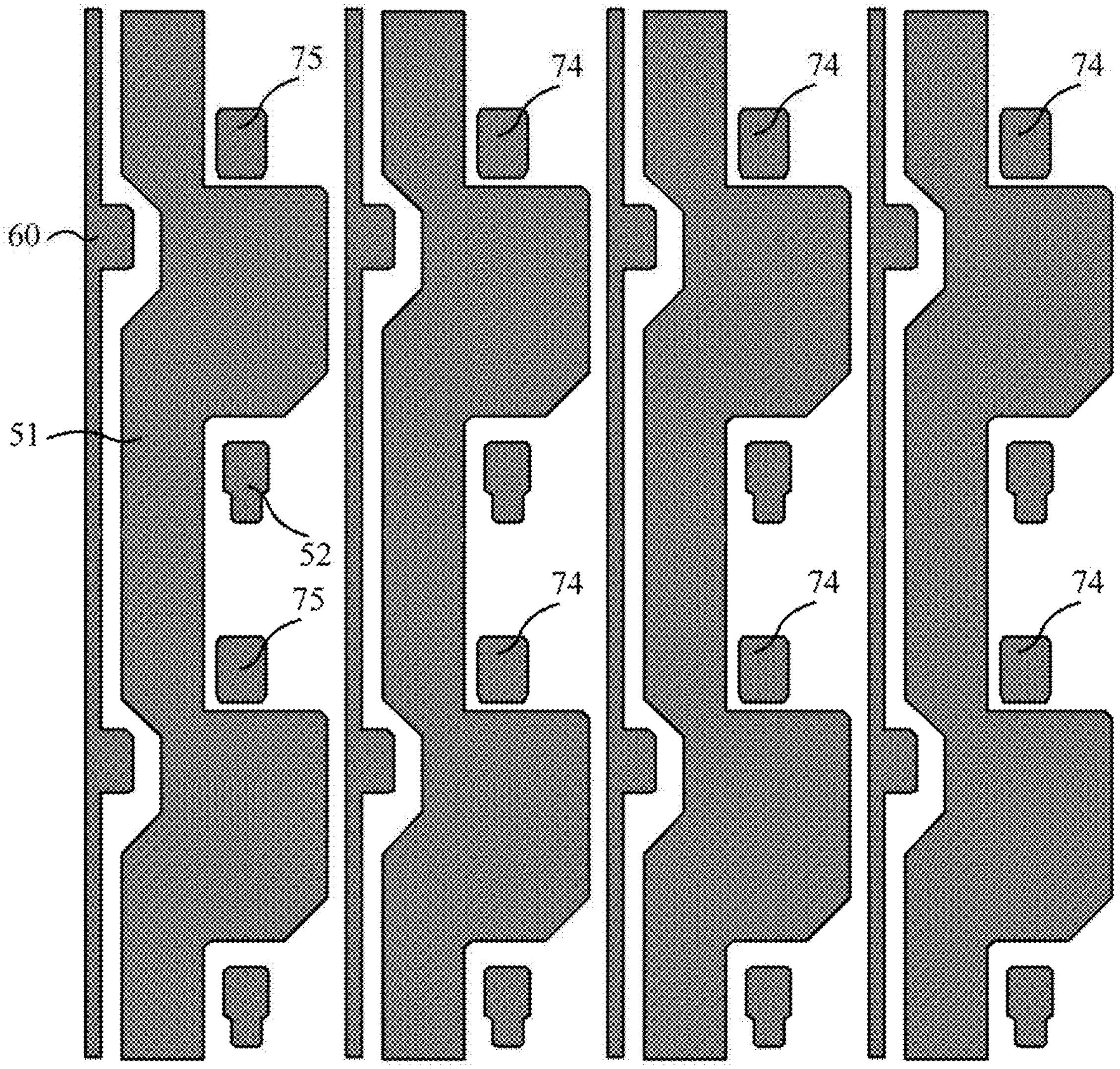
Figure 17E:
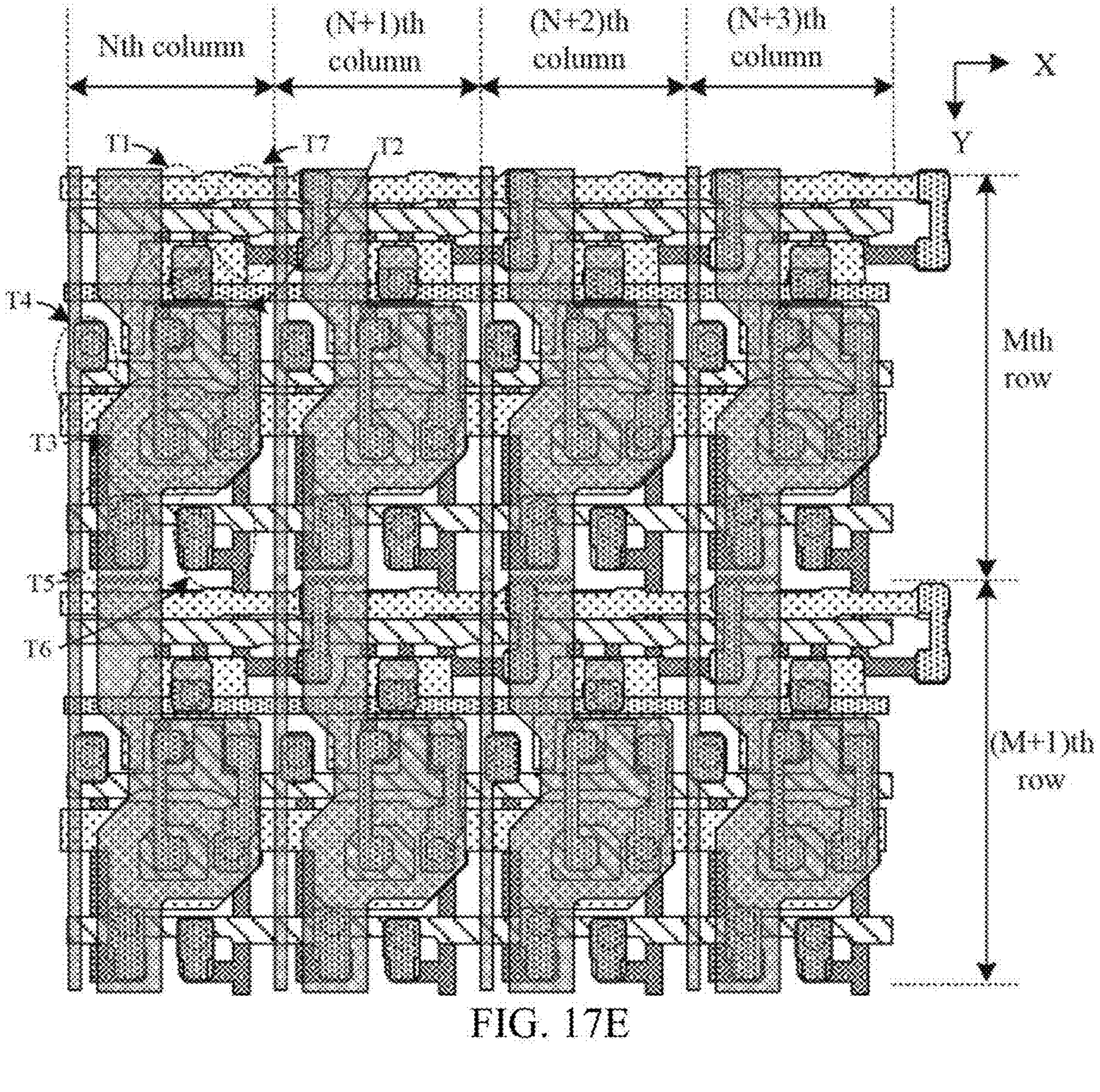
Figure 17F:
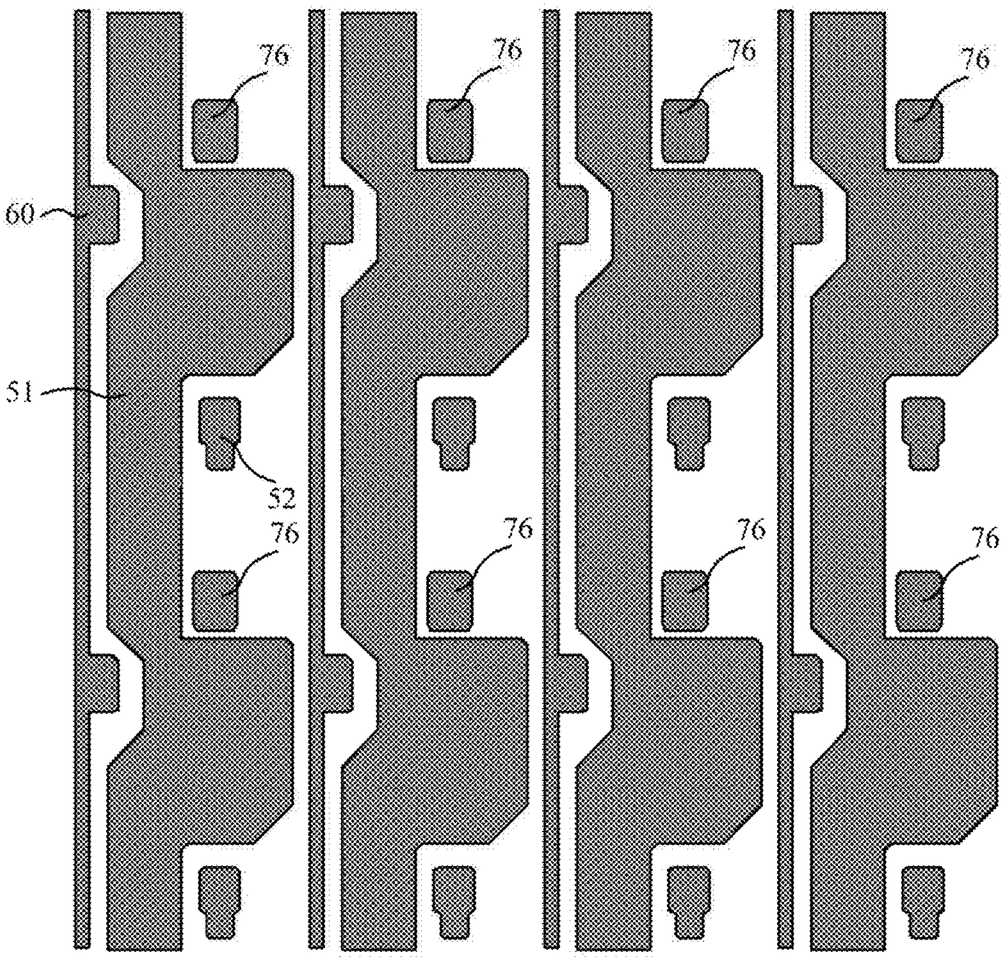

(7) A pattern of a fourth conductive layer is formed. In an exemplary embodiment, forming the pattern of the fourth conductive layer may include: on the base substrate on which the aforementioned patterns are formed, depositing fourth conductive thin film, and patterning the fourth conductive thin film through a patterning process to form a fourth conductive layer disposed on the first planarization layer, as shown in FIGS. 17A to 17F, wherein FIG. 17A is an enlarged view of the E1 region in FIG. 8, FIG. 17B is a schematic planar view of the fourth conductive layer in FIG. 17A, FIG. 17C is an enlarged view of the E2 region in FIG. 8, FIG. 17D is a schematic planar view of the fourth conductive layer in FIG. 17C, FIG. 17E is an enlarged view of the E3 region in FIG. 8, and FIG. 17F is a schematic planar view of the fourth conductive layer in FIG. 17E. In an exemplary implementation, the fourth conductive layer may be referred to as a second source drain metal (SD2) layer.

In an exemplary embodiment, the pattern of the fourth conductive layers of multiple circuit units in the display region each include a first power supply line 51, a first anode connection electrode 52, and a data signal line 60.

In an exemplary embodiment, the shape of the first power supply line 51 can be a folded shape with the main part extending along the second direction Y. On the one hand, the first power supply line 51 is connected to the second connection electrode 42 through the twelfth via hole V12, and on the other hand, the first power supply line 51 is connected to the third connection electrode 43 through the thirteenth via hole V13. Since the second connection electrode 42 is connected to the second electrode 32 and the shield electrode 34, respectively, through a via hole, the third connection electrode 43 is connected to the first region of the fifth active layer through a via hole, thereby enabling the first power supply line 51 to write a power supply signal to the first electrode of the fifth transistor T5, and the second electrode plate 32 of the storage capacitor and the shield electrode 34 have the same potential as the first power supply line 51.

In an exemplary embodiment, an orthographic projection of the first power supply line 51 on the base substrate at least partially overlaps with an orthographic projection of the first connection electrode 41 on the base substrate, the first power supply line can effectively shield the influence of data voltage jump on the key node of the pixel drive circuit, the influence of data voltage jump on the potential of the key node of the pixel drive circuit is avoided, and the display effect is improved.

In an exemplary embodiment, the first power supply lines 51 may be of an unequal width design, and the first power supply lines 51 adopting the unequal width design may not only facilitate a layout of the pixel structure, but also reduce a parasitic capacitance between the first power supply line and the data signal line.

In an exemplary embodiment, the shape of the first anode connection electrode 52 may be rectangular, and the first anode connection electrode 52 is connected to the fifth connection electrode 45 through the fourteenth via hole V14. In an exemplary embodiment, the first anode connection electrode 52 is configured to be connected to a second anode connection electrode subsequently formed.

In an exemplary embodiment, the data signal line 60 may be in the shape of a line having its main body portion extending along the second direction Y, and the data signal line 60 is connected to the fourth connection electrode 44 through the eleventh via hole V11. Since the fourth connection electrode 44 is connected to the first region of the fourth active layer through a via hole, it is achieved that the data signal line 60 writes the data signal to the first electrode of the fourth transistor T4.

In the exemplary embodiment, since the fourth connection electrode 44 is connected to the first connection line 70 through the data connection block 47 in the partial circuit unit of the first region, the data signal line 60 is connected to the first connection line 70 through the fourth connection electrode 44.

As shown in FIGS. 17A and 17, in an exemplary embodiment, multiple circuit units in the first region (E1 region) may further include an interlayer dummy connection block 74.

In an exemplary embodiment, the shape of the interlayer dummy connection block 74 of the first region may be rectangular, an orthographic projection of the interlayer dummy connection block 74 on the base substrate at least partially overlaps with an orthographic projection of the first connection block 71 on the base substrate, and the interlayer dummy connection block 74 is connected to the first connection block 71 through a fifteenth via hole V15. In an exemplary embodiment, the interlayer dummy connection block 74 is configured to connect with the subsequently formed dummy electrode and to have the fourth conductive layers of the first region, the second region, and the third region exhibit the same or similar topography.

In an exemplary embodiment, an orthographic projection of the interlayer dummy connection block 74 on the base substrate at least partially overlaps with an orthographic projection of the shield electrode 34 on the base substrate.

As shown in FIGS. 17C and 17D, in an exemplary embodiment, a part of the circuit units in the second region (E2 region) may further include an interlayer data connection block 75, and another part of the circuit units may further include an interlayer dummy connection block 74.

In an exemplary embodiment, the shape of the interlayer data connection block 75 of the second region may be a rectangular shape. An orthographic projection of an interlayer data connection block 75 on the base substrate at least partially overlaps with an orthographic projection of a second connection block 72 on the base substrate, the interlayer data connection block 75 is connected to the second connection block 72 through a sixteenth via hole V16, and the interlayer data connection block 75 in the second region is configured to be connected to a second connection line formed subsequently.

In an exemplary embodiment, the structure of the interlayer dummy connection block 74 of the second region may be substantially the same as that of the interlayer dummy connection block 74 of the first region. An orthographic projection of the interlayer dummy connection block 74 on the base substrate at least partially overlaps with an orthographic projection of the second connection block 72 on the base substrate, and the interlayer dummy connection block 74 is connected to the second connection block 72 through a sixteenth via hole V16. In an exemplary embodiment, the interlayer dummy connection block 74 in the second region is configured to be connected with the dummy electrode formed subsequently.

In an exemplary embodiment, the orthographic projections of the interlayer dummy connection block 74 and the interlayer data connection block 75 on the base substrate at least partially overlaps with an orthographic projection of the shield electrode 34 on the base substrate.

As shown in FIGS. 17E and 17F, in an exemplary embodiment, the multiple circuit units in the third region (E3 region) may further include an interlayer electrode connection block 76.

In an exemplary embodiment, the shape of the interlayer electrode connection block 76 of the third region may be rectangular, an orthographic projection of the interlayer electrode connection block 76 on the base substrate at least partially overlaps with an orthographic projection of the third connection block 73 on the base substrate, and the interlayer electrode connection block 76 is connected to the third connection block 73 through a seventeenth via hole V17. In an exemplary embodiment, the interlayer electrode connection block 76 is configured to be connected with a second power supply wiring formed subsequently.

In an exemplary embodiment, the position and shape of the interlayer dummy connection block 74 of the first region in the circuit unit, the position and shape of the interlayer data connection block 75 of the second region in the circuit unit, and the position and shape of the interlayer electrode connection block 76 of the third region in the circuit unit are substantially the same. In at least one unit row including circuit units of the first region and circuit units of the second region, the interlayer dummy connection block 74 of the first region and the interlayer data connection block 75 of the second region may be located on the same straight line extending along the first direction X. In at least one unit column including the circuit units of the first region and the circuit units of the third region, the interlayer dummy connection block 74 of the first region and the interlayer electrode connection block 76 of the third region may be located on the same straight line extending along the second direction Y. In at least one unit column including the circuit units of the second region and the circuit units of the third region, the interlayer data connection block 75 of the second region and the interlayer electrode connection block 76 of the third region may be located on the same straight line extending along the second direction Y. In an exemplary embodiment, the interlayer dummy connection block 74, the interlayer data connection block 75 and the interlayer electrode connection block 76 exhibit the same or similar appearance. It can not only improve the uniformity of the preparation process, but also make different regions achieve basically the same display effect under transmitted light and reflected light, effectively avoid the poor appearance of the display substrate, and improve the display quality.

(8) Forming a pattern of a second planarization layer. In an exemplary embodiment, forming a pattern of a second planarization layer may include: on the base substrate on which the aforementioned patterns are formed, coating a second planarization thin film, and patterning the second planarization layer through a patterning process to form a second planarization layer covering the fourth conductive layer, and the second planarization layer is provided with multiple via holes, as shown in FIGS. 18A to 18C, FIG. 18A is an enlarged view of an E1 region in FIG. 8, FIG. 18B is an enlarged view of an E2 region in FIG. 8, and FIG. 18C is an enlarged view of an E3 region in FIG. 8.

In an exemplary embodiment, multiple via holes of multiple circuit units in the display region each includes a twenty-first via hole V21.

In an exemplary embodiment, an orthographic projection of the twenty-first via hole V21 on the base substrate is located within the range of the orthographic projection of the first anode connection electrode 52 on the base substrate, the second planarization layer within the twenty-first via hole V21 is removed to expose the surface of the first anode connection electrode 52, and the twenty-first via hole V21 is configured such that a subsequently formed second anode connection electrode is connected to the first anode connection electrode 52 through the twenty-first via hole V21.

Figure 18A:
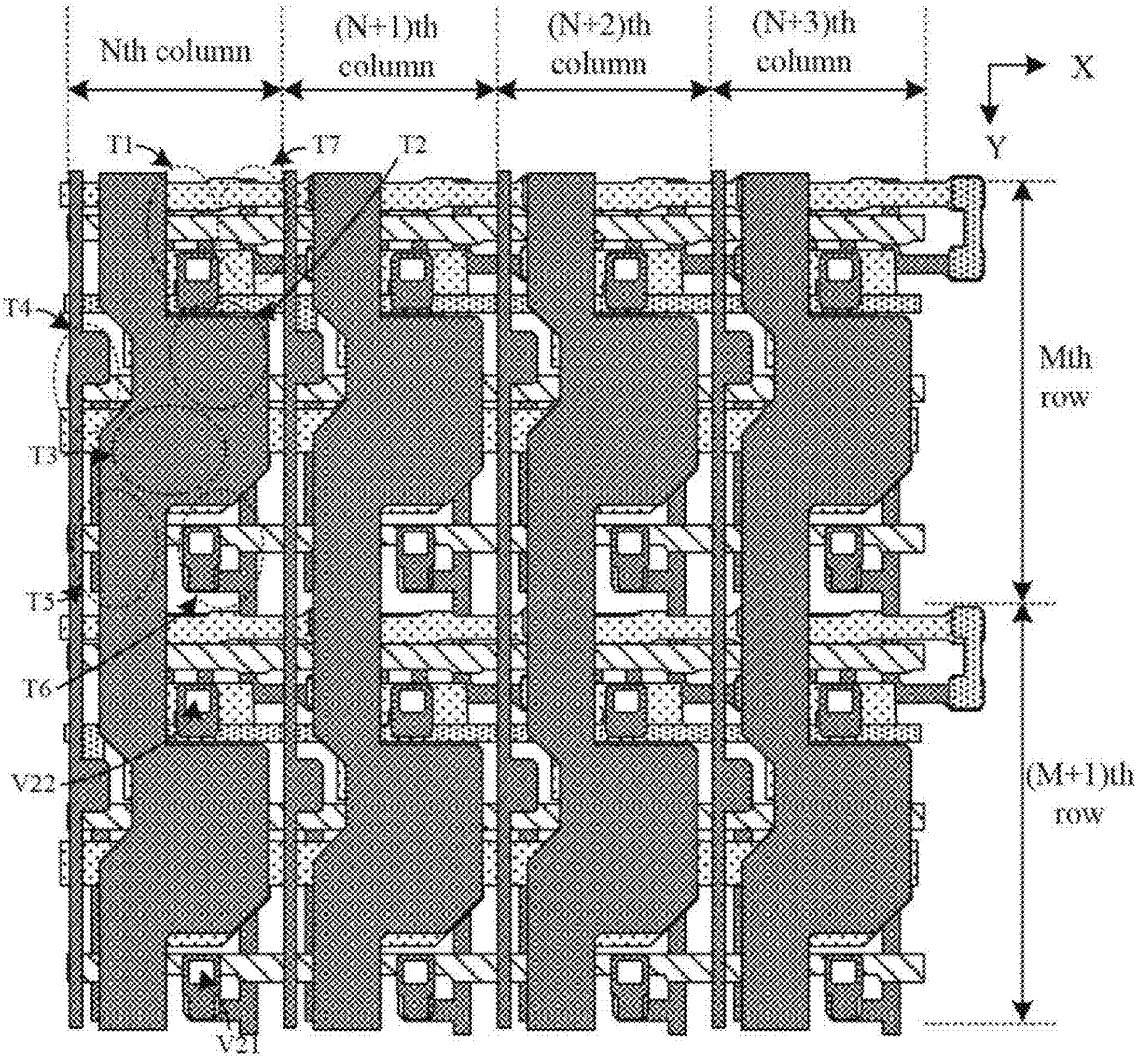
FIG. 18A to 18C are schematic diagrams of a display substrate after a pattern of a second planarization layer is formed according to the present disclosure.
Figure 18B:
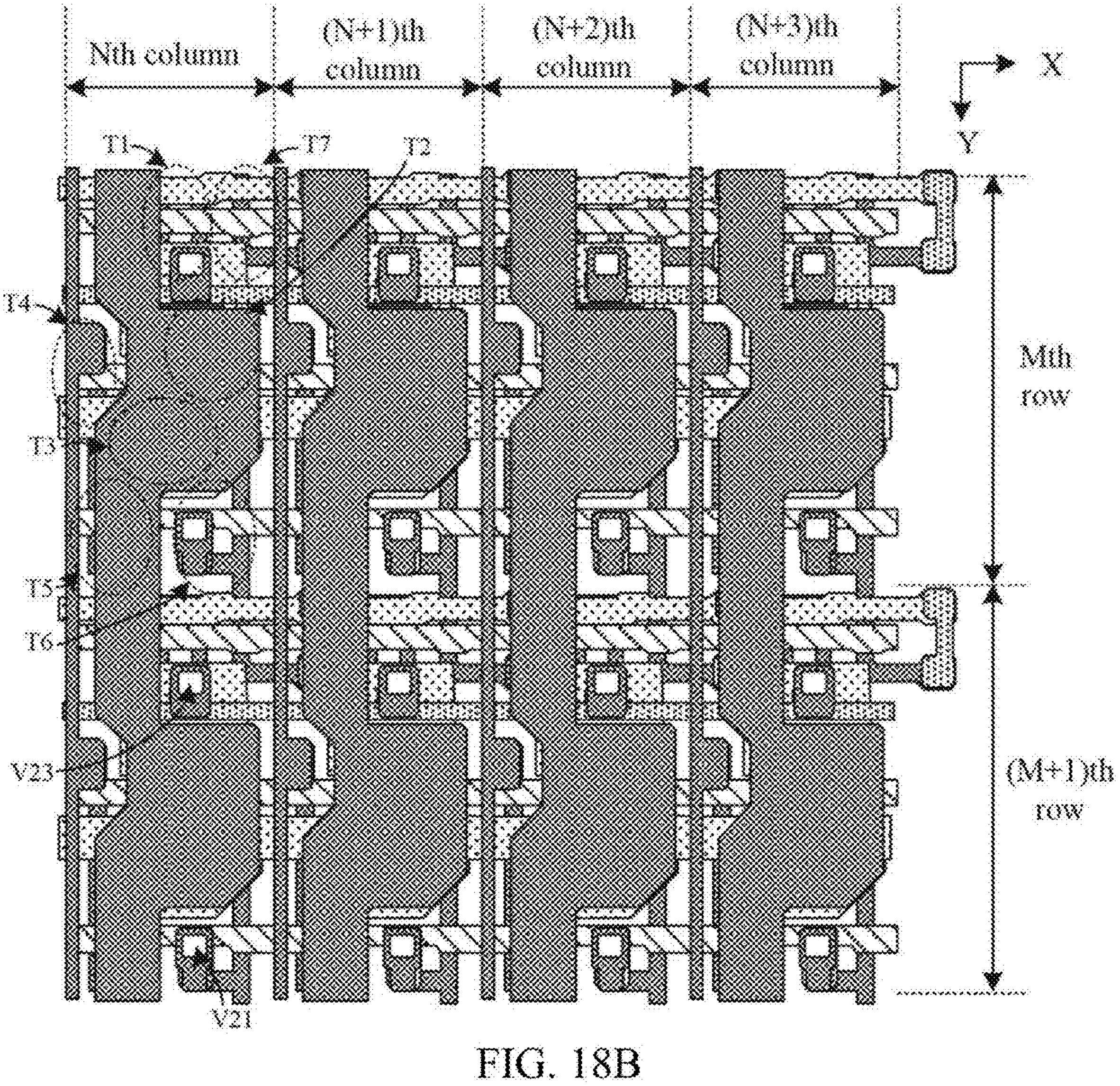
Figure 18C:
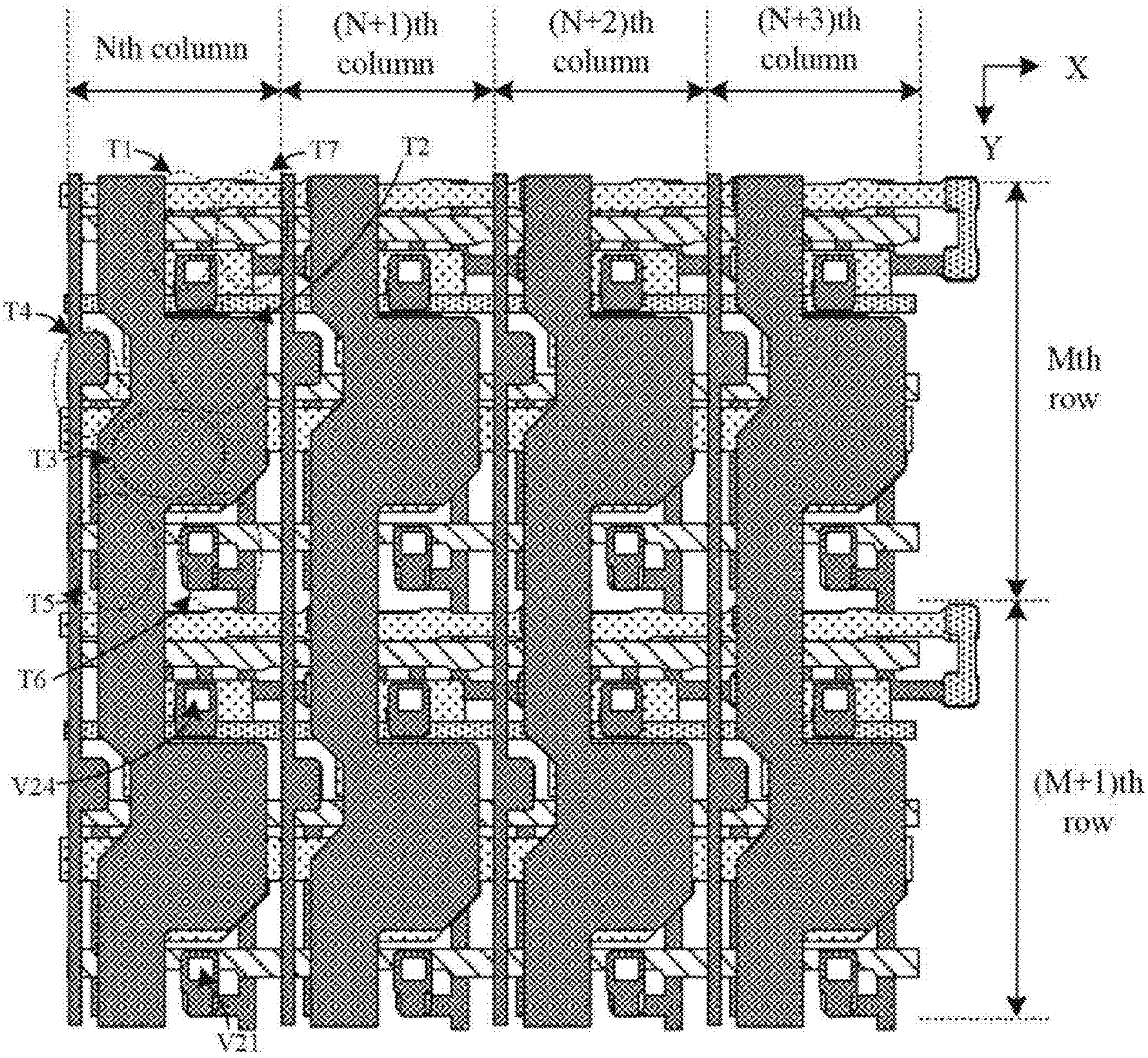

As shown in FIG. 18A, in an exemplary embodiment, multiple circuit units in the first region (E1 region) may further include a twenty-second via hole V22.

In an exemplary embodiment, an orthographic projection of the twenty-second via hole V22 on the base substrate is located within the range of an orthographic projection of the interlayer dummy connection block 74 on the base substrate, the second planarization layer within the twenty-second via hole V22 is removed to expose the surface of the interlayer dummy connection block 74, and the twenty-second via hole V22 is configured such that the subsequently formed dummy electrode is connected to the interlayer dummy connection block 74 through the twenty-second via hole V22.

As shown in FIG. 18B, in an exemplary embodiment, multiple circuit units in the second region (E2 region) may further include a twenty-third via hole V23.

In an exemplary embodiment, part of an orthographic projection of the twenty-third via hole V23 on the base substrate is within the range of the orthographic projection of the interlayer data connection block 75 on the base substrate, the second planarization layer within the twenty-third via hole V23 is removed to expose the surface of the interlayer data connection block 75, and this part of the twenty-third via hole V23 is configured such that a subsequently formed second connection line is connected to the interlayer data connection block 75 through the twenty-third via hole V23, and this twenty-third via hole V23 serves as the second connection hole. Another part of the orthographic projection of the twenty-third via hole V23 on the base substrate is located within the range of the orthographic projection of the interlayer dummy connection block 74 on the base substrate, and the second planarization layer within the twenty-third via hole V23 is removed to expose the surface of the interlayer dummy connection block 74, and this part of the twenty-third via hole V23 is configured such that a subsequently formed second connection line is connected to the interlayer dummy connection block 74 through the twenty-third via hole V23.

As shown in FIG. 18C, in an exemplary embodiment, multiple circuit units in the third region (E3 region) may further include a twenty-fourth via hole V24.

In an exemplary embodiment, an orthographic projection of the twenty-fourth via hole V24 on the base substrate is located within the range of an orthographic projection of the interlayer electrode connection block 76 on the base substrate, the second planarization layer within the twenty-fourth via hole V24 is removed to expose the surface of the interlayer electrode connection block 76, and the twenty-fourth via hole V24 is configured such that the subsequently formed second power supply wiring is connected to the interlayer electrode connection block 76 through the twenty-fourth via hole V24, with the twenty-fourth via hole V24 acting as a third connection hole.

Figure 19A:
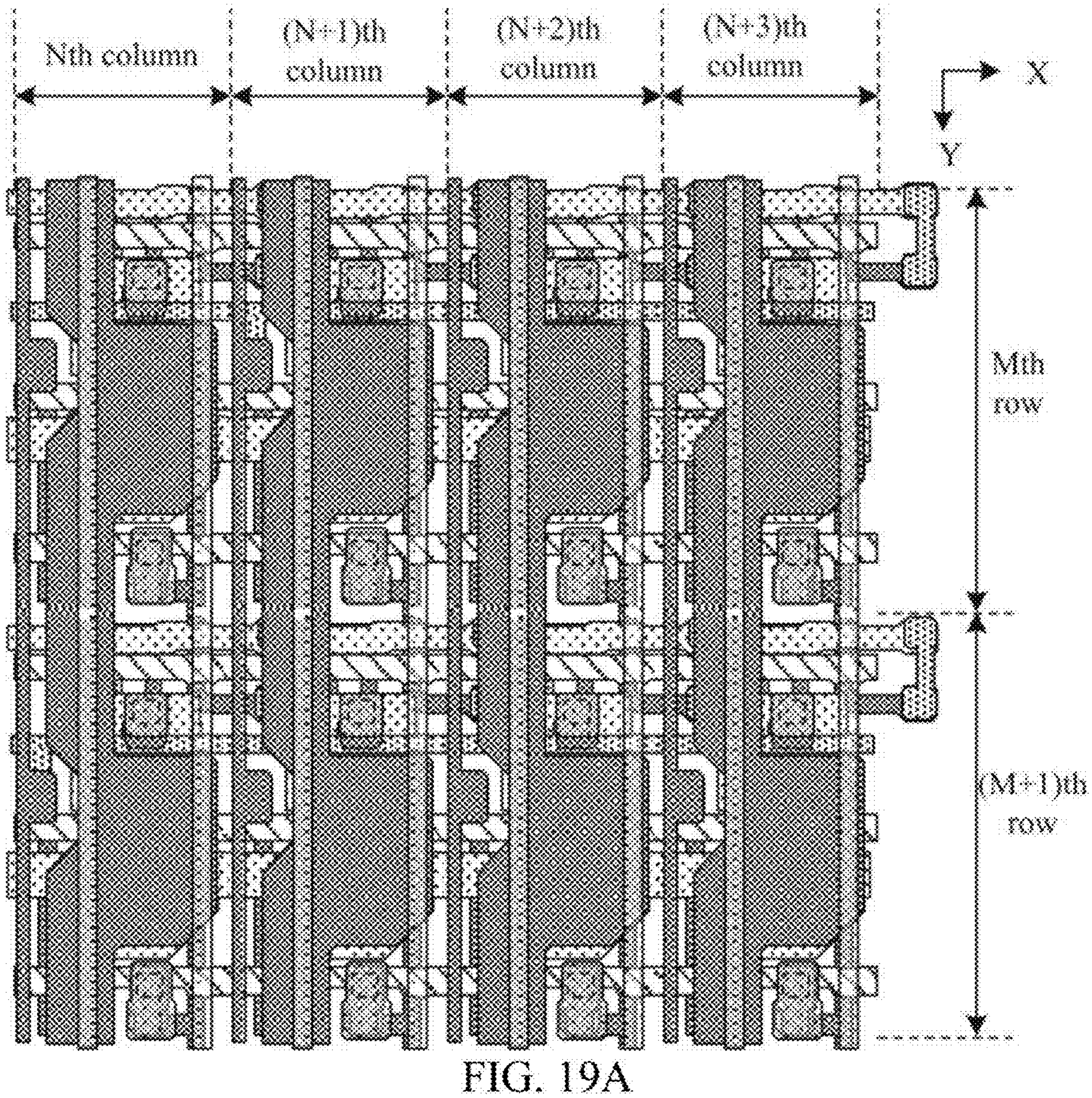
FIGS. 19A to 19F are schematic diagrams of a display substrate after a pattern of a fifth conductive layer is formed according to the present disclosure.
Figure 19B:
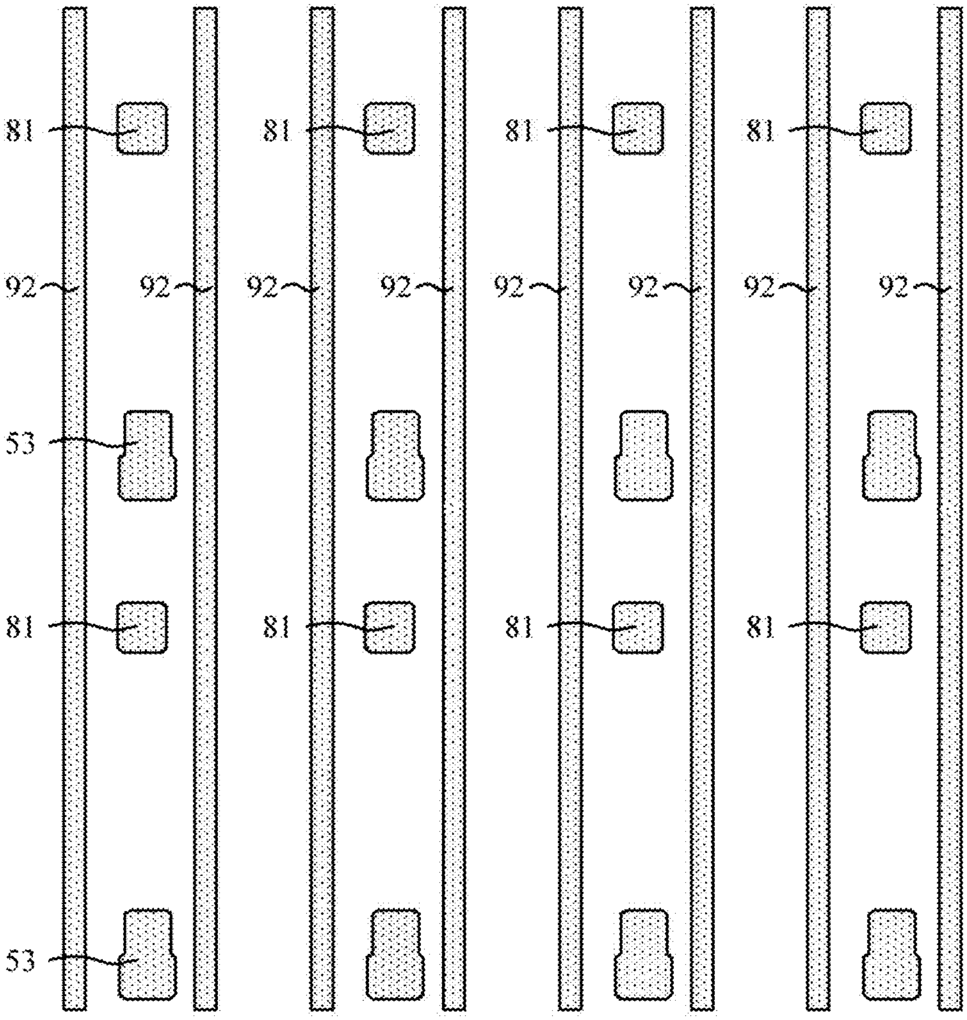
Figure 19C:
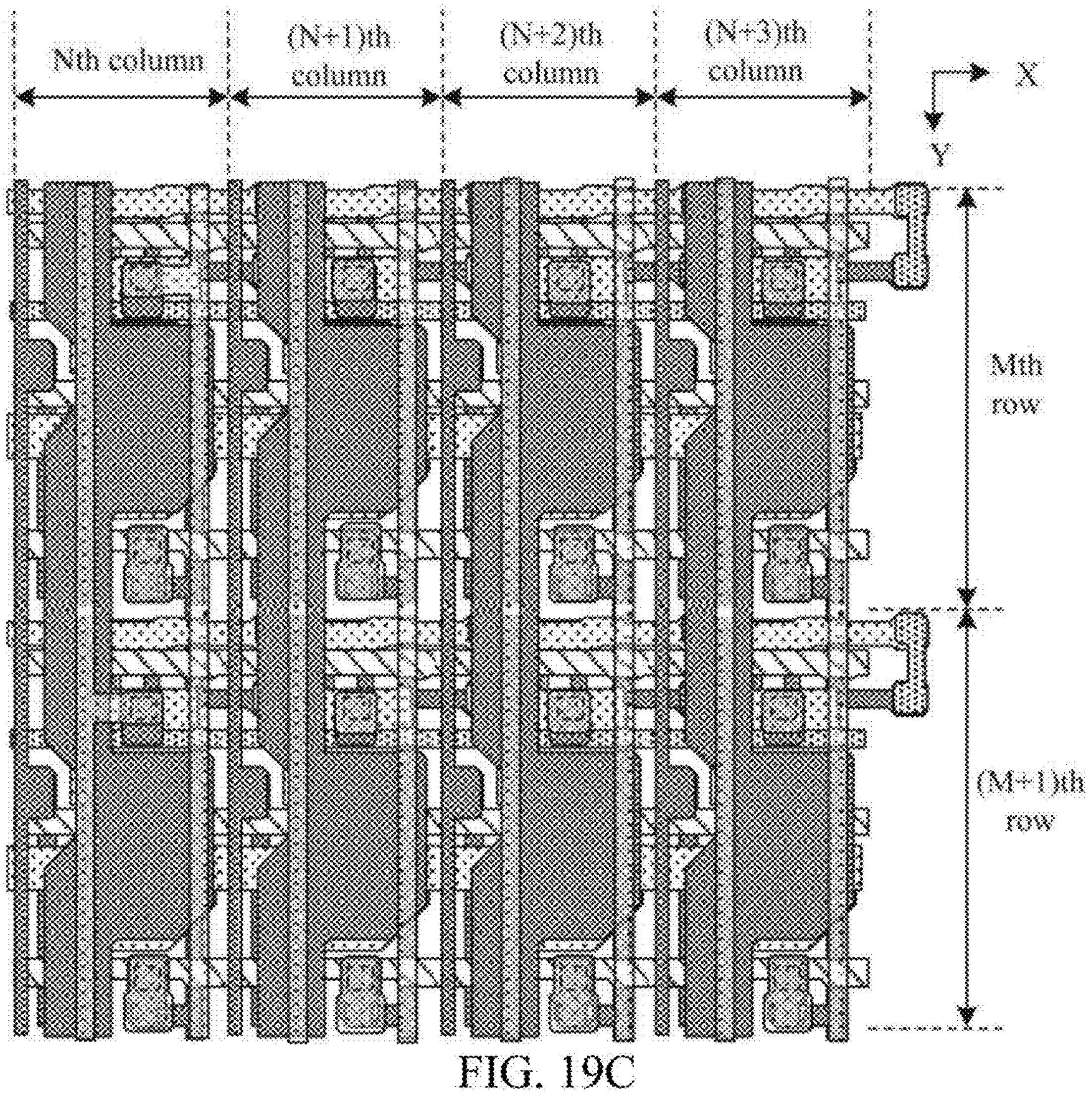
Figure 19D:
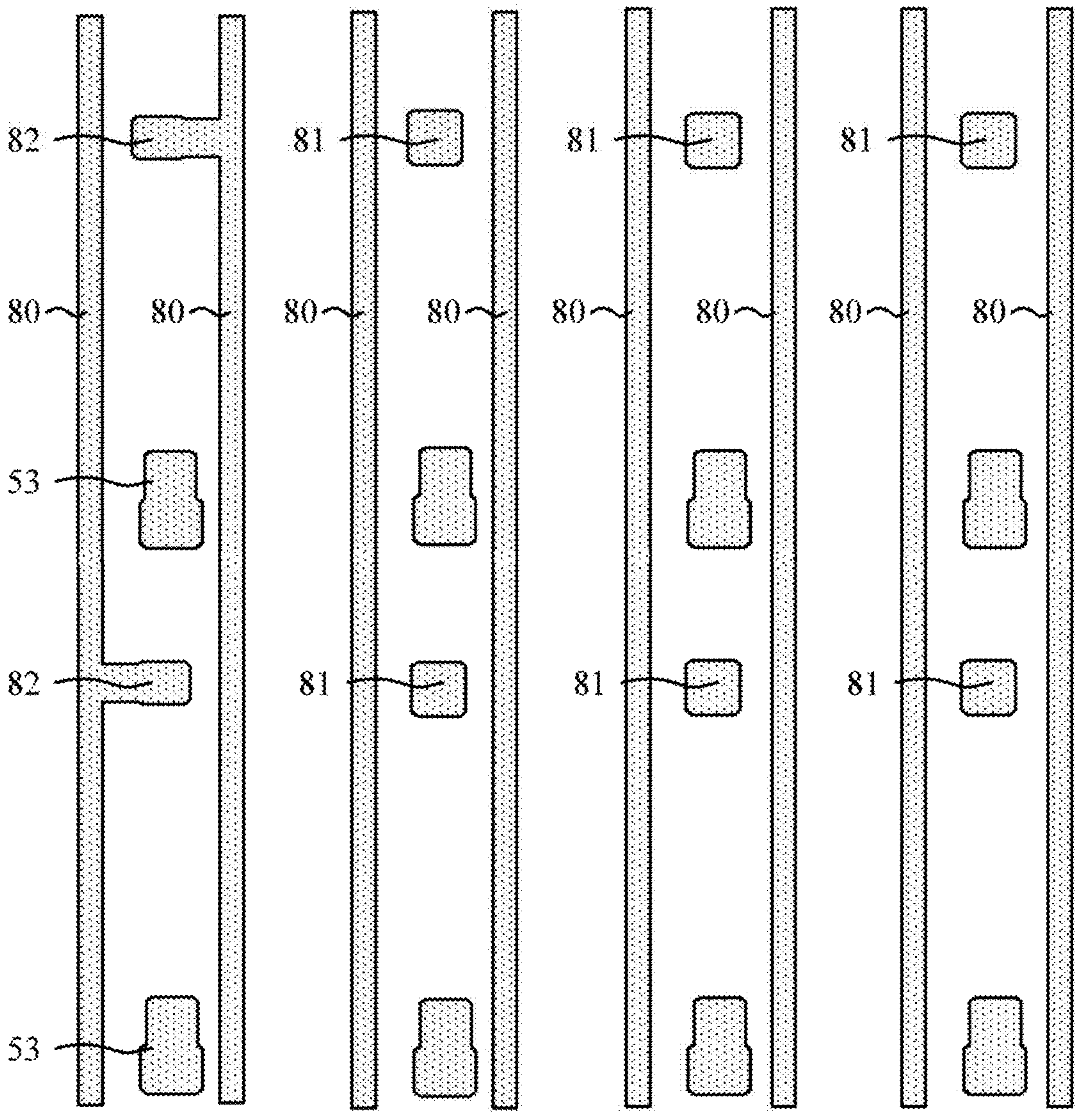
Figure 19E:
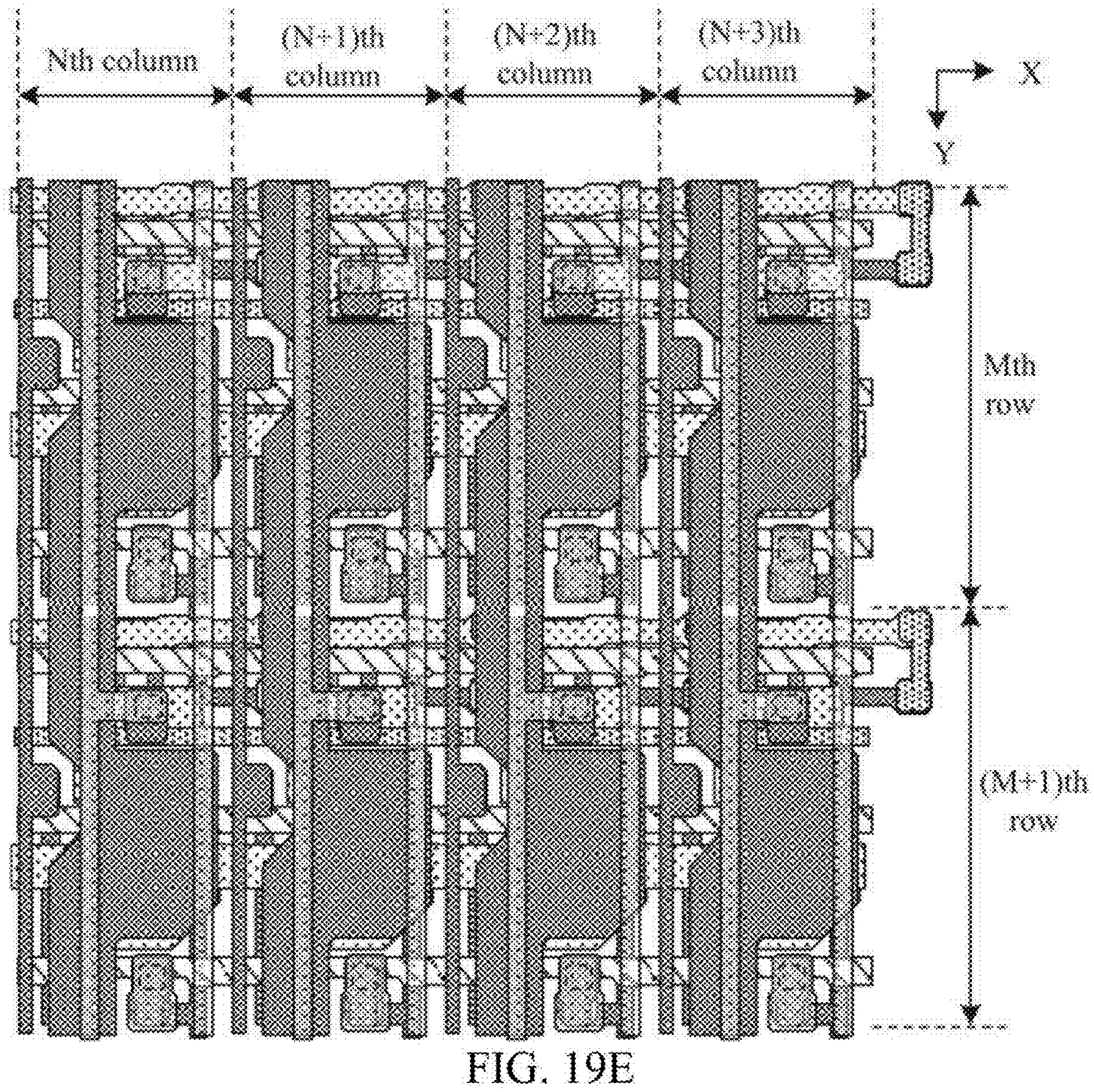
Figure 19F:
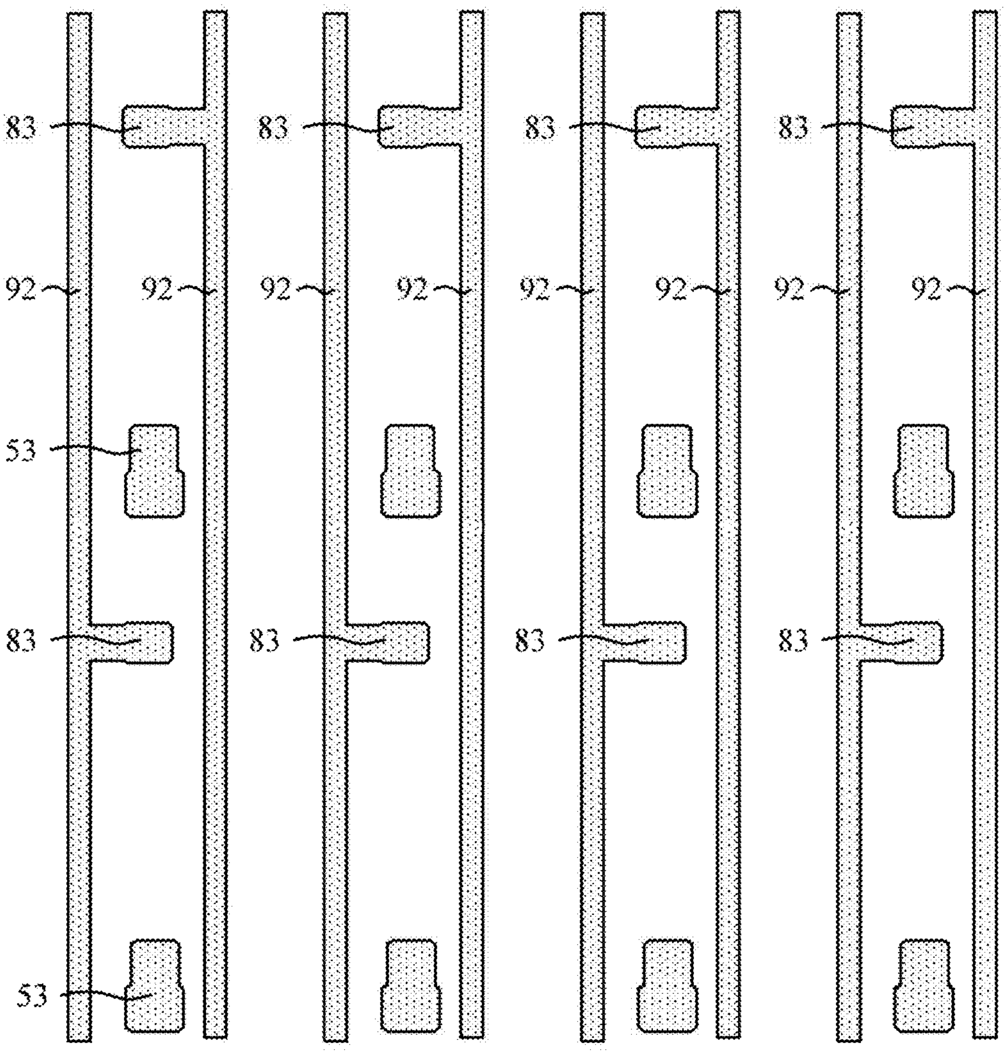

(9) A pattern of a fifth conductive layer is formed. In an exemplary embodiment, forming the pattern of the fifth conductive layer may include: on the base substrate on which the aforementioned patterns are formed, depositing a fifth conductive thin film, and patterning the fifth conductive thin film through a patterning process to form a fifth conductive layer disposed on the second planarization layer, as shown in FIGS. 19A to 19F, wherein FIG. 19A is an enlarged view of the E1 region in FIG. 8, FIG. 19B is a schematic planar view of the fifth conductive layer in FIG. 19A, FIG. 19C is an enlarged view of the E2 region in FIG. 8, FIG. 19D is a schematic planar view of the fifth conductive layer in FIG. 19C, FIG. 19E is an enlarged view of the E3 region in FIG. 8, and FIG. 19F is a schematic planar view of the fifth conductive layer in FIG. 19E. In an exemplary embodiment, the fifth conductive layer may be referred to as a third source drain metal (SD3) layer.

In an exemplary embodiment, the patterns of the fifth conductive layers of the multiple circuit units in the display region each include the second anode connection electrode 53.

In an exemplary embodiment, the shape of the second anode connection electrode 53 may be rectangular, an orthographic projection of the second anode connection electrode 53 on the base substrate at least partially overlaps with an orthographic projection of the first anode connection electrode 52 on the base substrate, and the second anode connection electrode 53 is connected to the first anode connection electrode 52 through a twenty-first via hole V21. In an exemplary embodiment, the second anode connection electrode 53 is configured to be connected with an anode formed subsequently. Since the first anode connection electrode 52 is connected to the fifth connection electrode 45 through a via hole, and the fifth connection electrode 45 is connected to the second region of the sixth active layer (also the second region of the seventh active layer) through a via hole, it is thus achieved that the anode is connected to the second electrode of the sixth transistor T6 (also the second electrode of the seventh transistor T7) through the second anode connection electrode 53, the second anode connection electrode 52 and the fifth connection electrode 45.

As shown in FIGS. 19A and 19B, in an exemplary embodiment, multiple circuit units in the first region (E1 region) may further include a dummy electrode 81 and a second power supply wiring 92.

In an exemplary embodiment, the shape of the dummy electrode 81 of the first region may be rectangular, an orthographic projection of the dummy electrode 81 on the base substrate at least partially overlaps with an orthographic projection of the interlayer dummy connection block 74 on the base substrate, and the dummy electrode 81 is connected to the interlayer dummy connection block 74 through the twenty-second via hole V22. In an exemplary embodiment, the dummy electrode 81 is configured to make the fifth conductive layer of the first region, the second region, and the third region exhibit the same or similar appearance.

In an exemplary embodiment, an orthographic projection of the dummy electrode 81 on the base substrate at least partially overlaps with an orthographic projection of the shield electrode 34 on the base substrate.

In an exemplary embodiment, the shape of the second power supply wiring 92 may be a line shape in which the main body portion extends along the second direction Y. The second power supply wiring 92 of the first region and the second power supply wiring 92 of the third region may be integrally connected to each other. The second power supply wiring 92 of the first region are isolated from multiple dummy electrodes 81, that is, the second power supply wiring 92 of the first region are not connected to the dummy electrodes 81.

In an exemplary embodiment, two second power supply wirings 92 may be provided between data signal lines 60 adjacent to each other in the first direction X.

As shown in FIGS. 19C and 19D, in an exemplary embodiment, a part of the circuit unit in the second region (E2 region) may further include a second connection line 80 and a data connection electrode 82, and another part of the circuit unit in the second region may further include a second connection line 80 and a dummy electrode 81.

In an exemplary embodiment, the shape of the second connection line 80 may be a line shape in which the main body portion extends along the second direction Y, and the second connection line 80 is configured to be connected to the first connection line 70 through the interlayer data connection block 75.

In an exemplary embodiment, the shape of the data connection electrode 82 in part of the circuit unit in the second region may be a rectangular shape, the first terminal of the data connection electrode 82 is directly connected to the second connection line 80, and the second terminal of the data connection electrode 82 extends in a direction away from the second connection line 80 along the first direction X. An orthographic projection of the data connection electrode 82 on the base substrate at least partially overlaps with an orthographic projection of the interlayer data connection block 75 on the base substrate, and the data connection electrode 82 is connected to the interlayer data connection block 75 through a twenty-third via hole V23. Since the second connection line 80 is connected to the data connection electrode 82, which is connected to the interlayer data connection block 75 through the via hole, the interlayer data connection block 75 is connected to the second connection block 72 through the via hole, and the second connection block 72 is connected to the first connection line 70, the connection between the second connection line 80 and the first connection line 70 is achieved.

In an exemplary embodiment, the second connection block 72 located in the fifth conductive layer is connected to the first connection line 70 located in the third conductive layer through the interlayer connection block, and the first connection line 70 located in the third conductive layer is connected to the data signal line 60 located in the fourth conductive layer through the fourth connection electrode, thus forming a line changing structure of SD3 vertical wiring→SD1 horizontal wiring→SD2 vertical wiring.

In an exemplary embodiment, between the data signal lines 60 adjacent to each other in the first direction X, two second connection lines 80 may be provided, one of which is connected to the data connection electrode 82 on the left side in one circuit row, and the other of which is connected to the data connection electrode 82 on the right side in another circuit row.

In an exemplary embodiment, the second connection line 80 and the data connection electrode 82 in the second region may be an integrated structure connected to each other.

In an exemplary embodiment, the structure of the dummy electrode 81 in part of the circuit unit of the second region is substantially the same as that of the dummy electrode 81 in the first region.

In an exemplary embodiment, the second connection line 80 of the second region is disposed in isolation from the second power supply wiring 92 of the third region, and the second connection line 80 of the second region is disposed in isolation from the multiple dummy electrodes 81.

As shown in FIGS. 19E and 19F, in an exemplary embodiment, multiple circuit units in the third region (E3 region) may further include a power supply connection electrode 83 and a second power supply wiring 92.

In an exemplary embodiment, the shape of the second power supply wiring 92 may be a line shape in which the main body portion extends along the second direction Y, and the second power supply wiring is configured to be connected to the first power supply wiring 91 through the interlayer electrode connection block 76.

In an exemplary embodiment, the shape of the power supply connection electrode 83 of the third region may be rectangular, the first terminal of the power supply connection electrode 83 is directly connected to the second power supply wiring 92, and the second terminal of the power supply connection electrode 83 extends in a direction away from the second power supply wiring 92 in the first direction X. An orthographic projection of the power supply connection electrode 83 on the base substrate at least partially overlaps with an orthographic projection of the interlayer electrode connection block 76 on the base substrate, and the data connection electrode 82 is connected to the interlayer electrode connection block 76 through a twenty-fourth via hole V24. Since the second power supply wiring 92 is connected to the power supply connection electrode 83, the power supply connection electrode 83 is connected to the interlayer electrode connection block 76 through a via hole. The interlayer electrode connection block 76 is connected to a third connection block 73 through a via hole, and the third connection block 73 is connected to the first power supply wiring 91, thereby achieving the connection between the second power supply wiring 92 and the first power supply wiring 91 such that the first power supply wiring 91 extending along the first direction X and the second power supply wiring 92 extending along the second direction Y form a mesh-connected structure. By arranging the power supply wirings of the mesh-connected structure, the power supply wirings in multiple unit rows and multiple unit columns have the same potential, which not only effectively reduces the resistance of the power supply wirings and reduces the voltage drop for transmitting low voltage signals, but also effectively improves the uniformity of low voltage signals in the display substrate, effectively improves the display uniformity, and improves the display quality.

In an exemplary embodiment, two second power supply wirings 92 may be provided between data signal lines 60 adjacent to each other in the first direction X. One second power supply wiring 92 is connected to the left power supply connection electrode 83 in one circuit row, and the other second power supply wiring 92 is connected to the right power supply connection electrode 83 in one circuit row.

In an exemplary embodiment, the second power supply wiring 92 and the power supply connection electrode 83 in the third region may be an integrated structure connected to each other.

In an exemplary embodiment, the second power supply wiring 92 may be connected to the bonding power supply lead of the bonding region and the bezel power supply lead of the bezel region respectively.

In an exemplary embodiment, the second power supply wiring 92 of the third region are connected correspondingly to the second power supply wiring 92 of the first region, and the second power supply wiring 92 of the third region are arranged in isolation from the second connection line 80 of the second region.

In an exemplary embodiment, the position and shape of the dummy electrode 81 of the first region in the circuit unit, the data connection electrode 82 of the second region in the circuit unit, and the power supply connection electrode 83 of the third region in the circuit unit are substantially the same. In at least one unit row including the circuit units of the first region and the circuit units of the second region, the dummy electrode 81 of the first region and the data connection electrode 82 of the second region may be located on the same straight line extending along the first direction X. In at least one unit column including the circuit units of the first region and the circuit units of the third region, the dummy electrode 81 of the first region and the power supply connection electrode 83 of the third region may be located on the same straight line extending along the second direction Y. In at least one unit column including the circuit units of the second region and the circuit units of the third region, the data connection electrode 82 of the second region and the power supply connection electrode 83 of the third region may be located on the same straight line extending along the second direction Y. In an exemplary embodiment, the dummy electrode 81, the data connection electrode 82 and the power connection electrode 83 present the same or similar appearance and have the same or similar hole connection structure. It can not only improve the uniformity of the preparation process, but also make different regions achieve basically the same display effect under transmitted light and reflected light, effectively avoid the poor appearance of the display substrate, and improve the display quality.

So far, the drive structure layer has been prepared on the base substrate. On a plane parallel to the display substrate, the drive structure layer may include multiple circuit units, each of the circuit units may include a pixel drive circuit, and a first scan signal line, a second scan signal line, a light emitting control line, an initial signal line, a data signal line, and a first power supply line connected to the pixel drive circuit. On a plane perpendicular to the display substrate, the drive structure layer may at least include a first insulating layer, a semiconductor layer, a second insulating layer, a first conductive layer, a third insulating layer, a second conductive layer, a fourth insulating layer, a third conductive layer, a first planarization layer, a fourth conductive layer, a second planarization layer and a fifth planarization layer which are stacked sequentially on the base substrate.

In an exemplary implementation, the base substrate may be a flexible base substrate, or may be a rigid base substrate. The rigid base substrate may be made of, but not limited to, one or more of glass and quartz. The flexible base substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible base substrate may include a first flexible material layer, a first inorganic material layer, a semiconductor layer, a second flexible material layer, and a second inorganic material layer which are stacked, wherein materials of the first flexible material layer and the second flexible material layer may be polyimide (PI), polyethylene terephthalate (PET), or a surface-treated polymer soft thin film, or the like. Materials of the first inorganic material layer and the second inorganic material layer may be silicon nitride (SiNx) or silicon oxide (SiOx), or the like, for improving water and oxygen resistance of the base substrate. The material of the semiconductor layer may be amorphous silicon (a-si).

In an exemplary embodiment, the first conductive layer, the second conductive layer, the third conductive layer, the fourth conductive layer, and the fifth conductive layer may be made of metal materials, such as any one or more of silver (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo or Ti/Al/Ti. The first insulating layer, the second insulating layer, the third insulating layer, and the fourth insulating layer may be made of any one or more of silicon oxide (SiOx), silicon nitride (SiNx), and silicon oxynitride (SiON), and may be single-layer, multilayers, or composite layer. The first insulating layer is referred to as a Buffer layer, the second insulating layer and the third insulating layer are referred to as Gate Insulating (GI) layers, and the fourth insulating layer is referred to as an interlayer insulating (ILD) layer. The first planarization layer and the second planarization layer may be made of an organic material such as a resin. The active layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic matter technology.

In an exemplary embodiment, after the drive structure layer is prepared, the light emitting structure layer and the encapsulation structure layer may be sequentially prepared on the drive structure layer, which will not be described here.

In a display substrate, the display region includes a wiring region provided with a data connection line and a normal region without a data connection line. Since the data connection line in the wiring region has a high reflection ability under the irradiation of external light, while the reflection ability of other metal lines in the normal region is weak, so an appearance of the normal region is obviously different from that of the wiring region, which leads to a problem of poor appearance of the display substrate, especially more obvious when the screen is off or the display is in a low gray tone.

As can be seen from the structure and preparation process of the display substrate described above, according to the present disclosure, a data signal line, a first connection line and a second connection line are arranged in different conductive layers, and a conductive layer is only provided with vertical wirings or only horizontal wirings. By using vertical wirings and horizontal wirings, the difference of homogeneity of wirings caused by setting horizontal wirings and vertical wirings at the same time in one conductive layer is avoided, and basically the same display effect can be achieved in different regions under transmitted light and reflected light, thus effectively avoiding the phenomenon of screen watermark on the display substrate and improving the display quality. According to the present disclosure, by arranging a data connection line and a power supply wiring in a display region, the power supply wiring is arranged in the normal region where no data connection line is arranged, so that the wiring region and the normal region have basically the same wiring structure, and different regions can achieve basically the same display effect under transmitted light and reflected light, thus effectively avoiding the poor appearance of the display substrate and improving the display quality. The invention achieves the structure of VSS in pixel by arranging the power supply wiring in the display region, which can greatly reduce the width of the bezel power supply lead, greatly reduces the width of the left and right bezel, increases the screen proportion, and is beneficial to achieve the overall screen display. By arranging the power supply wirings into a mesh connection structure, the present disclosure can not only effectively reduce the resistance of the power supply wirings, effectively reduce the voltage drop of the low-voltage power supply signals and achieve low power consumption, but also effectively improve the uniformity of the power supply signals in the display substrate, effectively improve the display uniformity, and improve the display quality. The preparation process in the present disclosure may be compatible well with an existing preparation process, which is simple in process implementation, easy to implement, high in production efficiency and yield, and low in production cost.

The aforementioned structure shown in the present disclosure and the preparation process thereof are merely exemplary description. In an exemplary embodiment, corresponding structures may be changed and patterning processes may be added or reduced according to actual needs, which is not limited here in the present disclosure.

Figure 20:
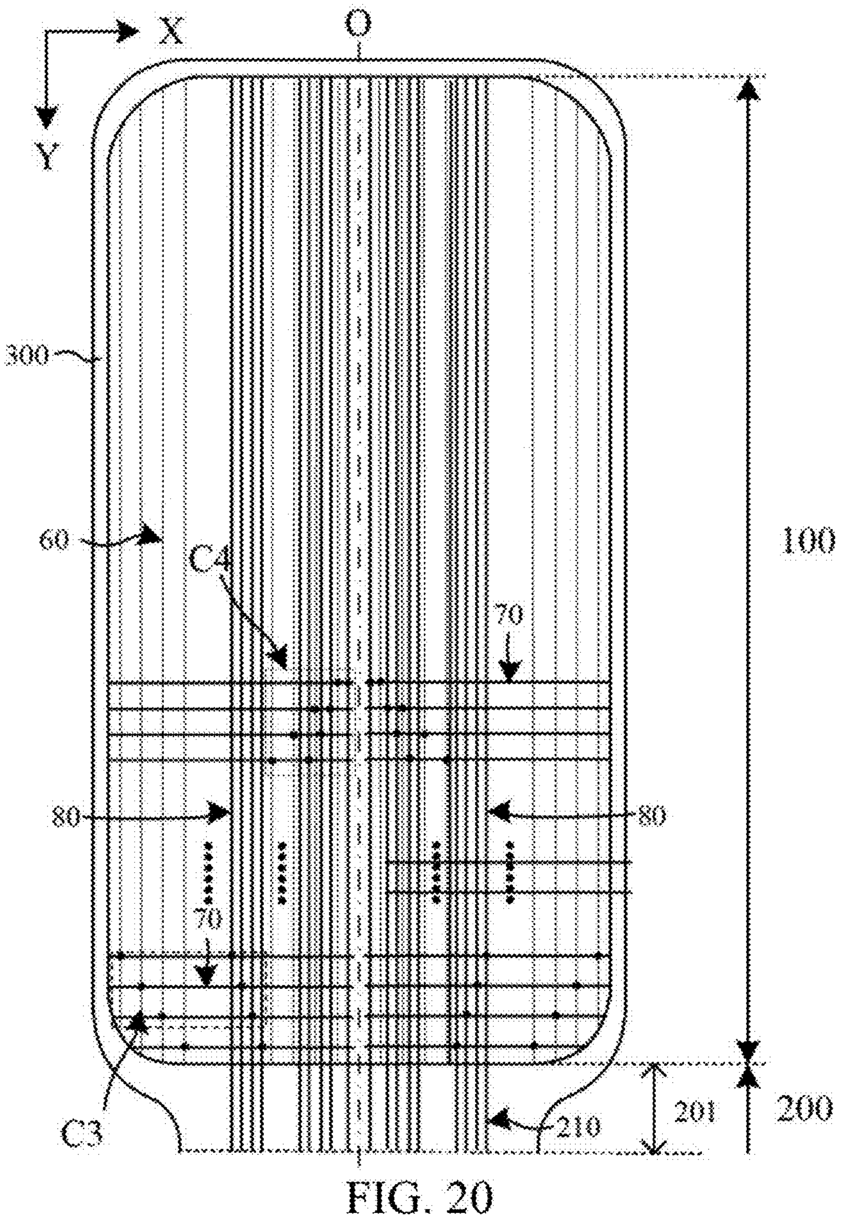
FIGS. 20 to 22 are schematic diagrams of another planar structure of a display substrate according to an embodiment of the present disclosure.
Figure 21:
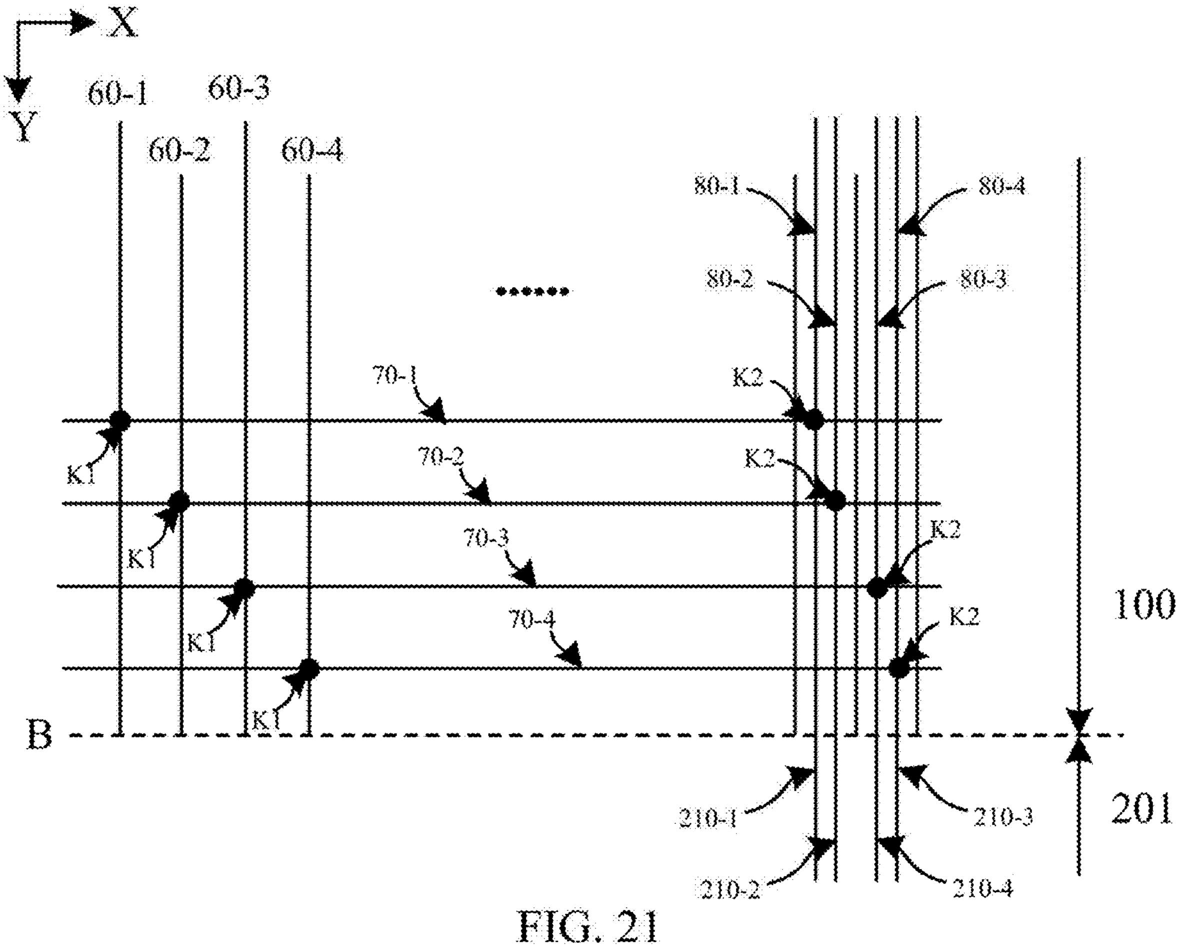
Figure 22:
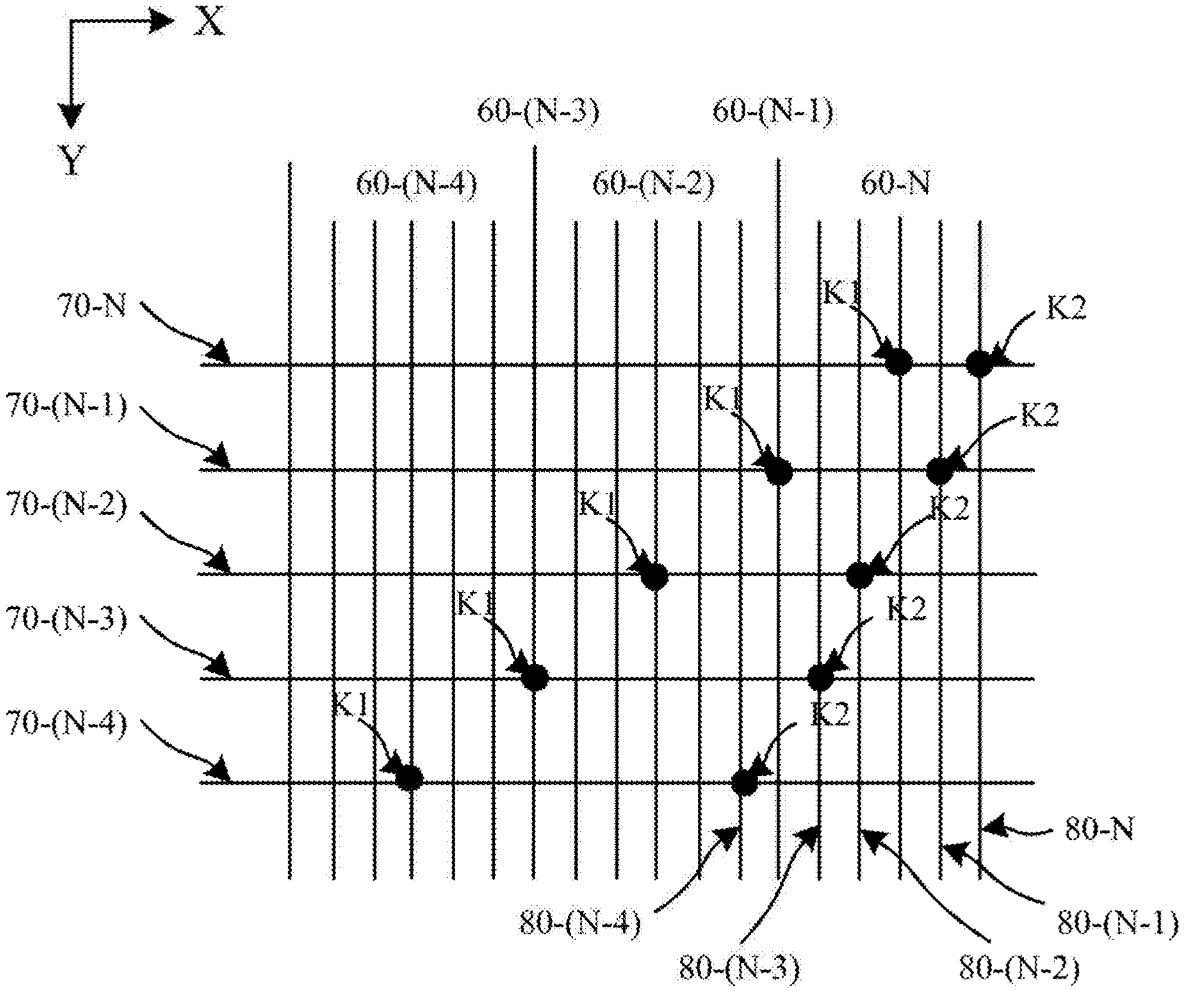

FIGS. 20 to 22 are schematic diagrams of another planar structure of a display substrate according to an exemplary embodiment of the present disclosure. FIG. 21 is an enlarged view of a region C3 in FIG. 20. FIG. 22 is an enlarged view of a region C4 in FIG. 20. The main body structure of the display substrate of the present exemplary embodiment is substantially the same as that of the display substrate of the foregoing embodiment, except that a first connection line 70 is also provided at a corner of the display region 100 close to the bonding region 200.

As shown in FIGS. 20 to 22, for example, the display region on the left side of the center line O includes N unit columns, and the N unit columns are arranged in order of increasing numbers from left to right. The leftmost unit column (the side away from the center line O) is the first unit column, and the rightmost unit column (the side close to the center line O) is the Nth unit column.

In an exemplary embodiment, the N unit columns may be divided into a first unit column group and a second unit column group, the first unit column group may include a first to an nth unit column, the second unit column group may include an n+1 to an Nth unit column, and n may be a positive integer greater than 1 and less than N, for example, n may be a positive integer about N/2.

In an exemplary embodiment, multiple first connection lines 70 connected to multiple data signal lines 60 in a first unit column group are arranged sequentially in a numbered incremental manner in a second direction Y, and multiple first connection lines 70 connected to multiple data signal lines 60 in a second unit column group are arranged sequentially in a numbered decremented manner in a second direction Y.

As shown in FIGS. 20 and 21, multiple data signal lines in the first unit column group may at least include a data signal line 60-1 to a data signal line 60-4, multiple first connection lines connected to the multiple data signal lines 60 in the first unit column group may include first connection lines 70-1 to 70-4, the corresponding plurality of second connection lines may include second connection lines 80-1 to 80-4, and the corresponding plurality of lead out lines may include lead out lines 210-1 to 210-4. The first connection lines 70-1 to 70-4 may be arranged in order of number from small to large along the second direction Y. The data signal lines 60-1 to 60-4 may be arranged in order of number from small to large along a first direction X. The second connection line 80-1 to the second connection line 80-4 may be arranged in order of number from small to large along the first direction X. The lead out lines 210-1 to 210-4 may be arranged in order of number from small to large along the first direction X. In this way, the data output pin of the drive chip may be designed in positive sequence, and the data signal output without sudden change of load is achieved, and the display quality is improved.

In the exemplary embodiment, the first connection line 70-1 is connected to the data signal line 60-1 through the first connection hole K1, the second connection line 80-1 is connected to the first connection line 70-1 through the second connection hole K2, and the second connection line 80-1 is connected to the lead out line 210-1 of the bonding region. The first connection line 70-2 is connected to the data signal line 60-2 through the first connection hole K1, the second connection line 80-2 is connected to the first connection line 70-2 through the second connection hole K2, and the second connection line 80-2 is connected to the lead out line 210-2 of the bonding region. The first connection line 70-3 is connected to the data signal line 60-3 through the first connection hole K1, the second connection line 80-3 is connected to the first connection line 70-3 through the second connection hole K2, and the second connection line 80-3 is connected to the lead out line 210-3 of the bonding region. The first connection line 70-4 is connected to the data signal line 60-4 through the first connection hole K1, the second connection line 80-4 is connected to the first connection line 70-4 through the second connection hole K2, and the second connection line 80-4 is connected to the lead out line 210-4 of the bonding region.

In an exemplary embodiment, the distances between the multiple first connection holes K1 and the edge B of the display region may be different in the unit column in which the first unit column group is located. For example, the distance between the first connection hole K1 where the first connection line 70-1 is connected to the data signal line 60-1 and the edge B of the display region B may be greater than the distance between the first connection hole K1 where the first connection line 70-2 is connected to the data signal line 60-2 and the edge B of the display region.

In an exemplary embodiment, in the unit column in which the first unit column group is located, the distances between the multiple second connection holes K2 in which the second connection line and the first connection line are connected correspondingly and the edge B of the display region may be different. For example, the distance between the second connection hole K2 connected by the second connection line 80-1 and the first connection line 70-1 and the edge B of the display region may be greater than the distance between the second connection hole K2 connected by the second connection line 80-2 and the first connection line 70-2 and the edge B of the display region.

As shown in FIGS. 20 and 22, the multiple data signal lines in the second unit column group may at least include a data signal line 60-(N−3) to a data signal line 60-N, the multiple first connection lines connected to the multiple data signal lines in the second unit column group may include a first connection line 70-(N−3) to a first connection line 70-N, and the corresponding plurality of second connection lines may include a second connection line 80-(N−3) to a second connection line 80-N. The first connection line 70-(N−3) to the first connection line 70-N may be arranged in order of numbers from large to small along the second direction Y. The data signal line 60-(N−3) to the data signal line 60-N may be arranged in order of numbers from small to large along the first direction X. The second connection line 80-(N−3) to the second connection line 80-N may be arranged in order of numbers from small to large along the first direction X, so that the data output pins of the drive chip may be designed in positive sequence, and the data signal output without sudden change of load is achieved, and the display quality is improved.

In an exemplary embodiment, the first connection line 70-(N−3) is connected to the data signal line 60-(N−3) through the first connection hole K1, and the second connection line 80-(N−3) is connected to the first connection line 70-(N−3) through the second connection hole K2. The first connection line 70-(N−2) is connected to the data signal line 60-(N−2) through a first connection hole K1, and the second connection line 80-(N−2) is connected to the first connection line 70-(N−2) through a second connection hole K2. The first connection line 70-(N−1) is connected to the data signal line 60-(N−1) through a first connection hole K1, and the second connection line 80-(N−1) is connected to the first connection line 70-(N−1) through a second connection hole K2. The first connection line 70-N is connected to the data signal line 60-N through a first connection hole K1, and the second connection line 80-N is connected to the first connection line 70-N through a second connection hole K2.

In an exemplary embodiment, the distances between the multiple first connection holes K1 and the edge B of the display region may be different in the unit column in which the second unit column group is located. For example, the distance between the first connection hole K1 where the first connection line 70-N is connected to the data signal line 60-N and the edge B of the display region B may be greater than the distance between the first connection hole K1 where the first connection line 70-(N−1) is connected to the data signal line 60-(N−1) and the edge B of the display region.

In an exemplary embodiment, in the unit column in which the second unit column group is located, the distances between the multiple second connection holes K2 in which the second connection line and the first connection line are connected correspondingly and the edge B of the display region may be different. For example, the distance between the second connection hole K2 connected by the second connection line 80-N and the first connection line 70-N and the edge B of the display region may be greater than the distance between the second connection hole K2 connected by the second connection line 80-(N−1) and the first connection line 70-(N−1) and the edge B of the display region.

In an exemplary embodiment, among multiple unit columns in which the display region is close to the bezel region, the length of data signal lines in these unit columns is smaller than that in other unit columns because of the presence of rounded corners in the display region. In order to achieve the positive sequence design of the data output pin of the drive chip, the first connection line of the structure shown in FIG. 8 is arranged at a position that avoids the corner region of the display region.

A display substrate of an exemplary embodiment of the present disclosure can not only greatly reduce the width of the lower bezel, increase the screen proportion, and is conducive to achieving comprehensive screen display; moreover, through the design of overlapping mode, the corner of the display region close to the bonding region is also provided with a first connection line, which maximally improves the uniformity of the first connection line in the display region, maximally avoids the poor appearance of the display substrate, and maximally improves the display quality.

In an exemplary implementation, the display substrate of the present disclosure may be applied to a display apparatus with a pixel drive circuit, such as an OLED, a quantum dot display (QLED), a light emitting diode display (Micro LED or Mini LED) or a quantum dot light emitting diode display (QDLED), etc., which is not limited here in the present disclosure.

The invention also provides a display apparatus, which includes the display substrate and a drive chip, wherein the drive chip may be fixedly disposed on the display substrate, and the second connection line is electrically connected to the drive chip, so that the drive chip can transmit data signals to the data signal lines through the second connection line and the first connection line.

In an exemplary implementation, the display apparatus may be any product or component with a display function, such as a mobile phone, a tablet computer, a television, a display, a laptop computer, a digital photo frame, or a navigator, and the embodiments of the present invention are not limited thereto.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, comprising a display region, wherein the display region comprises a drive structure layer disposed on a base substrate, the drive structure layer at least comprises a plurality of circuit units forming a plurality of unit rows and a plurality of unit columns, a plurality of data signal lines, a plurality of first connection lines and a plurality of second connection lines, the circuit unit comprises a pixel drive circuit, the data signal line is configured to supply a data signal to the pixel drive circuit, on a plane perpendicular to the display substrate, the drive structure layer comprises a plurality of conductive layers arranged sequentially on the base substrate, the data signal line, the first connection line and the second connection line are disposed in different conductive layers, the second connection line extending in a second direction is connected to the first connection line extending in a first direction, and the first connection line extending in a first direction is connected to the data signal line extending in a second direction;

the first direction and the second direction intersect;

the plurality of conductive layers comprise a first source-drain metal layer, a second source-drain metal layer and a third source-drain metal layer arranged sequentially along a direction away from the base substrate;

the first source-drain metal layer at least comprises the first connection line, the second source-drain metal layer at least comprises the data signal line, and the third source-drain metal layer at least comprises the second connection line;

the third source-drain metal layer is connected to the first connection line located in the first source-drain metal layer through an interlayer connection block, the first connection line located in the first source-drain metal layer is connected to the data signal line located in the second source-drain metal layer through a connection electrode, and a wiring changing structure comprising vertical wiring of the third source-drain metal layer, horizontal wiring of the first source-drain metal layer, and vertical wiring of the second source-drain metal layer is formed;

the pixel drive circuit at least comprises a data write transistor, and the first source-drain metal layer further comprises a first electrode of the data write transistor; and in at least one circuit unit, the first connection line is connected to a first electrode of the data write transistor, and the data signal line is connected to the first electrode of the data write transistor through a via hole.

2. The display substrate according to claim 1, wherein in at least one circuit unit, the first source-drain metal layer further comprises a data connection block, a first terminal of the data connection block is connected to the first connection line, and a second terminal of the data connection block is connected to a first electrode of the data write transistor.

3. The display substrate according to claim 2, wherein the pixel drive circuit at least comprises a storage capacitor and a plurality of transistors, the plurality of conductive layers comprise a semiconductor layer, a first gate metal layer, a second gate metal layer, the first source-drain metal layer, the second source-drain metal layer, and the third source-drain metal layer arranged sequentially along a direction away from the base substrate, the semiconductor layer at least comprises active layers of the plurality of transistors, the first gate metal layer at least comprises gate electrodes of the plurality of transistors and a first electrode plate of the storage capacitor, and the second gate metal layer at least comprises a second electrode plate of the storage capacitor.

4. A display apparatus comprising a display substrate according to claim 2.

5. The display substrate according to claim 1, wherein in at least one circuit unit, the second source-drain metal layer further comprises an interlayer dummy connection block, which is connected to the first connection line through a via hole, and the third source-drain metal layer further comprises a dummy electrode, which is connected to the interlayer dummy connection block through a via hole.

6. The display substrate according to claim 1, wherein in at least one circuit unit, the second source-drain metal layer further comprises an interlayer data connection block connected to the first connection line through a via hole, and the second connection line is connected to the interlayer data connection block through a via hole.

7. The display substrate according to claim 6, wherein in at least one circuit unit, the third source-drain metal layer further comprises a data connection electrode connected to the second connection line, and the data connection electrode is connected to the interlayer data connection block through a via hole.

8. The display substrate according to claim 1, wherein at least one unit row is provided with two first connection lines sequentially arranged along the first direction, a first break is provided between the two first connection lines, and a plurality of first breaks of the plurality of unit rows are located in the same circuit column.

9. The display substrate according to claim 1, wherein the display region further comprises a plurality of first power supply wirings extending along the first direction and a plurality of second power supply wirings extending along the second direction, the first power supply wirings and the second power supply wirings are disposed in different conductive layers, and the first power supply wirings are connected to the second power supply wirings.

10. The display substrate according to claim 9, wherein the first source-drain metal layer comprises the first power supply wirings, and the third source-drain metal layer comprises the second power supply wirings.

11. The display substrate according to claim 10, wherein in at least one circuit unit, the second source-drain metal layer further comprises an interlayer electrode connection block connected to the first power supply wiring through a via hole, and the second power supply wiring is connected to the interlayer electrode connection block through a via hole.

12. The display substrate according to claim 11, wherein in at least one circuit unit, the third source-drain metal layer further comprises a power supply connection electrode connected to the second power supply wiring, and the power supply connection electrode is connected to the interlayer electrode connection block through a via hole.

13. The display substrate according to claim 9, wherein the second power supply wiring and the second connection line are arranged in the same layer, at least one unit column is provided with a second connection line and a second power supply wiring sequentially arranged along the second direction, a second break is arranged between the second connection line and the second power supply wiring, and a plurality of second breaks of a plurality of unit columns are located in the same circuit row.

14. The display substrate according to claim 9, wherein the display substrate further comprises a bonding region located on the second direction side of the display region and a bezel region located on the other side of the display region, the bonding region is provided with a bonding power supply lead, the bezel region is provided with a bezel power supply lead, the bonding power supply lead and the bezel power supply lead are configured to continuously supply low voltage signals, and the first power supply wiring and the second power supply wiring are connected to the bonding power supply lead and the bezel power supply lead, respectively.

15. The display substrate according to claim 1, wherein the pixel drive circuit at least comprises a storage capacitor and a plurality of transistors, the plurality of conductive layers comprise a semiconductor layer, a first gate metal layer, a second gate metal layer, the first source-drain metal layer, the second source-drain metal layer, and the third source-drain metal layer arranged sequentially along a direction away from the base substrate, the semiconductor layer at least comprises active layers of the plurality of transistors, the first gate metal layer at least comprises gate electrodes of the plurality of transistors and a first electrode plate of the storage capacitor, and the second gate metal layer at least comprises a second electrode plate of the storage capacitor.

16. The display substrate according to claim 15, wherein the first source-drain metal layer further comprises a first power supply wiring extending along the first direction, the third source-drain metal layer further comprises a second power supply wiring extending along the second direction, and the first power supply wiring is connected to the second power supply wiring.

17. A display apparatus comprising a display substrate according to claim 1.

* * * * *